US008432350B2

(12) United States Patent
Kimura

(10) Patent No.: US 8,432,350 B2
(45) Date of Patent: Apr. 30, 2013

(54) SEMICONDUCTOR DEVICE

(75) Inventor: Hajime Kimura, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/327,881

(22) Filed: Dec. 16, 2011

(65) Prior Publication Data

US 2012/0086061 A1 Apr. 12, 2012

Related U.S. Application Data

(63) Continuation of application No. 10/912,773, filed on Aug. 6, 2004, now Pat. No. 8,085,226.

(30) Foreign Application Priority Data

Aug. 15, 2003 (JP) ................................. 2003-294023

(51) Int. Cl.
*G09G 3/36* (2006.01)

(52) U.S. Cl.
USPC .............................. 345/100; 345/98; 345/204

(58) Field of Classification Search ............... 345/46–59, 345/76–100, 204–205, 690–693; 315/169.1–169.3
See application file for complete search history.

(56) References Cited

U.S. PATENT DOCUMENTS

| 6,229,506 | B1 | 5/2001 | Dawson et al. |
| 6,332,661 | B1 * | 12/2001 | Yamaguchi ................... 327/108 |
| 6,373,454 | B1 | 4/2002 | Knapp et al. |
| 6,930,680 | B2 | 8/2005 | Miyazawa |
| 6,943,500 | B2 | 9/2005 | LeChevalier |
| 6,989,810 | B2 * | 1/2006 | Morita ............................ 345/98 |
| 6,999,048 | B2 | 2/2006 | Sun et al. |
| 7,015,882 | B2 | 3/2006 | Yumoto |

(Continued)

FOREIGN PATENT DOCUMENTS

| CN | 1402212 A | 3/2003 |
| EP | 1130565 A1 | 9/2001 |

(Continued)

OTHER PUBLICATIONS

Han-Sang Lee et al.; "An Improved Driving Method using Precharge for Active Matrix OLED Displays"; IDRC 03; pp. 285-287 (2003).

(Continued)

*Primary Examiner* — Quan-Zhen Wang
*Assistant Examiner* — Jennifer Nguyen
(74) *Attorney, Agent, or Firm* — Fish & Richardson P.C.

(57) ABSTRACT

A semiconductor device with a transistor for supplying a current to a pixel comprising an EL element, that can supply an accurate current without the influence of variations even when a small signal current, is provided. A precharge voltage is supplied in advance for the current supply to a pixel and subsequently, the signal writing is completed quickly. The precharge voltage is outputted from a circuit for supplying voltage and current that supplies a current to a current source circuit for supplying a current to the pixel. As the precharge voltage, a gate voltage of a transistor for supplying a current to the current source circuit is supplied to the pixel. Optimum precharge voltage can be supplied in the case where W/L of a transistor in the pixel and W/L of a transistor for supplying current in the circuit for supplying voltage and current are approximately equivalent to each other.

18 Claims, 50 Drawing Sheets

U.S. PATENT DOCUMENTS

| | | | |
|---|---|---|---|
| 7,256,756 B2 * | 8/2007 | Abe | 345/76 |
| 7,304,621 B2 | 12/2007 | Oomori et al. | |
| 7,864,171 B2 | 1/2011 | Oomori et al. | |
| 8,035,626 B2 * | 10/2011 | Kimura | 345/204 |
| 2003/0001828 A1 | 1/2003 | Asano | |
| 2003/0030602 A1 | 2/2003 | Kasai | |
| 2003/0043131 A1 | 3/2003 | Iguchi | |
| 2003/0048669 A1 | 3/2003 | Abe | |
| 2003/0122745 A1 | 7/2003 | Miyazawa | |
| 2003/0122808 A1 * | 7/2003 | Sase | 345/204 |
| 2003/0128200 A1 | 7/2003 | Yumoto | |
| 2004/0246241 A1 | 12/2004 | Sato et al. | |
| 2005/0083272 A1 | 4/2005 | Kimura | |
| 2007/0217275 A1 | 9/2007 | Abe | |

FOREIGN PATENT DOCUMENTS

| | | | |
|---|---|---|---|
| EP | 1282104 A1 | 2/2003 | |
| EP | 1288901 A2 | 3/2003 | |
| EP | 1291839 A2 | 3/2003 | |
| EP | 1321922 A2 | 6/2003 | |
| JP | 2001-296837 A | 10/2001 | |
| JP | 2002-514320 A | 5/2002 | |
| JP | 2002-517806 A | 6/2002 | |
| JP | 01-06484 A | 2/2003 | |
| JP | 2001-006484 A | 2/2003 | |
| JP | 2003-043993 A | 2/2003 | |
| JP | 2003-050564 A | 2/2003 | |
| JP | 2003-066908 A | 3/2003 | |
| JP | 2003-076327 A | 3/2003 | |
| JP | 2003-099001 A | 4/2003 | |
| JP | 2003-108065 A | 4/2003 | |
| JP | 2003-114645 A | 4/2003 | |
| JP | 2003-150082 A | 5/2003 | |
| JP | 2003-150116 A | 5/2003 | |
| JP | 2003-157049 A | 5/2003 | |
| JP | 2003-177709 A | 6/2003 | |
| JP | 2003-195812 A | 7/2003 | |
| JP | 2003-223140 A | 8/2003 | |
| JP | 2003-323152 A | 11/2003 | |
| JP | 2004-309924 A | 11/2004 | |
| JP | 2005-049844 A | 2/2005 | |
| WO | WO 98/48403 A1 | 10/1998 | |
| WO | WO 01/06484 A1 | 1/2001 | |
| WO | WO 02/39420 A1 | 5/2002 | |
| WO | WO 03/038793 A1 | 5/2003 | |
| WO | WO 03/038794 A1 | 5/2003 | |
| WO | WO 03/038795 A1 | 5/2003 | |
| WO | WO 03/038796 A1 | 5/2003 | |
| WO | WO 03/038797 A1 | 5/2003 | |

OTHER PUBLICATIONS

M. Shimoda et al.; "New Pixel-Driving Scheme with Data-Line Pre-Charge Function for Active Matrix Organic Light Emitting Diode Displays"; IDW '02; pp. 239-242; (2002).

Chinese Office Action (Application No. 200410057760) mailed Sep. 21, 2007 with English translation (15 pages).

* cited by examiner

FIGg. 50E

SEMICONDUCTOR DEVICE

CROSS-REFERENCE TO RELATED APPLICATIONS

This application is a continuation of U.S. application Ser. No. 10/912,773, filed Aug. 6, 2004, now allowed, which claims the benefit of a foreign priority application filed in Japan as Serial No. 2003-294023 on Aug. 15, 2003, both of which are incorporated by reference.

BACKGROUND OF THE INVENTION

1. Field of the Invention

The present invention relates to a semiconductor device which is provided with a function of controlling a current supplied to a load by a transistor, and more particularly to a semiconductor device comprising a pixel comprising a current drive type light emitting element whose luminance varies with current, and a circuit for supplying a signal to the pixel.

2. Description of the Related Art

As a display device using a self-light emitting element typified by an organic light emitting diode (OLED, which is also referred to as an organic EL element, an electroluminescence (EL) element, and the like), there are two types: a passive matrix and an active matrix according to a driving method thereof. The passive matrix display device has a simple configuration while it has a difficulty in realizing a display with a large size and high luminance. In recent years, an active matrix display device in which a current supplied to a light emitting element is controlled by a thin film transistor (TFT) provided in a pixel circuit has been developed.

The active matrix display device has a problem in that a current supplied to a light emitting element varies due to variations in current characteristics of driving TFTs, leading to luminance variations. That is, a pixel circuit adopts a driving TFT for driving a current supplied to a light emitting element, and thus the current supplied to the light emitting element varies as characteristics of such driving TFTs vary, so that luminance varies. In view of this, various circuits are proposed, in which luminance variations are suppressed without changing a current supplied to a light emitting element even in the case where characteristics of driving TFTs vary among pixel circuits (e.g., refer to Patent Documents 1 to 4).
(Patent Document 1)
Published Japanese translation of PCT international publication for Patent Application No. 2002-517806
(Patent Document 2)
PCT International Publication for Patent Application No. WO01/06484 pamphlet
(Patent Document 3)
Published Japanese translation of PCT international publication for Patent Application No. 2002-514320
(Patent Document 4)
PCT International Publication for Patent Application No. WO02/39420 pamphlet Disclosed in Patent Documents 1 to 3 are circuit configurations for preventing the fluctuation of a current value supplied to a light emitting element due to variations in characteristics of driving TFTs among pixel circuits. Such a configuration is referred to as a current write type pixel or a current input type pixel. In Patent Document 4, a circuit configuration for suppressing fluctuation of a signal current due to variations of TFTs in a source driver circuit is disclosed.

FIG. 6 shows a first configuration example of a conventional active matrix display device disclosed in Patent Document 1. A pixel in FIG. 6 comprises a source signal line 601, first to third gate signal lines 602 to 604, a current supply line 605, TFTs 606 to 609, a storage capacitor 610, an EL element 611, and a current source 612 for inputting an image signal.

An operation from a signal current writing to a light emission is described with reference to FIGS. 7A to 7E. In FIGS. 7A to 7E, reference numerals denoting respective parts conform to those shown in FIG. 6. FIGS. 7A to 7C schematically show current paths. FIG. 7D shows a relationship between currents flowing through respective paths during the signal current writing. FIG. 7E shows a voltage accumulated in the storage capacitor 610 during the signal current writing, namely a gate-source voltage of the TFT 608.

Firstly, a pulse is inputted to the first gate signal line 602 and the second gate signal line 603 to turn ON the TFTs 606 and 607. A current flowing through the source signal line 601 at this time, namely a signal current is referred to as Idata here.

The current Idata flows through the source signal line 601, therefore, the current separately flows through paths $I_1$ and $I_2$ in the pixel. The relationship between $I_1$ and $I_2$ is shown in FIG. 7D. It is needless to say that Idata=$I_1$+$I_2$ is satisfied.

At the moment in which the TFT 606 is turned ON, a charge is not yet held in the storage capacitor 610, thus the TFT 608 is OFF. Accordingly, $I_2$=0 and Idata=$I_1$ are satisfied. That is to say, only a current due to an accumulated charge in the storage capacitor 610 flows at this time.

Then, charge starts to be accumulated in the storage capacitor 610 gradually to cause a potential difference between both electrodes (FIG. 7E). When the potential difference between both electrodes reaches Vth (point A in FIG. 7E), the TFT 608 is turned ON, generating $I_2$. Since Idata=$I_1$+$I_2$ is satisfied as mentioned above, the amount of $I_1$ gradually decreases while a current continues flowing and charge is accumulated in the storage capacitor 610.

In the storage capacitor 610, the charge accumulation is continued until the potential difference between both electrodes, namely the gate-source voltage of the TFT 608 reaches a desired voltage, that is a voltage (VGS) that allows the TFT 608 to flow a current of Idata. When the current accumulation is completed (point B in FIG. 7E), the current $I_1$ stops flowing and a current corresponding to VGS at this time flows through the TFT 608, thus Idata=$I_2$ is satisfied (FIG. 7B). A steady state is achieved in this manner and a signal writing operation is completed. At the end, the selection of the first gate signal line 602 and the second gate signal line 603 is completed to turn OFF the TFTs 606 and 607. The above operation is referred to as a setting operation here.

Subsequently, a light emitting operation starts. A pulse is inputted to the third gate signal line 604 to turn ON the TFT 609. Since the storage capacitor 610 holds VGS that has been written, the TFT 608 is ON and a current of Idata flows therethrough from the current supply line 605. Accordingly, the EL element 611 emits light. At in this time, in the case where the TFT 608 is set to operate in a saturation region, Idata can continue flowing even when the source-drain voltage of the TFT 608 varies.

Such an operation of outputting a set current is referred to as an outputting operation here. By using the current write type pixel, a gate-source voltage required for flowing the current Idata is held in the storage capacitor 610, so that a desired current can be supplied to the EL element 611 accurately even in the case where the TFTs 608 have a variations in characteristics and the like. Consequently, luminance variations due to characteristic variations of TFTs can be suppressed.

The abovementioned example relates to the technology for correcting the change in current due to variations of driving TFTs among pixel circuits, however, the same problem occurs in a source driver circuit. Patent Document 4 discloses a circuit configuration for preventing the change in signal current due to the manufacturing variations of TFTs in a source driver circuit.

(Patent Document 5)

Japanese Patent Laid-open Publication No. 2003-66908

Patent Document 5 discloses a configuration in which a voltage source is additionally provided as well as a current source for controlling gray scale, and a charge of floating capacitance is instantaneously changed by the voltage source at the beginning of a row selection period by a power source switching means for switching two power sources to input to a source signal line, and then a gray scale display is performed by the current source for realizing desired luminance.

SUMMARY OF THE INVENTION

However, as the parasitic capacitance of a wiring used for supplying a signal current to a driving TFT and a light emitting element is quite large, a time constant for charging the parasitic capacitance of the wiring becomes large in the case of small signal current, which slows down the signal writing speed. That is, even when a signal current is supplied to a transistor, it takes long to generate a voltage required for flowing the signal current at a gate terminal thereof, therefore the signal writing speed is slowed down.

In the configuration disclosed in Patent Document 5, although a charge of a source signal line is instantaneously changed, a voltage value supplied at the beginning of a row selection period is not at the optimum level. In addition, the configuration is complex.

In view of the foregoing problems, it is an object of the invention to provide a semiconductor device in which the influence of characteristic variations of transistors is reduced and a predetermined current can be supplied, so that the signal writing speed can be sufficiently improved even when a signal current is small.

According to the invention, a voltage at the optimum level is supplied in advance when inputting a current to a pixel for achieving the above object.

The invention provides a semiconductor device comprising a circuit in which a current supplied to a load is controlled by a transistor, whose source or drain is connected to a current source circuit, and an amplifier circuit for controlling a gate-source voltage and a drain-source voltage of the transistor when a current is supplied from the current source circuit to the transistor.

According to the invention, a current memory circuit is supplied with a current from a circuit for supplying voltage and current, and a load is supplied with a voltage from the circuit for supplying voltage and current and with a current from the current memory circuit.

The semiconductor device of the invention comprises a current memory circuit provided with a means for supplying current to a load, and a circuit for supplying voltage and current provided with a means for supplying current to the current memory circuit and for supplying voltage to the load.

According to the forgoing configuration of the invention, the circuit for supplying voltage and current supplies a voltage to the load through the current memory circuit. The voltage supplied to the load may be used for a precharge voltage for the load.

Suitable for a load is an element controlled by a current or a current signal, which is typified by a light emitting element whose luminance can be changed by a current. According to the invention, a display device can be configured with such a light emitting element in each pixel which is arranged in matrix.

The circuit for supplying voltage and current has a function to supply a current corresponding to a signal which is inputted as a current or a voltage and supplying a precharge voltage. Note that the precharge voltage is at the optimum level for the rapid writing of the current supplied by the circuit for supplying voltage and current.

The current memory circuit has a function to be inputted a current from a memory current input terminal and to output a current corresponding to the inputted current from a memory current output terminal. Even after the input of current is completed, the signal corresponding to the current is stored, so that a current corresponding to the inputted current can be outputted from the memory current output terminal.

The invention can adopt any kind of transistor, including a thin film transistor (TFT) using a non-monocrystalline semiconductor film typified by amorphous silicon and polycrystalline silicon, a MOS transistor formed by using a semiconductor substrate or an SOI substrate, a junction transistor, a transistor using an organic semiconductor or a carbon nanotube, and the like. In addition, the transistor may be disposed over any kind of substrate such as a monocrystalline substrate, an SOI substrate, and a glass substrate.

Note that in this invention, connection means electrical connection. Therefore, the configuration disclosed in the invention may comprise other additional elements (such as other elements or switches, for example) that enable electrical connections between the predetermined connections.

According to the invention, a precharge voltage is supplied in advance when supplying a current to a pixel. Therefore, the writing of current is completed rapidly. Optimum precharge voltage can be supplied because it is outputted from a circuit that supplies a current to a pixel.

BRIEF DESCRIPTION OF THE DRAWINGS

FIGS. 50A to 50H are views of electronic apparatuses each using the invention.

DETAILED DESCRIPTION OF THE INVENTION

Embodiment Mode 1

According to the invention, a pixel is configured with an element enable to control a luminance based on a current value flowing through a light emitting element. Typically, an EL element can be used. There are various known configurations of the EL element and any element configuration may be used in the invention so long as luminance thereof can be controlled based on a current value. That is, an EL element is formed by freely combining a light emitting layer, a charge transporting layer and a charge injecting layer. As a material for the EL element, a low-molecular weight organic material, a medium-molecular weight organic material (an organic light emitting material which has no sublimation property and in which the number of molecules is 20 or less or a length of chained molecules is 10 m or less), or a polymer organic material can be employed. Alternatively, each of the organic materials may be mixed or dispersed with an inorganic material.

According to the invention, a video signal voltage corresponding to the display and a video signal current corresponding to the display are supplied to a current source circuit which is disposed in a pixel, a signal line driver circuit, and the like. The video signal voltage and the video signal current are relative to each other. Firstly, a circuit for supplying video signal voltage and video signal current is described below.

Note that the circuit described below may be applied not only for supplying video signal voltage and video signal current, but also for supplying other signal voltage and other signal current.

The circuit for supplying video signal voltage and video signal current can be configured like FIG. 1, FIG. 2, FIG. 3, or FIG. 4. Details thereof are disclosed in Japanese Patent Application No. 2003-273765, of which contents can be combined with this application. In this application, the circuit is described in brief first.

Figure 1:
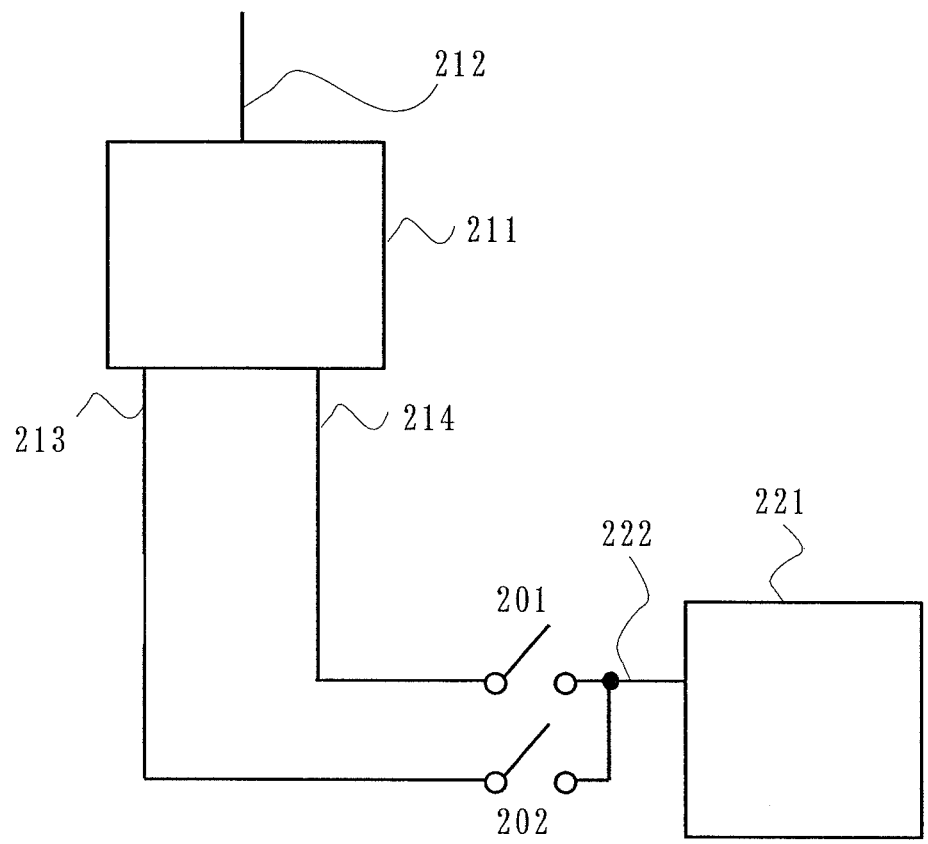
FIG. 1 is a diagram illustrating a configuration of a semiconductor device of the invention.

In FIG. 1, a signal is inputted from an original signal input terminal 212 to a circuit 211 for supplying voltage and current. Corresponding to the signal, a signal current is outputted from a current output terminal 213 and a signal voltage is outputted from a voltage output terminal 214. The current output terminal 213 and the voltage output terminal 214 are connected to an input terminal 222 of a circuit 221 to be set through switches 202 and 201, respectively.

In the circuit 221 to be set, the precharge is performed by the signal voltage supplied from the voltage output terminal 214 of the circuit 211 for supplying voltage and current and after that, a current is set by the signal current supplied from the current output terminal 213 of the circuit 211 for supplying voltage and current. Consequently, the circuit 221 to be set can supply an accurate current with few influence of variations in current characteristics of transistors therein.

The signal voltage supplied from the voltage output terminal 214 of the circuit 211 for supplying voltage and current is approximately at an equivalent level to that when a steady state is achieved after the signal current is supplied from the current output terminal 213 of the circuit 211 for supplying voltage and current to the circuit 221 to be set, namely when a signal writing is completed. By the precharge with a signal voltage supplied from the voltage output terminal 214, a steady state can be achieved quickly when a signal current is supplied from the current output terminal 213 of the circuit 211 for supplying voltage and current after the precharge.

That is, a signal voltage supplied from the voltage output terminal 214 of the circuit 211 for supplying voltage and current and a signal current supplied from the current output terminal 213 of the circuit 211 for supplying voltage and current are relative to each other.

As for the current supply from the current output terminal 213 of the circuit 211 for supplying voltage and current to the input terminal 222 of the circuit 221 to be set, a current direction has to be taken into consideration. That is, in the case where a current flows to outside from the circuit 211 for supplying voltage and current (referred to as a drain type here), it is necessary that the current is made to flow into the circuit 221 to be set (referred to as a draw type here). In this case, the potential of the circuit 211 for supplying voltage and current is higher than that of the circuit 221 to be set, so that a current flows from the circuit 211 for supplying voltage and current toward the circuit 221 to be set. On the other hand, in the case where a current flows to the circuit 211 for supplying voltage and current (in the case of the draw type), it is necessary that the current is made to flow outside from the circuit 221 to be set (in the case of the drain type). In this case, the potential of the circuit 211 for supplying voltage and current is lower than that of the circuit 221 to be set, so that a current flows from the circuit 221 to be set toward the circuit 211 for supplying voltage and current.

In the case where both of the circuit 211 for supplying voltage and current and the circuit 221 to be set are either the draw type or the drain type, a current does not flow normally, so that a normal operation is not realized. Therefore, it is necessary that either of the circuit 211 for supplying voltage and current and the circuit 221 to be set is the draw type and the other is the drain type.

Figure 5:
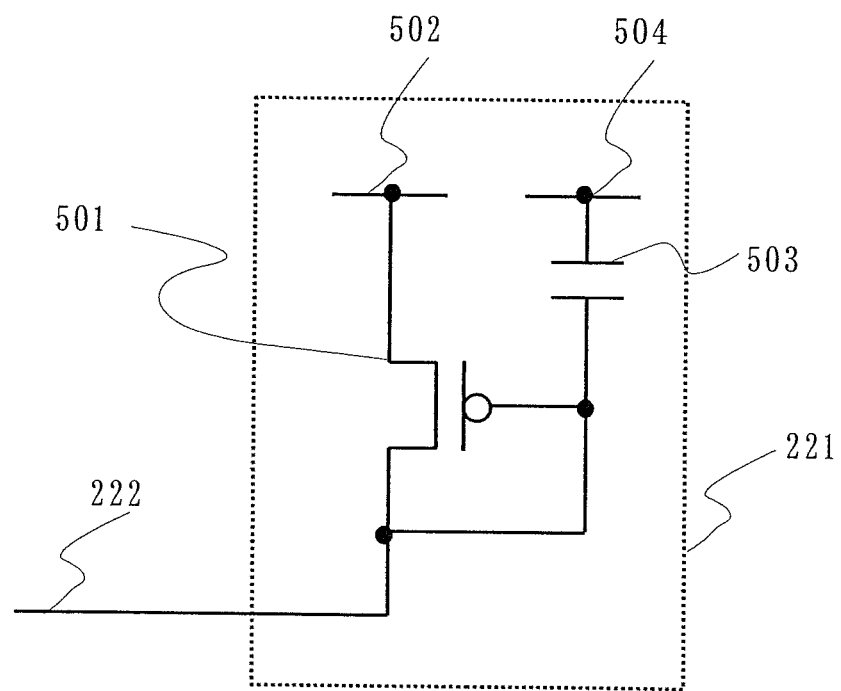
FIG. 5 is a diagram illustrating a configuration of a semiconductor device of the invention.
Figure 6:
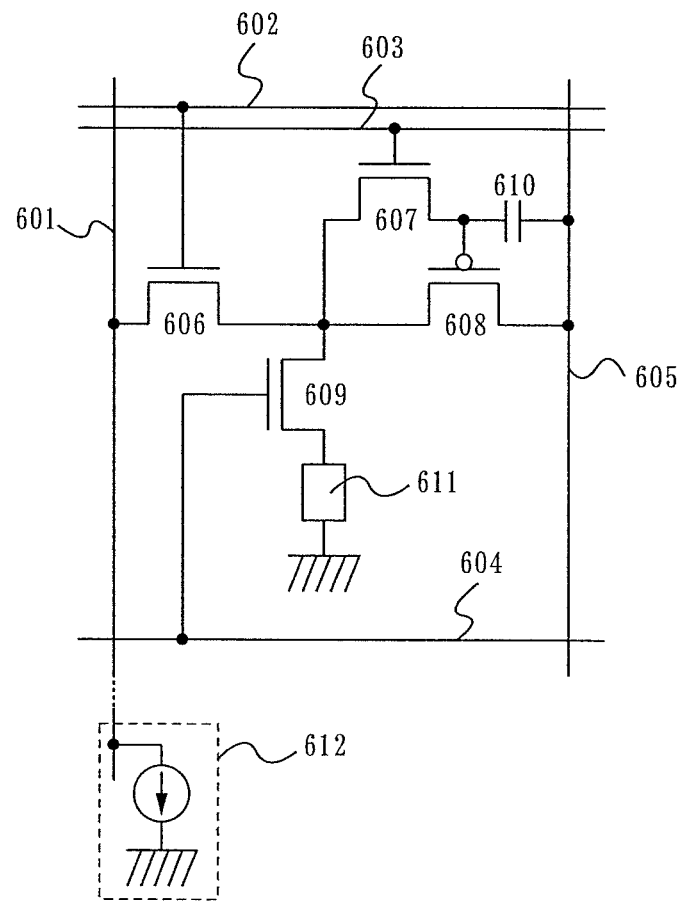
FIG. 6 is a diagram illustrating a configuration of a conventional pixel.
Figure 7A:
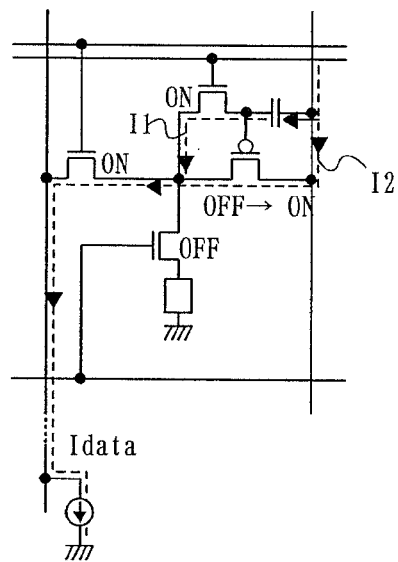
FIGS. 7A to 7E are diagrams illustrating operations of a conventional pixel.
Figure 7B:
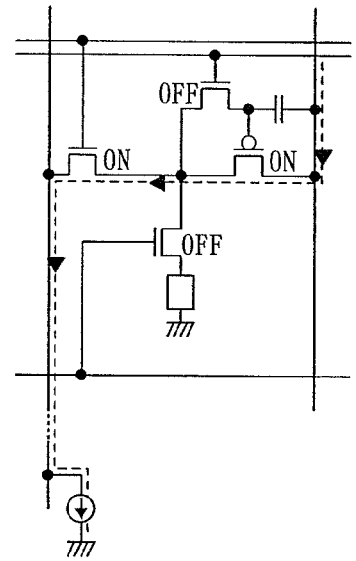
Figure 7C:
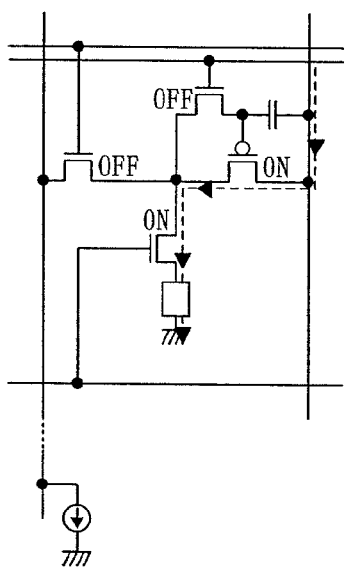
Figure 7D:
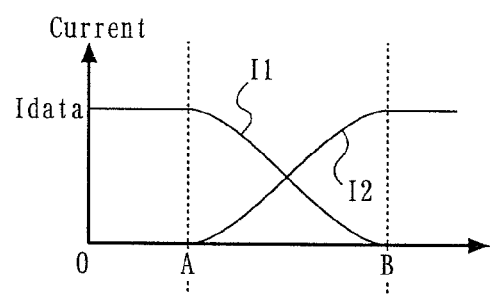
Figure 7E:
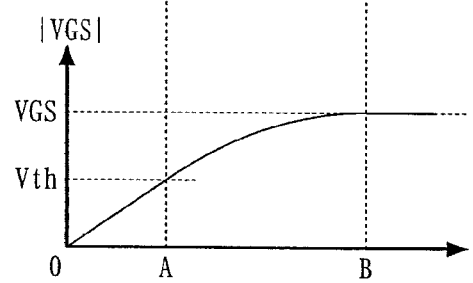
Figure 8:
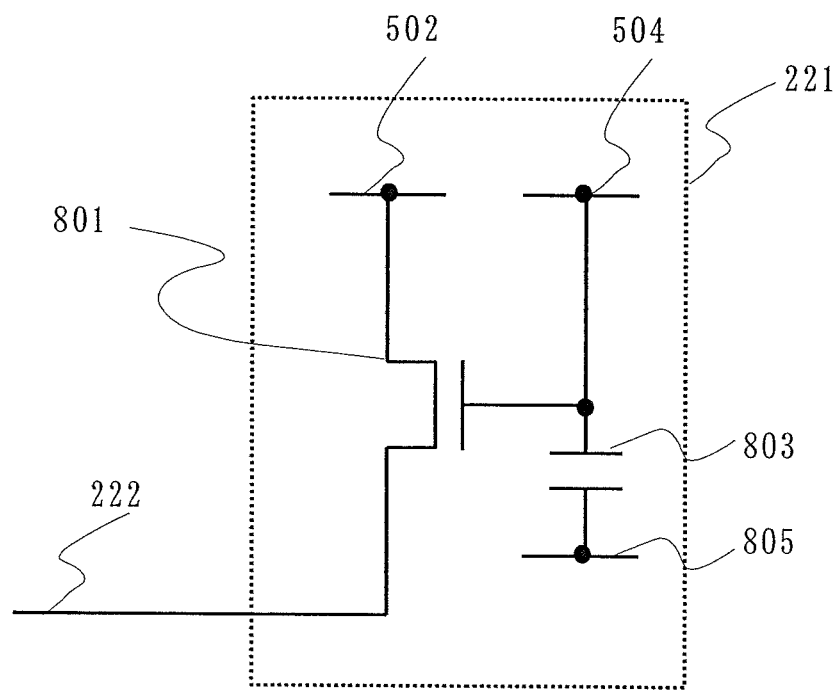
FIG. 8 is a diagram illustrating a configuration of a semiconductor device of the invention.

Firstly, a configuration of the circuit 221 to be set is described briefly. FIGS. 5 and 8 show configuration examples of the circuit 221 to be set of the drain type. A transistor 501 is a P-channel type in FIG. 5 while a transistor 801 is an N-channel type in FIG. 8, which function as current sources. Since the circuit 221 to be set is of the drain type here, the potential of a wiring 502 is high.

Capacitors 503 and 803 hold gate-source voltages of the transistors 501 and 801, respectively. Note that the capacitors 503 and 803 are not necessarily provided according to the gate capacitance of the transistors 501 and 801. Reference numeral 504 denotes a wiring connected to the capacitor 503 or the capacitor 803 in FIGS. 5 and 8. Reference numeral 805 denotes a wiring connected to the capacitor 803 in FIG. 8.

In FIG. 8, a source terminal of the transistor 801 is connected not to a constant potential line but to the input terminal 222 of the circuit 221 to be set. Therefore, the source potential of the transistor 801 may vary corresponding to an operating state. In view of this, the wiring 805 is preferably connected to a source terminal of the transistor 801 so that the gate-source voltage of the transistor 801 does not vary even when a source potential of the transistor 801 varies. In addition, a gate terminal and a drain terminal of the transistor 801 may be connected to each other.

The transistor in the circuit 221 to be set can supply a predetermined current by using a signal supplied from the circuit 211 for supplying voltage and current, thus the current setting is carried out. The transistor in the circuit 221 to be set supplies a predetermined current to another circuit or element and the like as a current source. Another circuit or element and the like to which the transistor in the circuit 221 to be set (transistors 501 and 801) supplies a current after the current setting are omitted for simplicity in FIGS. 5 and 8.

A switch is provided in many cases in order to hold a charge of the capacitors 503 or 803 though it is also omitted for simplicity in FIGS. 5 and 8.

That is, FIGS. 5 and 8 show configurations of the circuit 221 to be set when a current setting is carried out by a signal supplied from the circuit 211 for supplying voltage and current for simplicity.

Figure 9:
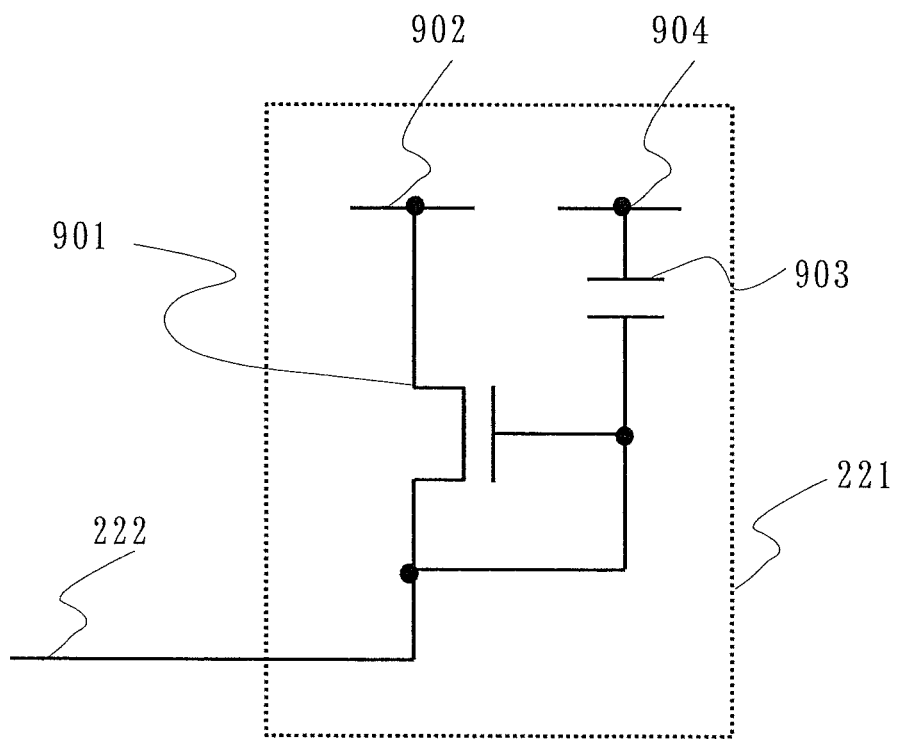
FIG. 9 is a diagram illustrating a configuration of a semiconductor device of the invention.
Figure 10:
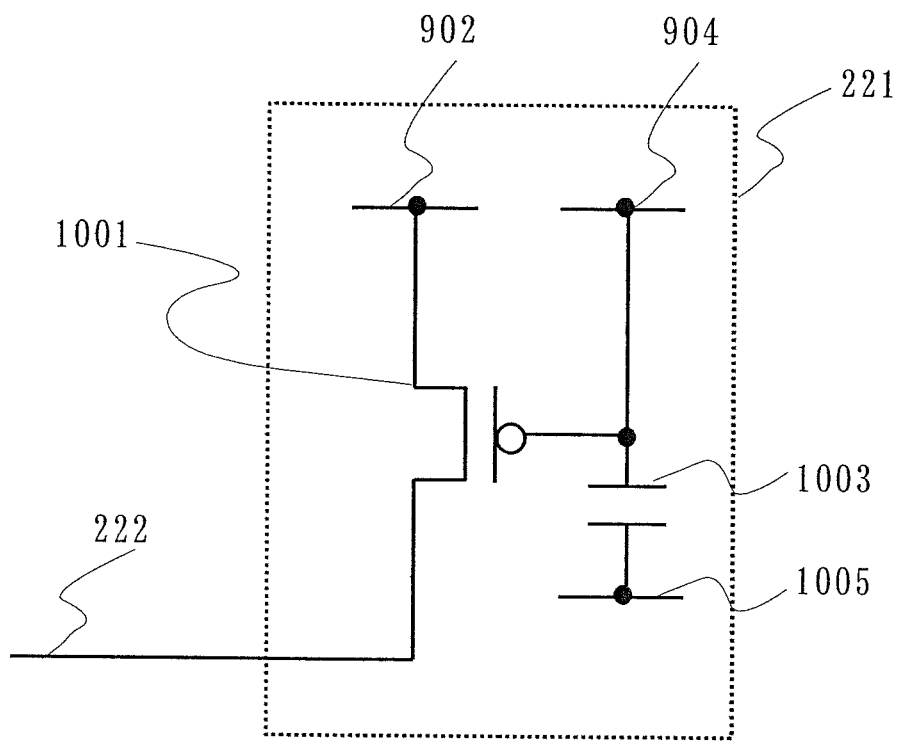
FIG. 10 is a diagram illustrating a configuration of a semiconductor device of the invention.

FIGS. 9 and 10 show configuration examples of the circuit 221 to be set of the draw type. A transistor 1001 is a P-channel type in FIG. 10 while a transistor 901 is an N-channel type in FIG. 9, which function as current sources. In this point, the descriptions in FIGS. 5 and 8 can be applied here. A wiring 902 is connected to either source or drain of the transistor 901 in FIG. 9. Reference numeral 903 denotes a capacitor and 904 denotes a wiring connected to the capacitor 903. The wiring 902 is connected to either source or drain of the transistor 1001 in FIG. 10. One terminal of a capacitor 1003 is connected to the wiring 904 and a gate of the transistor 1001, and the other terminal of the capacitor 1003 is connected to a wiring 1005.

The circuit 211 for supplying voltage and current is described below. The circuit 211 for supplying voltage and current has a function to supply a current corresponding to a signal which is inputted as a current or a voltage and to supply a precharge voltage. The precharge voltage is at an optimum level for the rapid writing of the current supplied by the circuit 211 for supplying voltage and current.

The circuit 211 for supplying voltage and current can adopt various configurations. Details thereof are disclosed in Japanese Patent Application No. 2003-273765, of which contents can be combined with this application.

Figure 11:
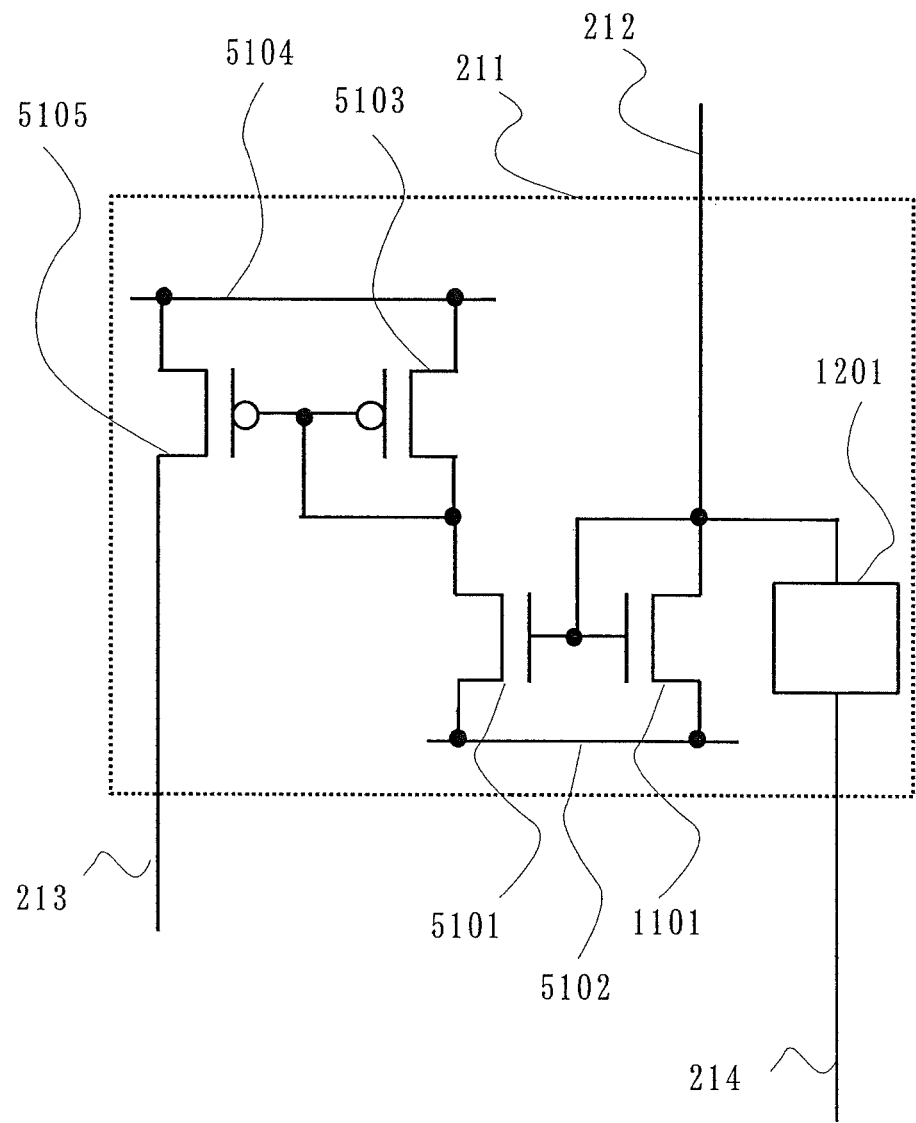
FIG. 11 is a diagram illustrating a configuration of a semiconductor device of the invention.

One example thereof is shown in FIG. 11. In FIG. 11, a current is supplied to the N-channel type transistor 1101 to control a gate potential of the transistor 5101. That is, a gate terminal of the transistor 5101 is connected to a gate terminal of the transistor 1101 and a gate terminal of a transistor 5103 is connected to a gate terminal of a transistor 5105. Furthermore, either source or drain of the transistor 1101 and either source or drain of the transistor 5101 are connected to each other via a wiring 5102. Either source or drain of the transistor 5103 and either source or drain of the transistor 5105 are connected to each other via a wiring 5104. Consequently, a current corresponding to a current supplied to the transistor 1101 flows in the transistors 5101, 5103, and 5105. It is assumed here that the ratio of the channel width W to the channel length L of the transistor 1101 is W51/L51, the ratio of the channel width W to the channel length L of the transistor 5101 is W52/L52, the ratio of the channel width W to the channel length L of the transistor 5103 is W53/L53, the ratio of the channel width W to the channel length L of the transistor 5105 is W54/L54, and further, (W51/L51) (W52/L52)/$\epsilon$ and (W53/L53)=(W54/L54)/$\zeta$ are satisfied. As a result, a current of E times as large as a current supplied to the transistor 1101 flows in the transistors 5101 and 5103. A current of $\zeta$ times as large as the current supplied to the transistor 5103 flows in the transistor 5105.

A gate potential of the transistor 1101 is outputted to the voltage output terminal 214 through an amplifier circuit 1201. However, it is not limited to this and the amplifier circuit 1201 may not be provided in the case where there is no need of the impedance transformation.

It is preferable to adjust the ratio W51/L51 of the transistor 1101, the ratio W52/L52 of the transistor 5101, the ratio W53/L53 of the transistor 5103, the ratio W54/L54 of the transistor 5105, and the ratio W21/L21 of the transistor 901 in FIG. 9, so that a signal voltage which is supplied from the voltage output terminal 214 of the circuit 211 for supplying voltage and current is approximately at an equivalent level to that when a steady state is achieved after a signal current is supplied from the current output terminal 213 of the circuit 211 for supplying voltage and current, namely when a signal writing is completed. That is, (W21/L21)=(W51/L51)×ϵ×ζ is preferably satisfied. Consequently, a gate-source voltage of the transistor 1101 and a gate-source voltage of the transistor 901 become approximately at an equivalent level to each other, which means that supplying a signal voltage from the voltage output terminal 214 corresponds to the precharge operation as a rule. In this manner, a steady state can be achieved quickly when a signal current is supplied from the current output terminal 213 of the circuit 211 for supplying voltage and current after the precharge.

The circuit 211 for supplying voltage and current can adopt other various configurations. The various configurations are described in Japanese Patent Application No. 2003-273765, which is hereby incorporated by reference. The contents of the reference can be combined with this application.

Figure 2:
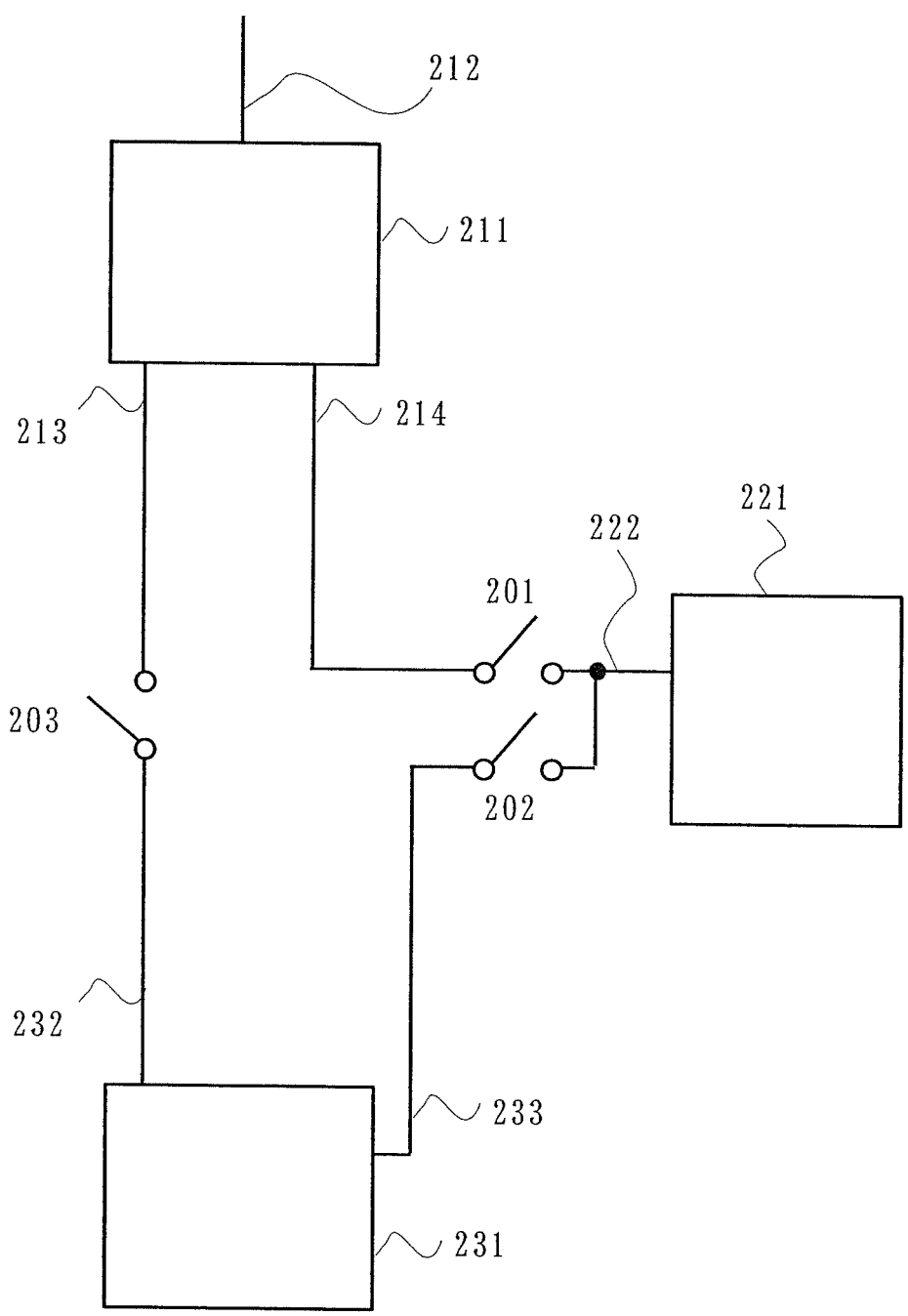
FIG. 2 is a diagram illustrating a configuration of a semiconductor device of the invention.

Described below is the case where a current memory circuit 231 is interposed between the circuit 211 for supplying voltage and current and the circuit 221 to be set as shown in FIG. 2.

A signal current is outputted from the current output terminal 213 of the circuit 211 for supplying voltage and current to the current memory circuit 231 through a switch 203 as shown in FIG. 2, so that the current setting is carried out and a current value is stored in the current memory circuit 231. At that time, a signal voltage is outputted from the voltage output terminal 214 of the circuit 211 for supplying voltage and current to the circuit 221 to be set. That is, the precharge is performed in the circuit 221 to be set. Then, a signal current is outputted from the current memory circuit 231 to the circuit 221 to be set and a current is set therein. It should be noted that the current outputted from the current memory circuit 231 to the circuit 221 to be set is proportionate to the current outputted from the current output terminal 213 of the circuit 211 for supplying voltage and current to the current memory circuit 231. Depending on a configuration of the current memory circuit 231, the above-mentioned currents may be approximately equivalent to each other.

In the case in FIG. 1, it is necessary that either of the circuit 211 for supplying voltage and current and the circuit 221 is of the draw type and the other is of the drain type. In a configuration in FIG. 2, it is necessary to consider the type of the current memory circuit 231 as well as the types of the circuit 211 for supplying voltage and current and the circuit 221 to be set.

Firstly, a case is considered in which the type of the current memory circuit 231 is the same between in both cases where a current is inputted from the current output terminal 213 of the circuit 211 for supplying voltage and current to the current memory circuit 231, and where a current is outputted from the current memory circuit 231 to the circuit 221 to be set. In the case of the current memory circuit 231 of the drain type, for example, each of the circuit 211 for supplying voltage and current and the circuit 221 to be set is required to be of the draw type. On the other hand, in the case of the current memory circuit 231 of the draw type, for example, each of the circuit 211 for supplying voltage and current and the circuit 221 to be set is required to be of the drain type. That is, it is necessary that the circuit 211 for supplying voltage and current and the circuit 221 to be set are of the same types.

Next, it is assumed that the type of the current memory circuit 231 is opposite to between in the case where a current is inputted from the current output terminal 213 of the circuit 211 for supplying voltage and current to the current memory circuit 231, and the case where a current is outputted from the current memory circuit 231 to the circuit 221 to be set. In the case where the current memory circuit 231 is of the drain type when a current is inputted from the circuit 211 for supplying voltage and current to the current memory circuit 231 while the current memory circuit 231 is of the draw type when a current is outputted from the current memory circuit 231 to the circuit 221 to be set, for example, the circuit 211 for supplying voltage and current is required to be of the draw type and the circuit 221 to be set is required to be of the drain type. On the other hand, in the case where the current memory circuit 231 is of the draw type when a current is inputted from the circuit 211 for supplying voltage and current to the current memory circuit 231 while the current memory circuit 231 is of the drain type when a current is outputted from the current memory circuit 231 to the circuit 221 to be set, for example, the circuit 211 for supplying voltage and current is required to be of the drain type and the circuit 221 to be set is required to be of the draw type. That is, it is necessary that the circuit 211 for supplying voltage and current and the circuit 221 to be set are of the opposite types to each other.

Described below is the circuit 211 for supplying voltage and current in FIG. 2. The circuit 211 for supplying voltage and current can adopt various configurations. Details thereof are disclosed in Japanese Patent Application No. 2003-273765, of which contents can be combined with this application.

Figure 12:
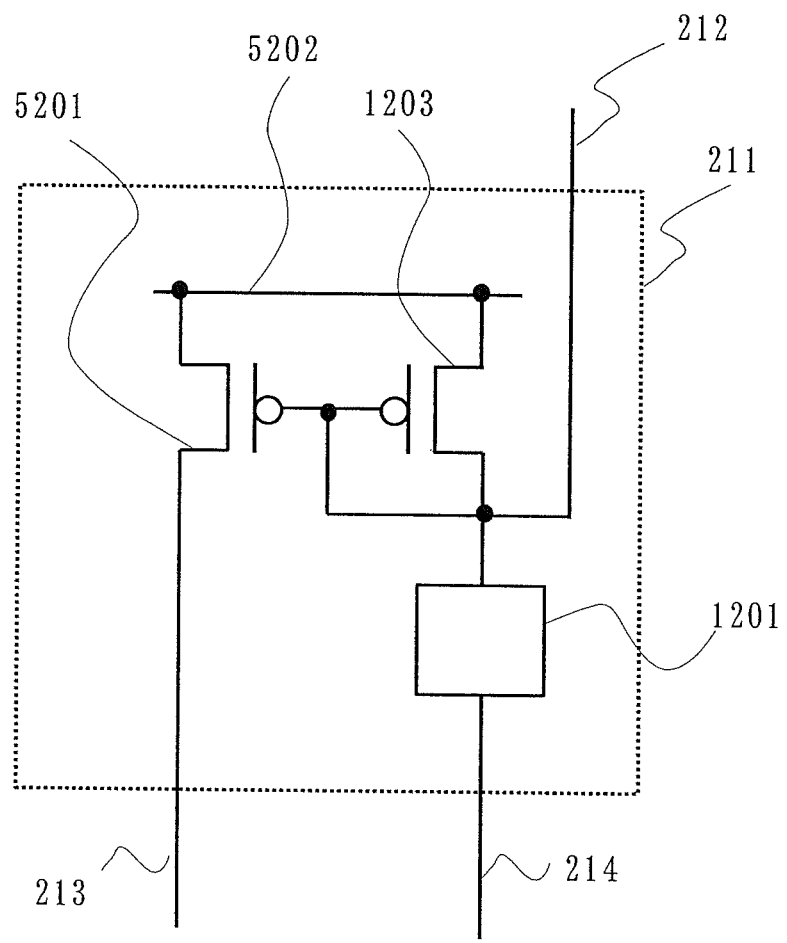
FIG. 12 is a diagram illustrating a configuration of a semiconductor device of the invention.

One example of the circuit 211 for supplying voltage and current in FIG. 2 is shown in FIG. 12. In FIG. 12, a current is supplied from the original signal input terminal 212 to a P-channel transistor 1203 to control gate potentials of the P-channel transistor 1203 and a transistor 5201. In this manner, a gate-source voltage of the transistor 5201 varies and thus a current supplied to the transistor 5201 varies. The transistor 5201 and the transistor 1203 are connected to each other via a wiring 5202.

A current outputted from the current memory circuit 231 flows in the transistor 501 in the circuit 221 to be set. The current outputted from the current memory circuit 231 to the circuit 221 to be set is K times as large as a current inputted from the circuit 211 for supplying voltage and current to the current memory circuit 231.

A gate potential of the transistor 5201 is outputted to the voltage output terminal 214. Note that an amplifier circuit 1201 such as a voltage follower circuit may be provided between the original signal input terminal 212 and the voltage output terminal 214 while it may not be provided in the case where there is no need of the impedance transformation.

It is preferable to adjust the ratio W81/L81 of the transistor 5201 and the ratio W23/L23 of the transistor 501, so that a signal voltage which is supplied from the voltage output terminal 214 of the circuit 211 for supplying voltage and current is approximately at an equivalent level to that when a steady state is achieved after a signal current is supplied from the current memory circuit 231 to the circuit 221 to be set, namely when a signal writing is completed. That is, (W23/L23)=κ×(W82/L82) is preferably satisfied. Consequently, a gate-source voltage of the transistor 5201 and a gate-source voltage of the transistor 501 become approximately at an equivalent level to each other, which means supplying a signal voltage from the voltage output terminal 214 corresponds to a precharge operation as a rule. In this manner, a steady state can be achieved quickly when a signal current is supplied from a current output terminal 233 of the current memory circuit 231 after the precharge.

Subsequently, a configuration of the current memory circuit 231 in FIG. 2 is described. The current memory circuit 231 has a function to be inputted a current from a memory current input terminal 232 and to output a current corresponding to the inputted current from the memory current output terminal 233. Even after the input of current is completed, the signal corresponding to the current is stored, so that a current corresponding to an inputted current can be outputted from the memory current output terminal 233. The current memory circuit 231 can adopt any configuration so long as it has the aforementioned function.

Figure 13:
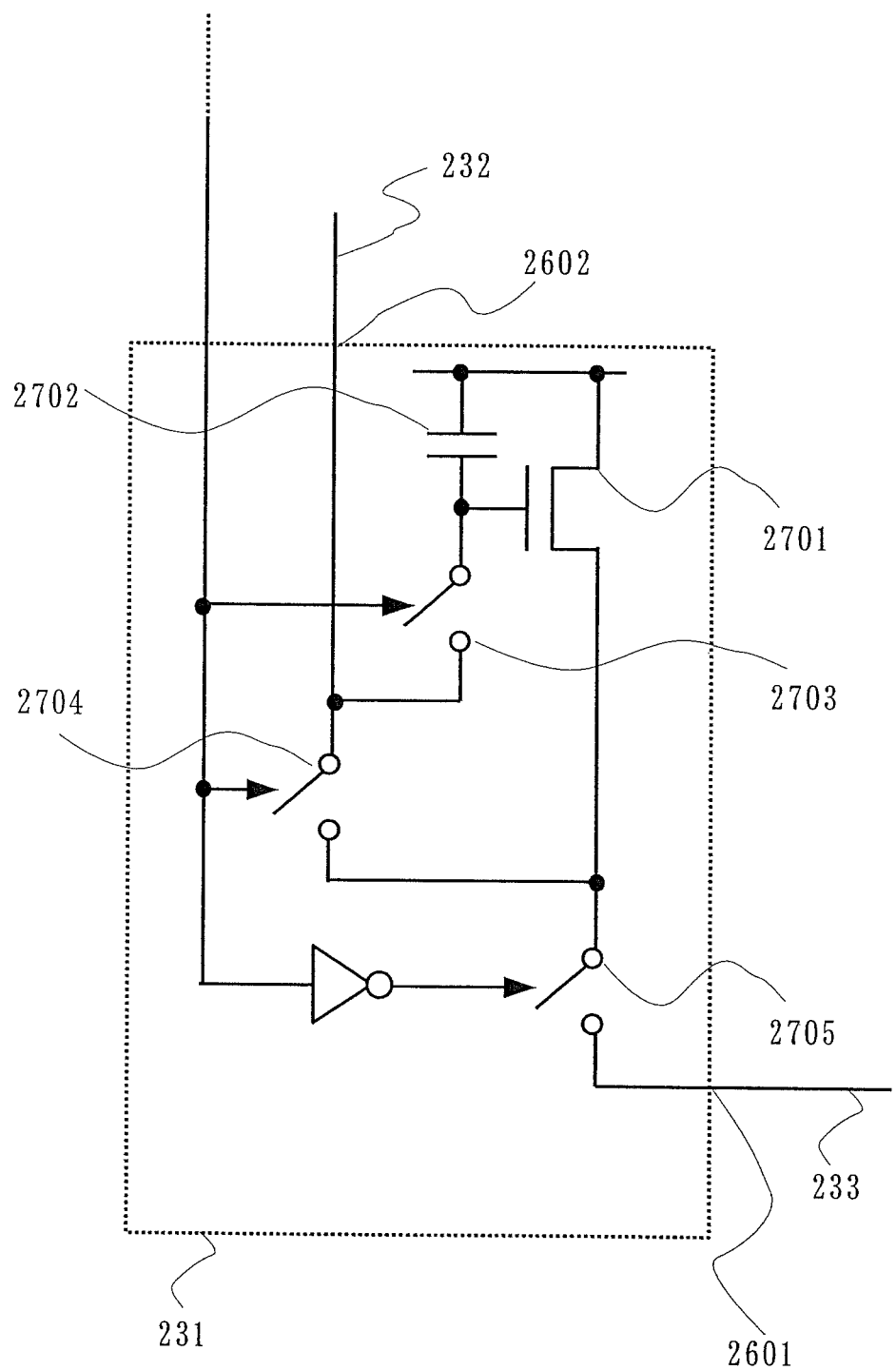
FIG. 13 is a diagram illustrating a configuration of a semiconductor device of the invention.
Figure 14:
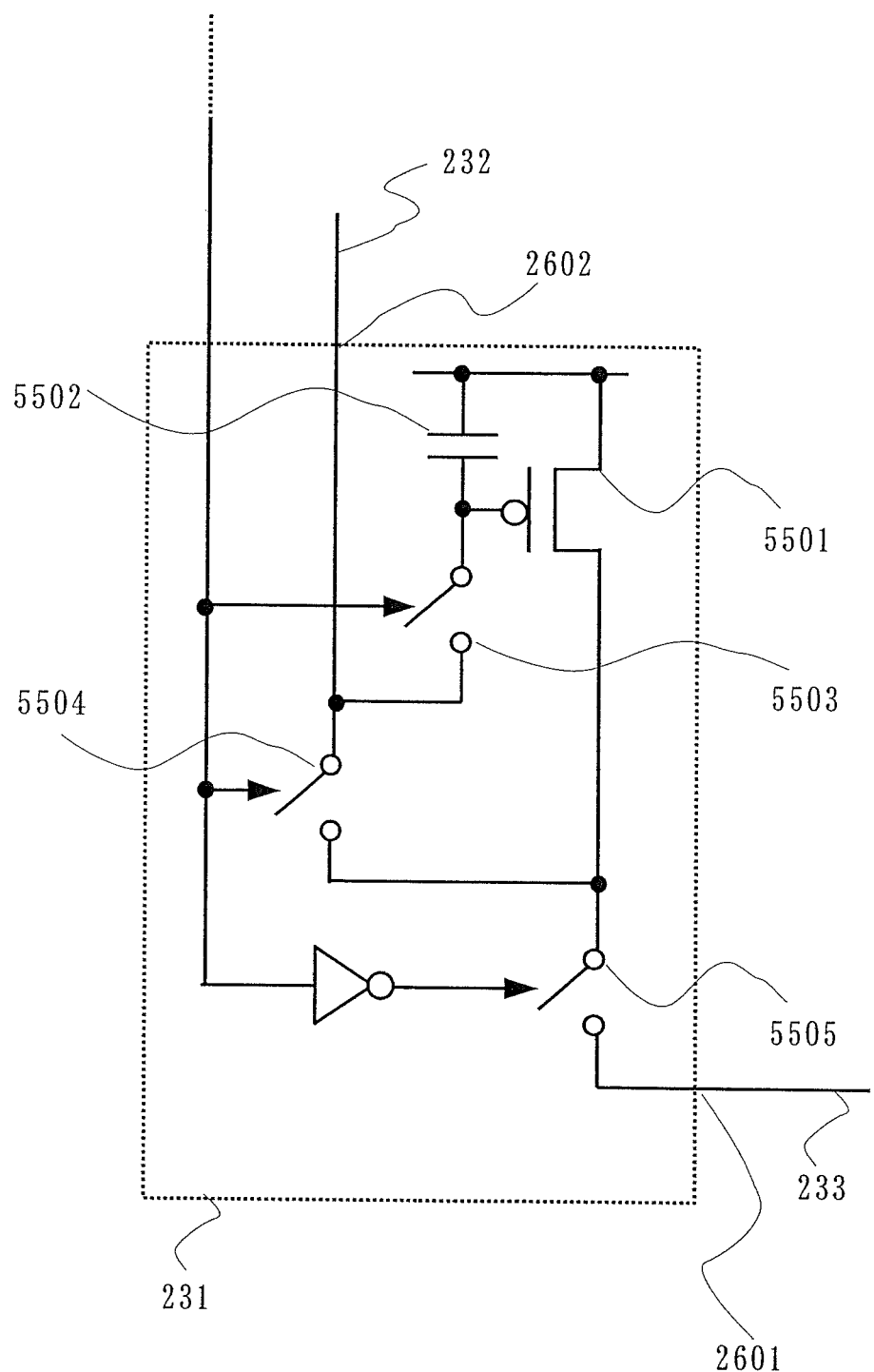
FIG. 14 is a diagram illustrating a configuration of a semiconductor device of the invention.

The current memory circuit 231 of the draw type is shown in FIG. 13 and the current memory circuit 231 of the drain type is shown in FIG. 14. Reference numeral 5501 denotes a transistor, 5502 denotes a capacitor, and 5503 to 5505 denote switches.

The current memory circuit 231 can be configured by appropriately selecting the draw type or the drain type in this manner.

The circuit 211 for supplying voltage and current and the current memory circuit 231 can adopt various configurations. Details thereof are disclosed in Japanese Patent Application No. 2003-273765, of which contents can be combined with this application.

In FIG. 2, a signal current is supplied from the circuit 211 for supplying voltage and current to the current memory circuit 231 through the current output terminal 213, however, it is not limited to this composition and both of a signal voltage and a signal current may be inputted to the current memory circuit 231 as shown in FIG. 1.

Figure 3:
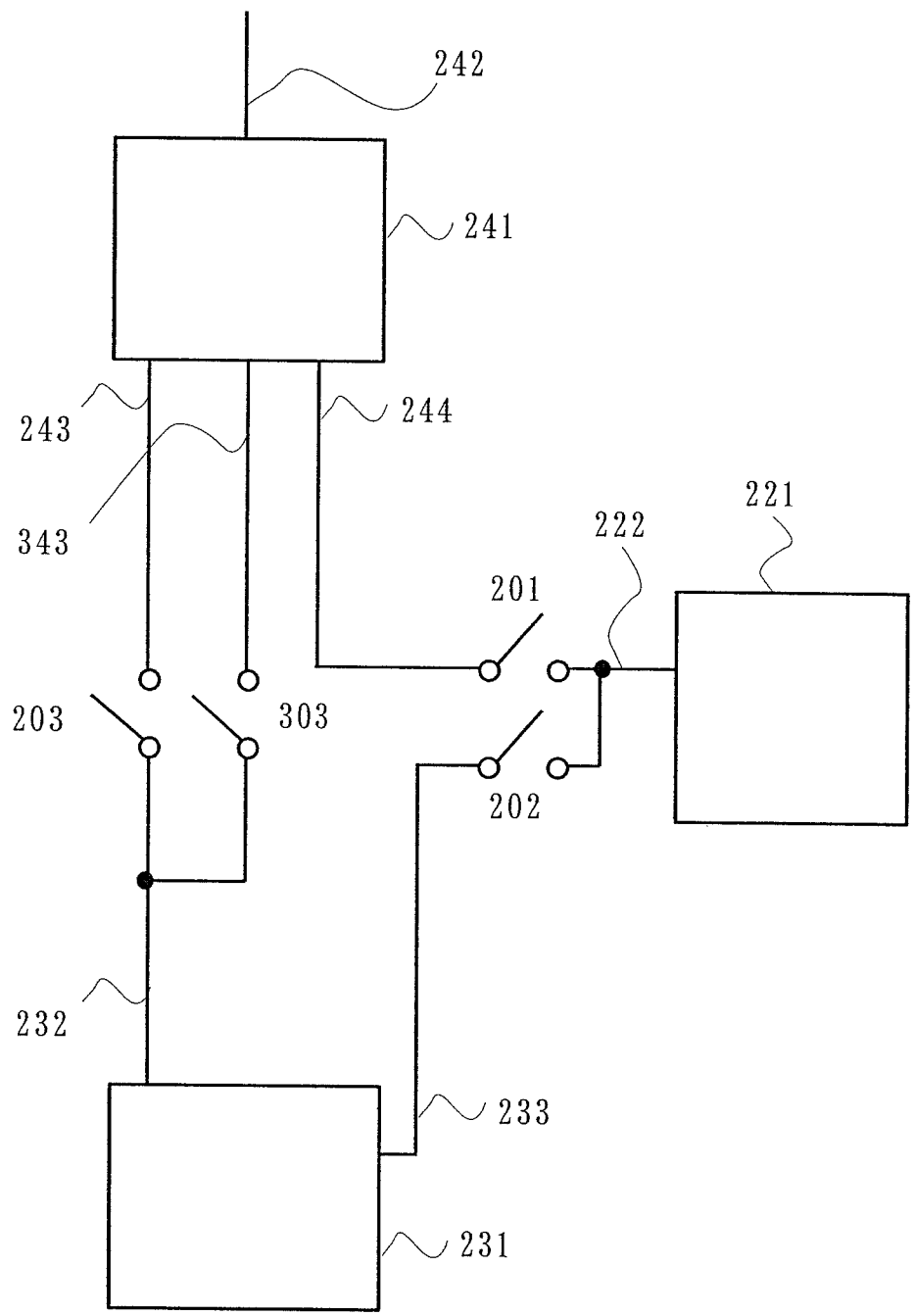
FIG. 3 is a diagram illustrating a configuration of a semiconductor device of the invention.

FIG. 3 shows the case where a signal voltage and a signal current are inputted to the current memory circuit 231.

As shown in FIG. 3, a signal is inputted from an original signal input terminal 242 to a circuit 241 for supplying voltage and current. Corresponding to the signal, a signal voltage is outputted from a second voltage output terminal 343 of the circuit 241 for supplying voltage and current to the current memory circuit 231 through a switch 303, that is a precharge operation. Subsequently, a signal current is outputted from a current output terminal 243 to the current memory circuit 231 so that the current setting is carried out and a current value is stored in the current memory circuit 231. A signal voltage is outputted from a voltage output terminal 244 of the circuit 241 for supplying voltage and current to the circuit 221 to be set. That is, the precharge is performed in the circuit 221 to be set. Then, a signal current is outputted from the current memory circuit 231 to the circuit 221 to be set and a current is set therein. It should be noted that the current outputted from the current memory circuit 231 to the circuit 221 to be set is proportionate to the current outputted from the current output terminal 243 of the circuit 241 for supplying voltage and current to the current memory circuit 231. Depending on a configuration of the current memory circuit 231, the above-mentioned currents may be approximately equivalent to each other.

It is necessary to adjust each voltage outputted from the voltage output terminal 244 of the circuit 241 for supplying voltage and current and outputted from the second voltage output terminal 343 thereof depending on each type of the current memory circuit 231 and the circuit 221 to be set, namely either the draw type or the drain type, conductivity types of transistors configuring the circuits, and the like.

That is, the voltage outputted from the voltage output terminal 244 of the circuit 241 for supplying voltage and current is set to enable the precharge operation for the circuit 221 to be set while the voltage outputted from the second voltage output terminal 343 of the circuit 241 for supplying voltage and current is set to enable the precharge operation for the current memory circuit 231.

As mentioned above, each of the voltages is generated by adjusting a current supplied to each transistor, a conductivity type of the transistor, the size of the transistor, and the types of the current memory circuit 231 and the circuit 221 to be set, namely either the draw type or the drain type.

Details thereof are disclosed in Japanese Patent Application No. 2003-273765, of which contents can be combined with this application.

Figure 4:
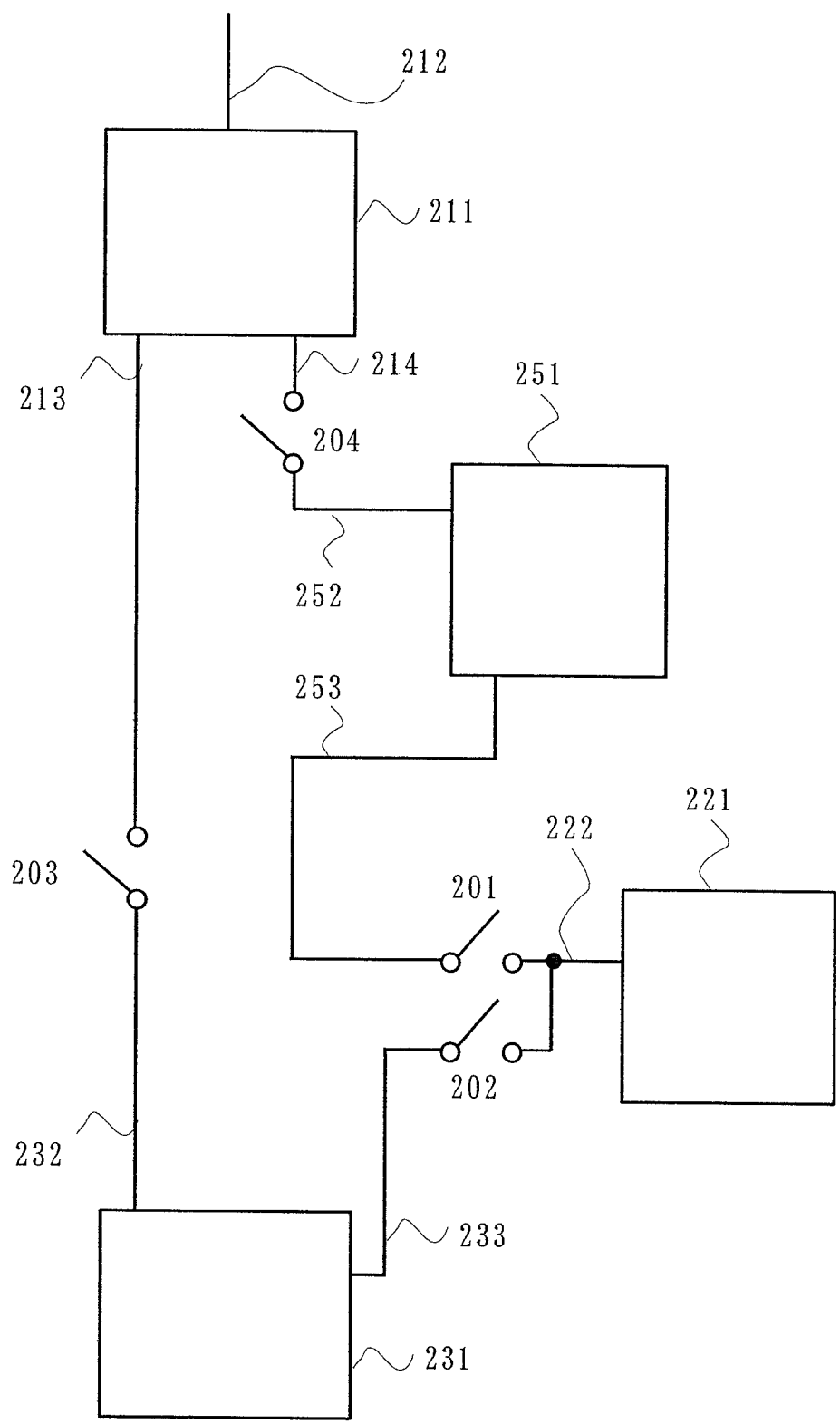
FIG. 4 is a diagram illustrating a configuration of a semiconductor device of the invention.

Described above is the case where the current memory circuit 231 is interposed between the circuit 211 for supplying voltage and current and the circuit 221 to be set in FIG. 2, thereby a signal current is stored before inputting a current to the circuit 221 to be set. Alternatively, a voltage memory circuit 251 may be interposed between the circuit 211 for supplying voltage and current and the circuit 221 to be set. A configuration in which the voltage memory circuit 251 is additionally provided in the configuration in FIG. 2 is shown in FIG. 4. Reference numeral 204 denotes a switch, 252 denotes an input terminal, and 253 denotes an output terminal.

Note that it is not limited to this and the voltage memory circuit 251 may be additionally provided in the configuration in FIG. 3. Furthermore, the voltage memory circuit 251 may be disposed between the circuit 241 for supplying voltage and current and the current memory circuit 231 in the configuration in FIG. 3.

Figure 15:
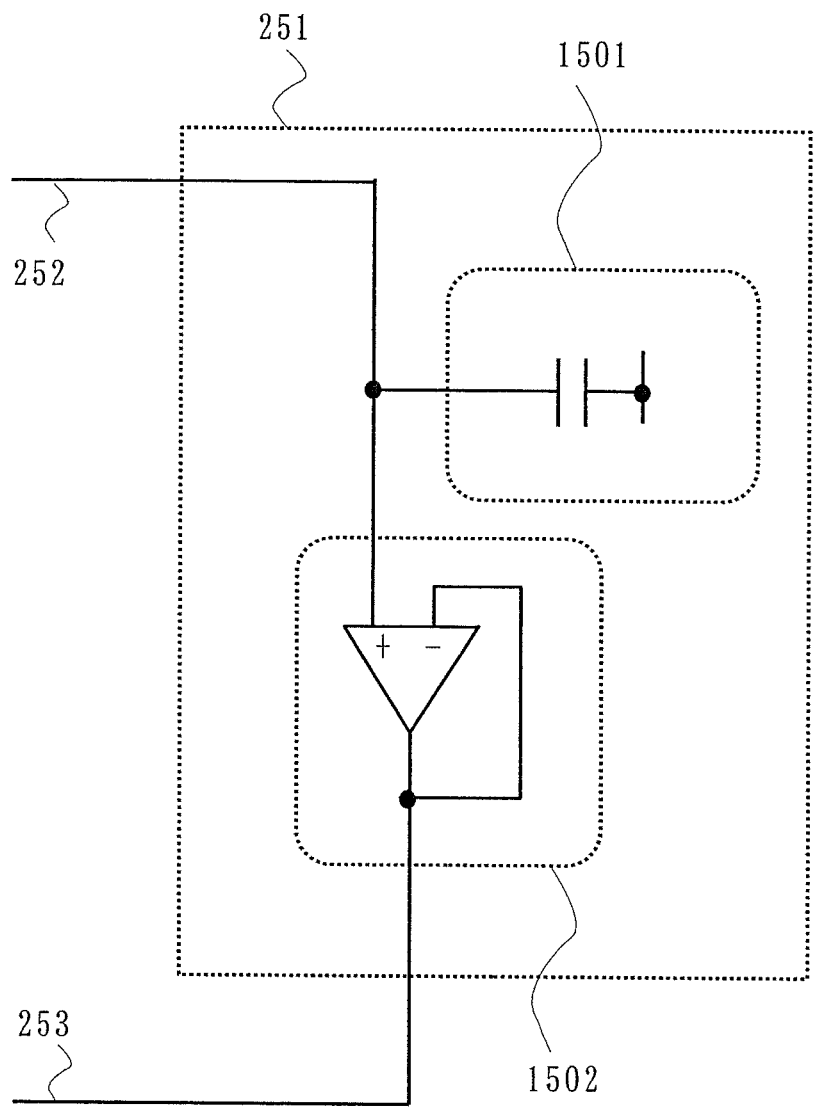
FIG. 15 is a diagram illustrating a configuration of a semiconductor device of the invention.

The voltage memory circuit 251 can adopt various configurations. The voltage memory circuit 251 has a function to be inputted a voltage and to output a voltage corresponding to the inputted voltage. Even after the input of voltage is completed, the signal corresponding to the voltage is stored, so that a voltage corresponding to an inputted voltage can be outputted. Any configuration is applicable to the voltage memory circuit 251 so long as it has the aforementioned function. One example is shown in FIG. 15. Details thereof are disclosed in Japanese Patent Application No. 2003-273765, of which contents can be combined with this application. In FIG. 15, a capacitor 1501 as an element for storing a voltage, and an amplifier circuit 1502 are provided. Note that the amplifier circuit 1502 is a circuit for outputting a potential approximately equivalent to an inputted potential and preferably a voltage follower circuit. However, it is not limited to this and any circuit can be used so long as it performs the impedance transformation. The amplifier circuit 1502 may not be provided in the case where there is no need of the impedance transformation.

Described above are circuits for supplying video signal voltage and video signal current. Hereinafter, the circuits for supplying video signal voltage and video signal current are applied to a display device. Configuration thereof and the counterparts are described below.

Figure 16:
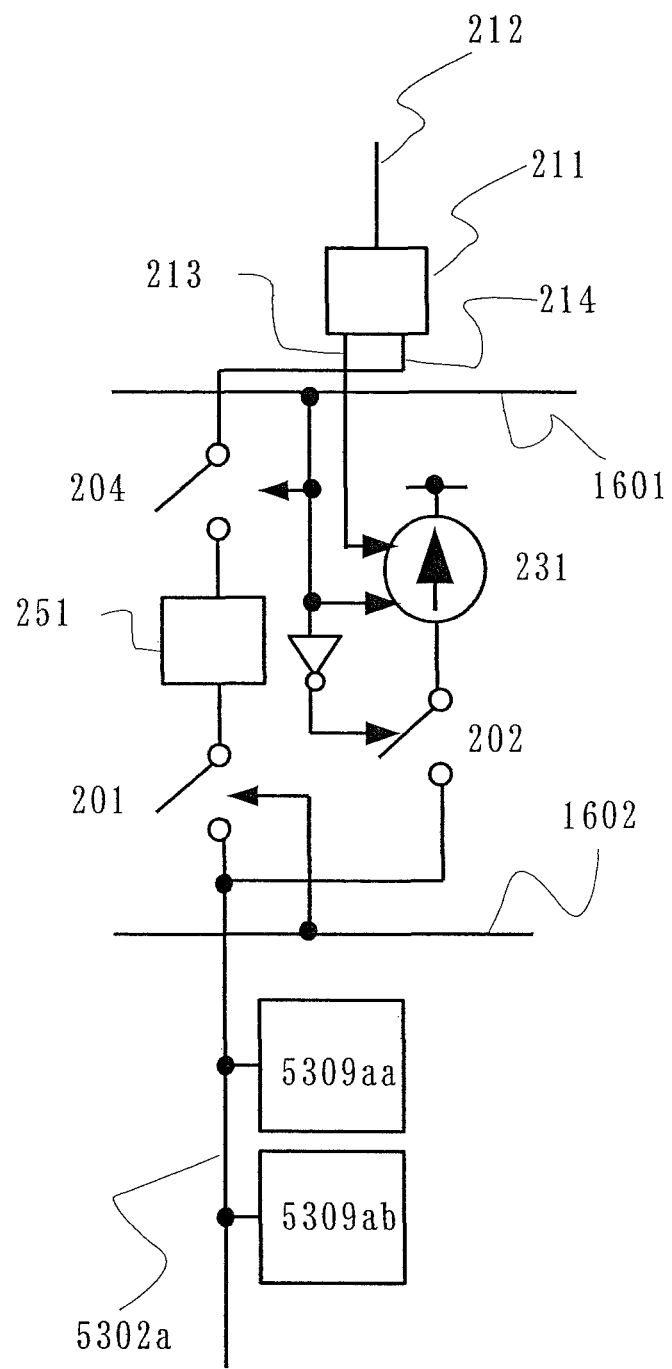
FIG. 16 is a diagram illustrating a configuration of a semiconductor device of the invention.

FIG. 16 shows a standard configuration of a display device to which the circuits for supplying video signal voltage and video signal current are applied. A plurality of pixels 5309aa and 5309ab are connected to a signal line 5302a. The signal line 5302a is connected to the voltage memory circuit 251 through the switch 201 and connected to the current memory circuit 231 through the switch 202. The voltage output terminal 214 of the circuit 211 for supplying voltage and current is connected to the voltage memory circuit 251 through the switch 204 and the current output terminal 213 thereof is connected to the current memory circuit 231. A signal is inputted from the original signal input terminal 212 of the circuit 211 for supplying voltage and current.

The configuration in FIG. 16 adopts the configuration in FIG. 4. That is, the circuit 211 for supplying voltage and current in FIG. 4 corresponds to the circuit 211 for supplying voltage and current in FIG. 16, the current memory circuit 231 in FIG. 4 corresponds to the current memory circuit 231 in FIG. 16, the voltage memory circuit 251 in FIG. 4 corresponds to the voltage memory circuit 251 in FIG. 16, and the circuit 221 to be set corresponds to the pixels 5309aa to 5309ab in FIG. 16.

Figure 17:
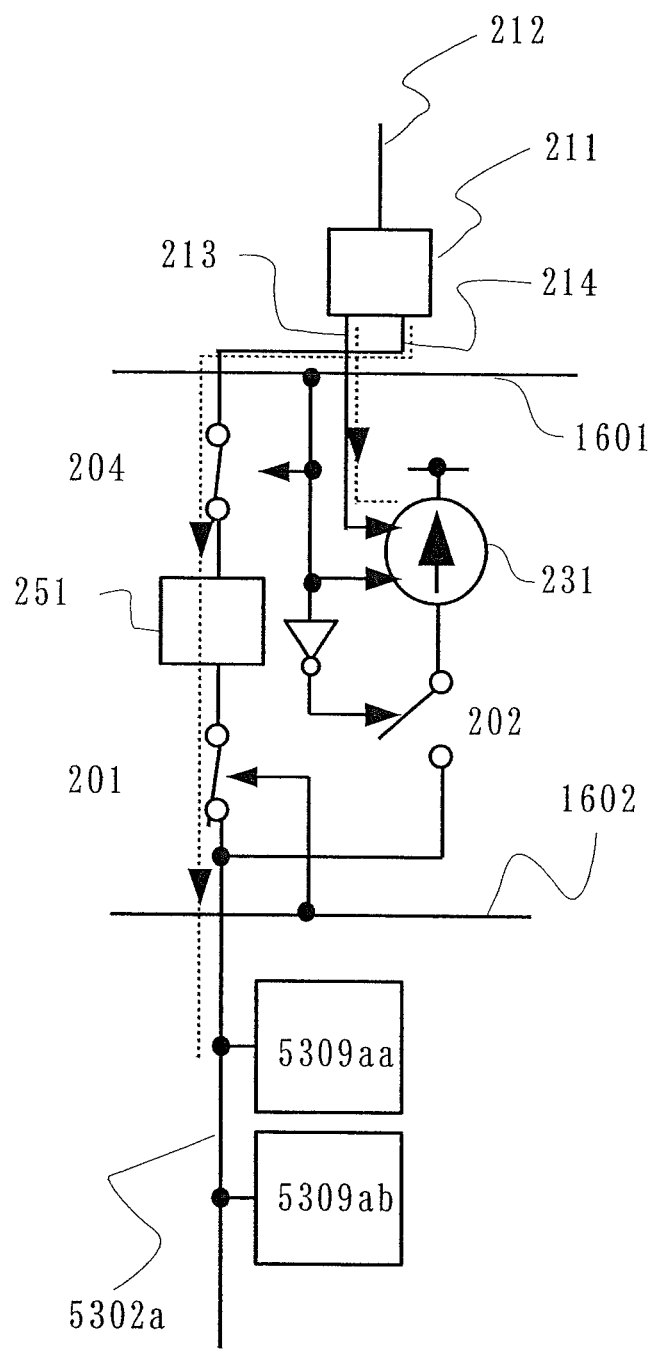
FIG. 17 is a diagram illustrating an operation of a semiconductor device of the invention.
Figure 18:
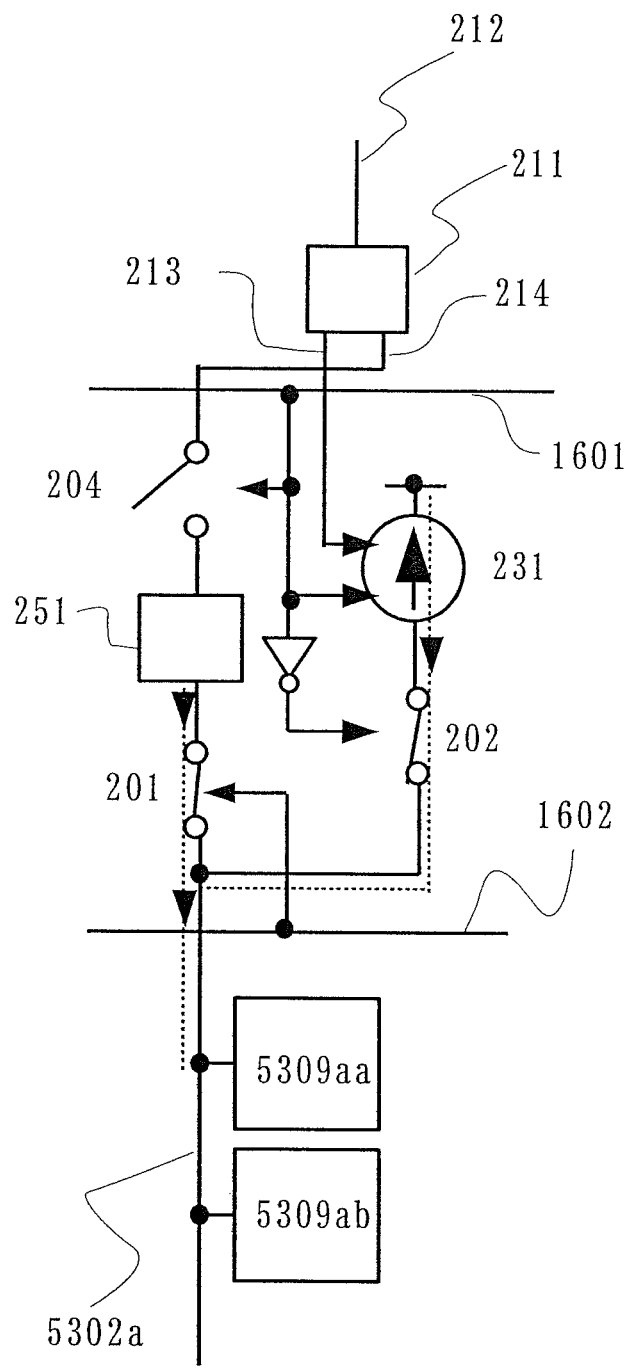
FIG. 18 is a diagram illustrating an operation of a semiconductor device of the invention.

An operating method of the display device in FIG. 16 is described next. As shown in FIG. 17, a signal is inputted from the original signal input terminal 212 and a current is supplied from the current output terminal 213 to the current memory circuit 231. At this time, a video signal voltage is supplied to the signal line 5302a and the pixels 5309aa to 5309ab through the voltage memory circuit 251. This video signal voltage is a precharge voltage.

Figure 19:
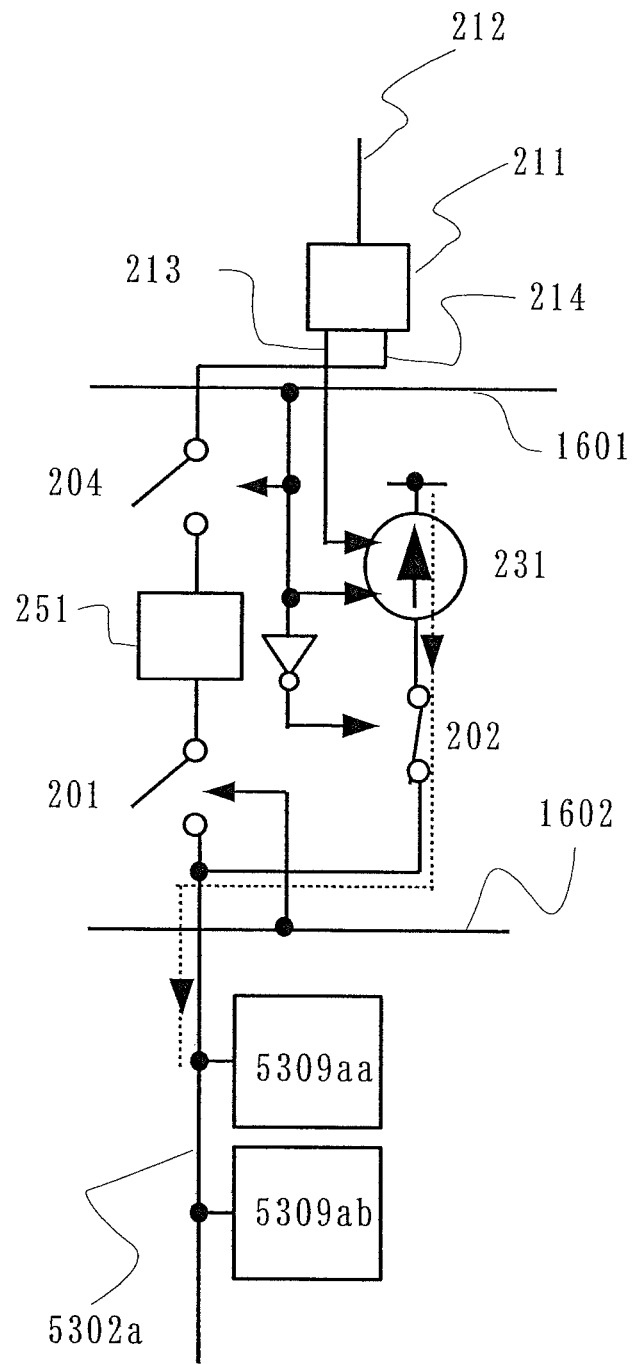
FIG. 19 is a diagram illustrating an operation of a semiconductor device of the invention.

Then, the signal supply from the circuit 211 for supplying voltage and current is stopped and a video signal current starts to be supplied from the current memory circuit 231 to the signal line 5302a, while the video signal voltage is supplied from the voltage memory circuit 251 to the signal line 5302a. Subsequently, the video signal voltage stops being supplied from the voltage memory circuit 251 while the video signal current is supplied to the signal line 5302a as shown in FIG. 19. Through the aforementioned operation, a video signal voltage is supplied and after that, a video signal current is supplied to a pixel. Consequently, a steady state can be achieved quickly and the influence of variations of transistors can thus be reduced.

Figure 20:
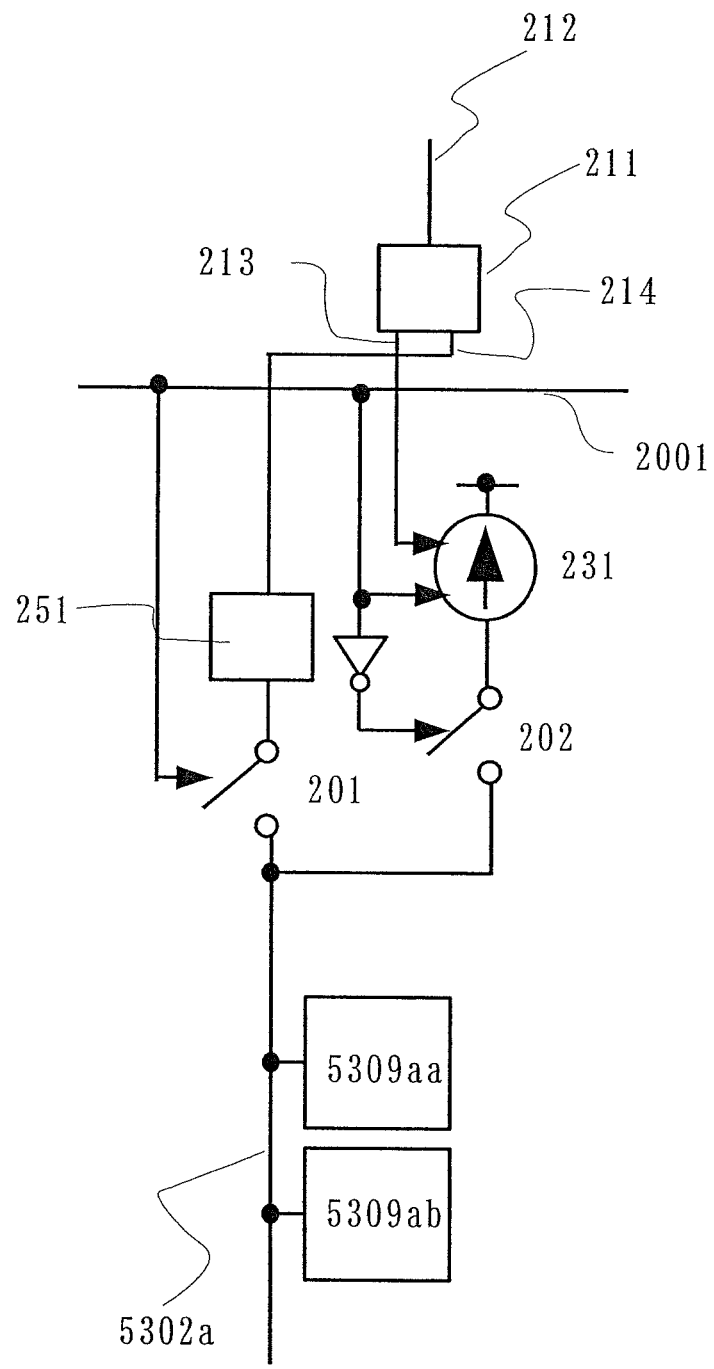
FIG. 20 is a diagram illustrating an operation of a semiconductor device of the invention.
Figure 21:
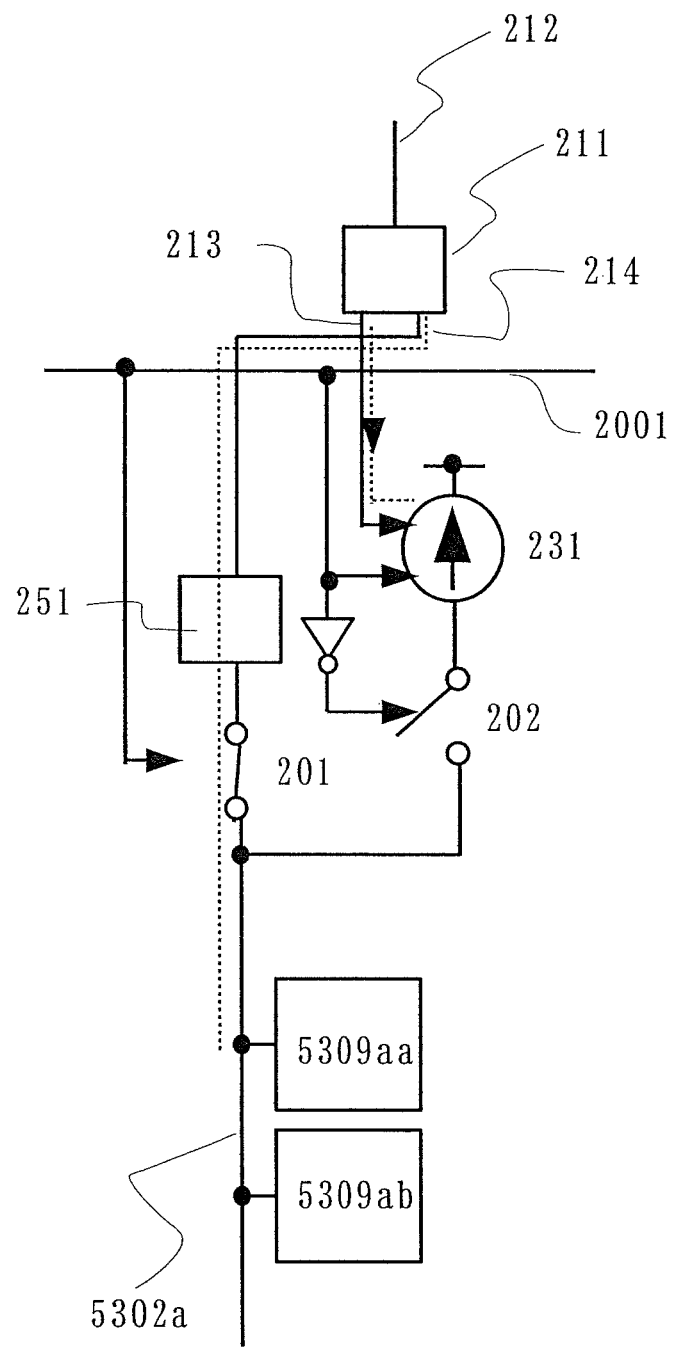
FIG. 21 is a diagram illustrating an operation of a semiconductor device of the invention.
Figure 22:
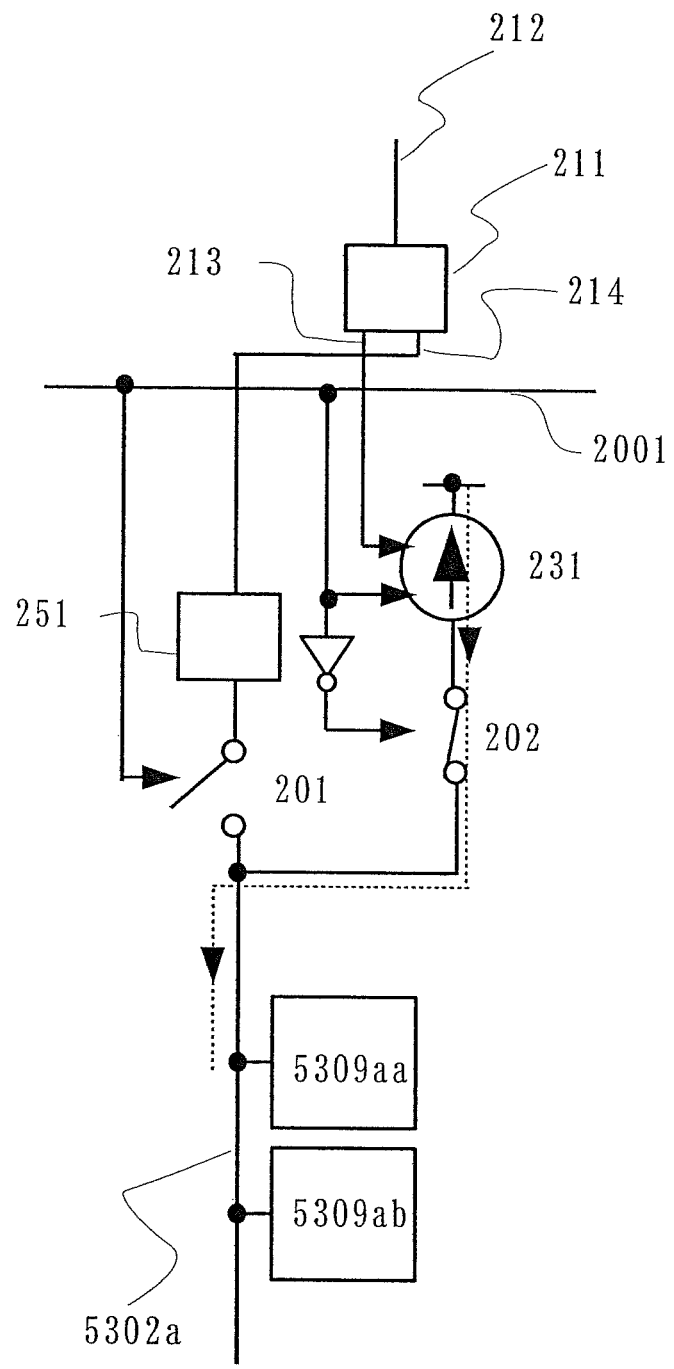
FIG. 22 is a diagram illustrating an operation of a semiconductor device of the invention.
Figure 23:
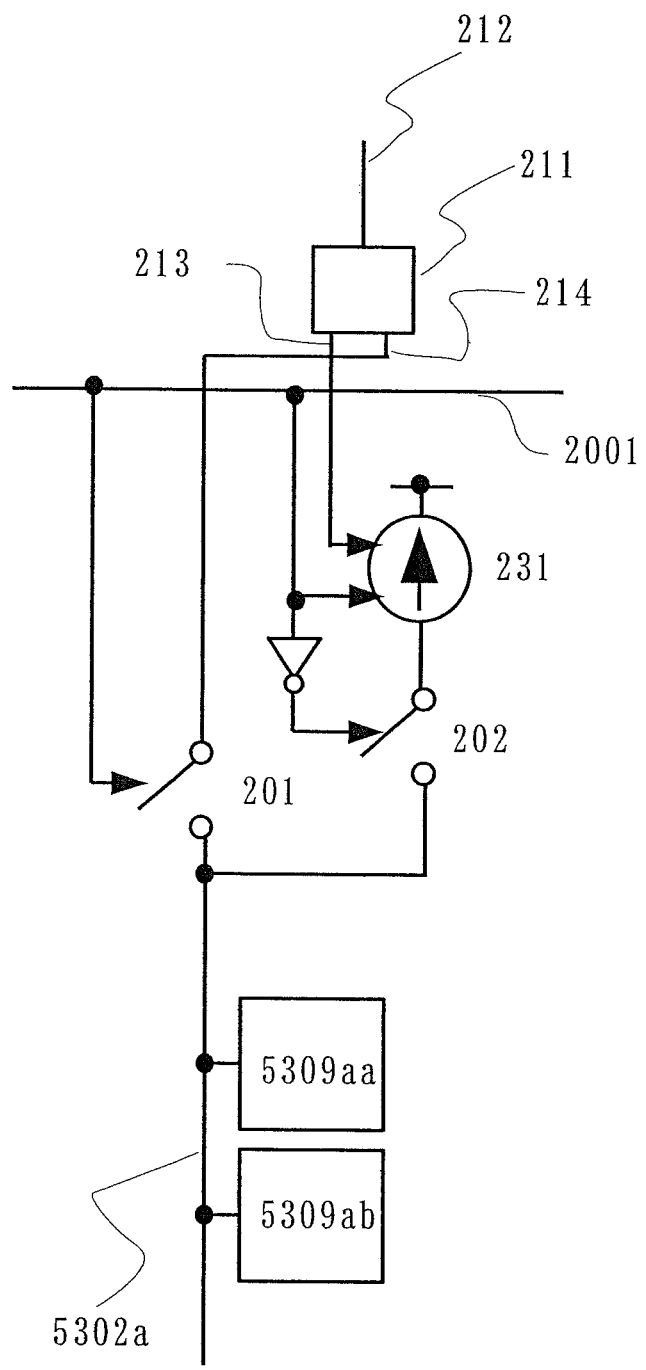
FIG. 23 is a diagram illustrating a configuration of a semiconductor device of the invention.

In FIGS. 16 to 19, wirings 1601 and 1602 control timing for supplying video signal voltage to the signal line 5302a, however, it is not limited to this. For example, in a configuration shown in FIG. 20, a video signal voltage may be supplied as shown in FIG. 21 and after that, a video signal current may be supplied as shown in FIG. 22. As a result, the number of wirings can be reduced. As the voltage memory circuit 251 is not required to store a signal voltage, only a function of supplying a signal which is large enough, namely a function of transforming the impedance is required for the voltage memory circuit 251 in this case. The voltage memory circuit 251 may not be provided in the case where enough video signal voltage is supplied from the circuit 211 for supplying voltage and current as shown in FIG. 23. In this case, the configuration in FIG. 2 is adopted. Note that reference numeral 2001 denotes a wiring in FIG. 20.

Figure 24:
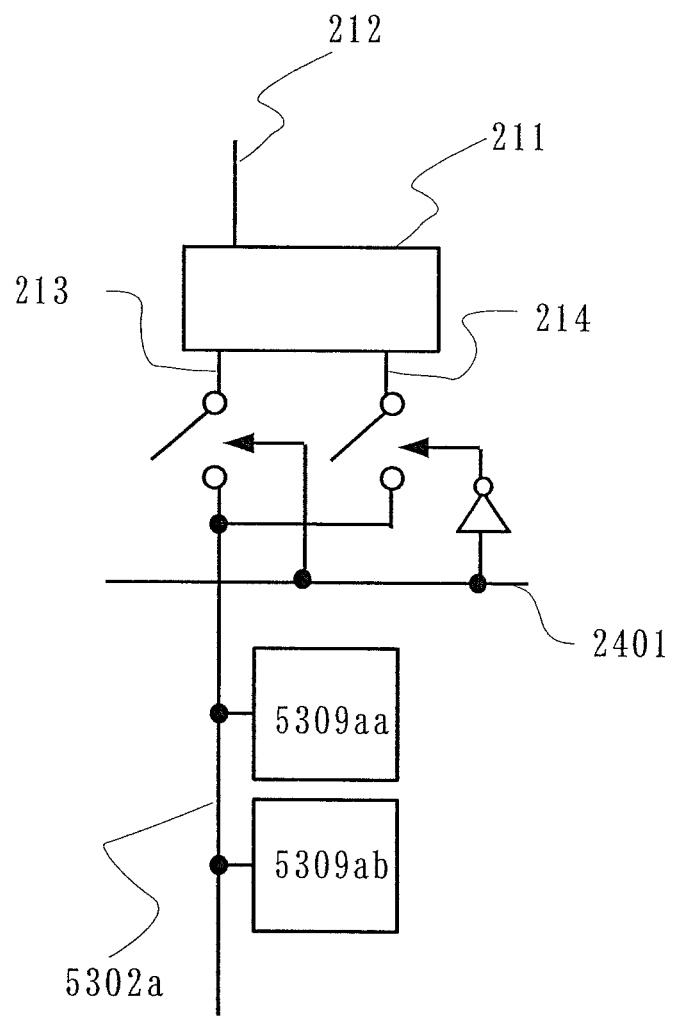
FIG. 24 is a diagram illustrating a configuration of a semiconductor device of the invention.

A configuration shown in FIG. 24 adopts the configuration in FIG. 1. The precharge is performed with a video signal voltage supplied from the circuit 211 for supplying voltage and current and after that, a video signal current is supplied. Reference numeral 2401 denotes a wiring in FIG. 24.

Figure 25:
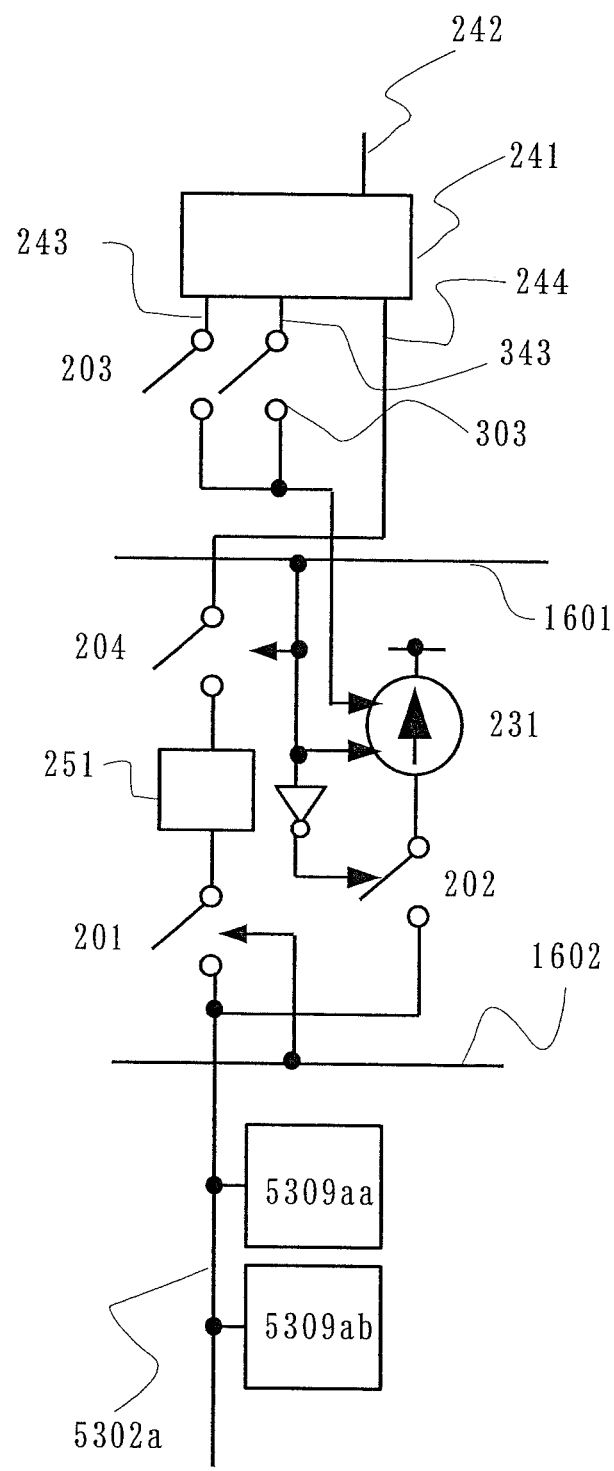
FIG. 25 is a diagram illustrating a configuration of a semiconductor device of the invention.

A configuration shown in FIG. 25 adopts the configuration in FIG. 3. In the configuration in FIG. 25, the precharge is performed with a video signal voltage supplied from the second voltage output terminal 343 even for the current supply from the circuit 241 for supplying voltage and current to the current memory circuit 231. It should be noted that the number of wirings might be reduced and the voltage memory circuit 251 may not be provided as shown in FIGS. 20 and 23.

Figure 26:
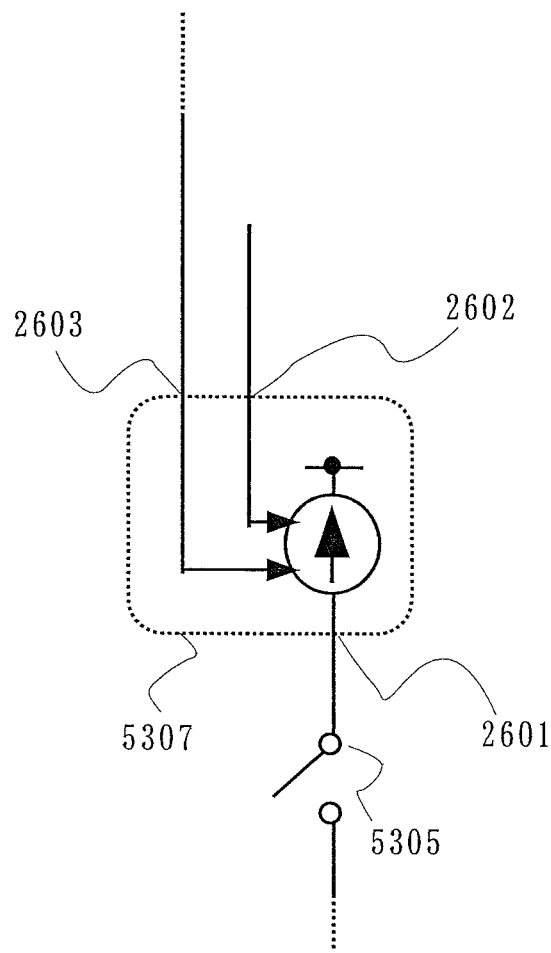
FIG. 26 is a diagram illustrating a configuration of a semiconductor device of the invention.

A configuration example of the current memory circuit 231 in FIGS. 16, 20, or the like is described below, which has the same configuration as the current memory circuit 231 shown in FIGS. 13 and 14. FIG. 26 is a view of a current source circuit in FIGS. 16 and 20. As shown in FIG. 26, a current source circuit 5307 at least comprises a current input terminal 2602, a timing control terminal 2603, and a current output terminal 2601. A switch 5305 is connected to the current output terminal 2601 here.

Figure 27:
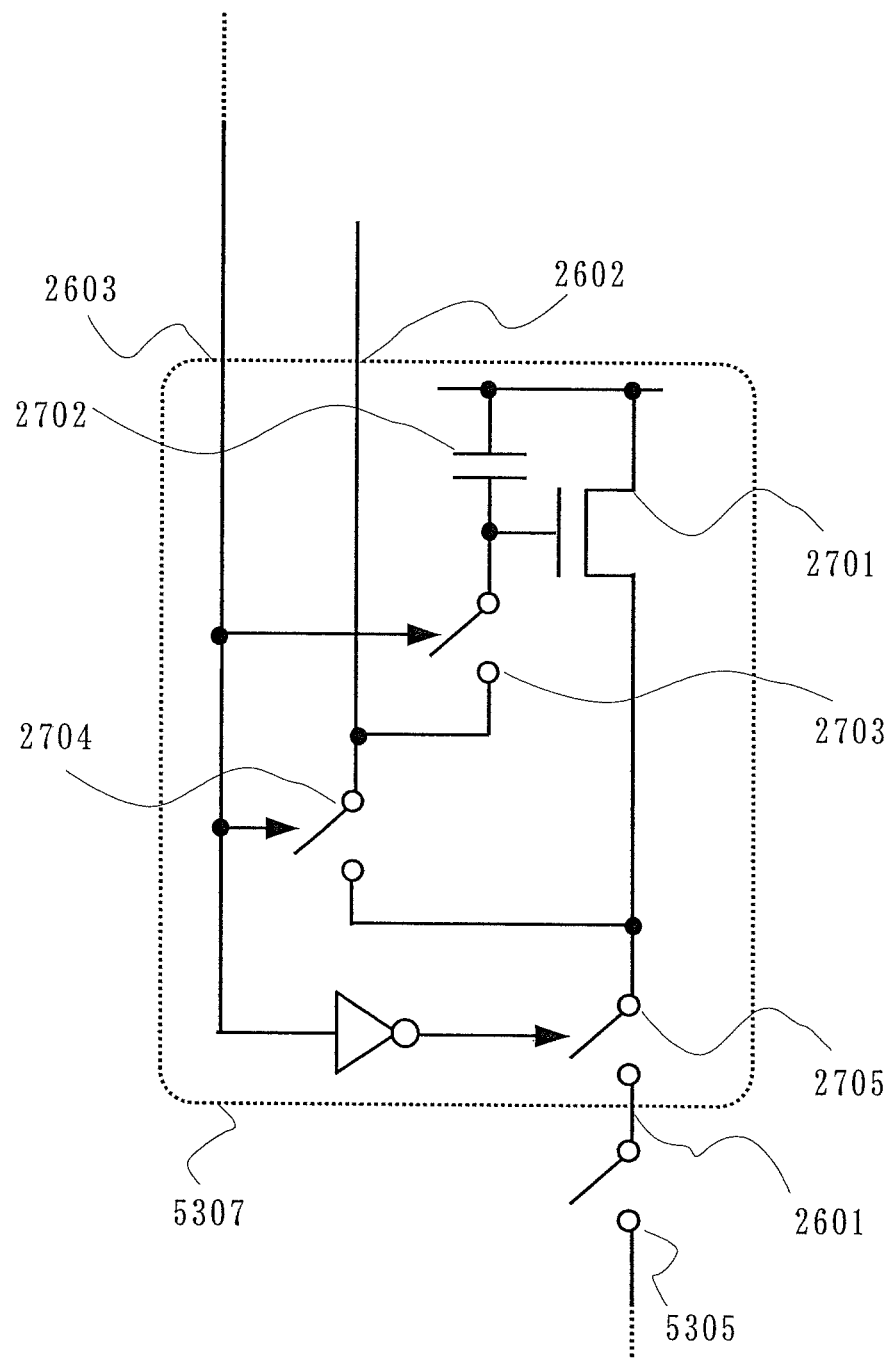
FIG. 27 is a diagram illustrating a configuration of a semiconductor device of the invention.

FIG. 27 shows the configuration example in FIG. 26 in detail. A current is inputted to a current source transistor 2701 and a storage capacitor 2702 through the current input terminal 2602 by turning ON switches 2703 and 2704 while turning OFF a switch 2705. After the input of current is completed, namely after a steady state is achieved, an appropriate voltage is stored in the storage capacitor 2702, so that the influence of variations in current characteristics of current source transistors can be reduced. Subsequently, the switches 2703 and 2704 are turned OFF and the switch 2705 is turned ON to output the current through the current output terminal 2601.

Note that in FIG. 27, the video current signal inputted to the current source circuit 5307 through the current input terminal 2602 and the video current signal outputted from the current source circuit 5307 through the current output terminal 2601 may be approximately equivalent to each other. That depends on a circuit configuration. That is, a transistor used for inputting a current through the current input terminal 2602 and a transistor used for outputting the current through the current output terminal 2601 are the same, and therefore, both the currents are approximately equivalent to each other.

Figure 28:
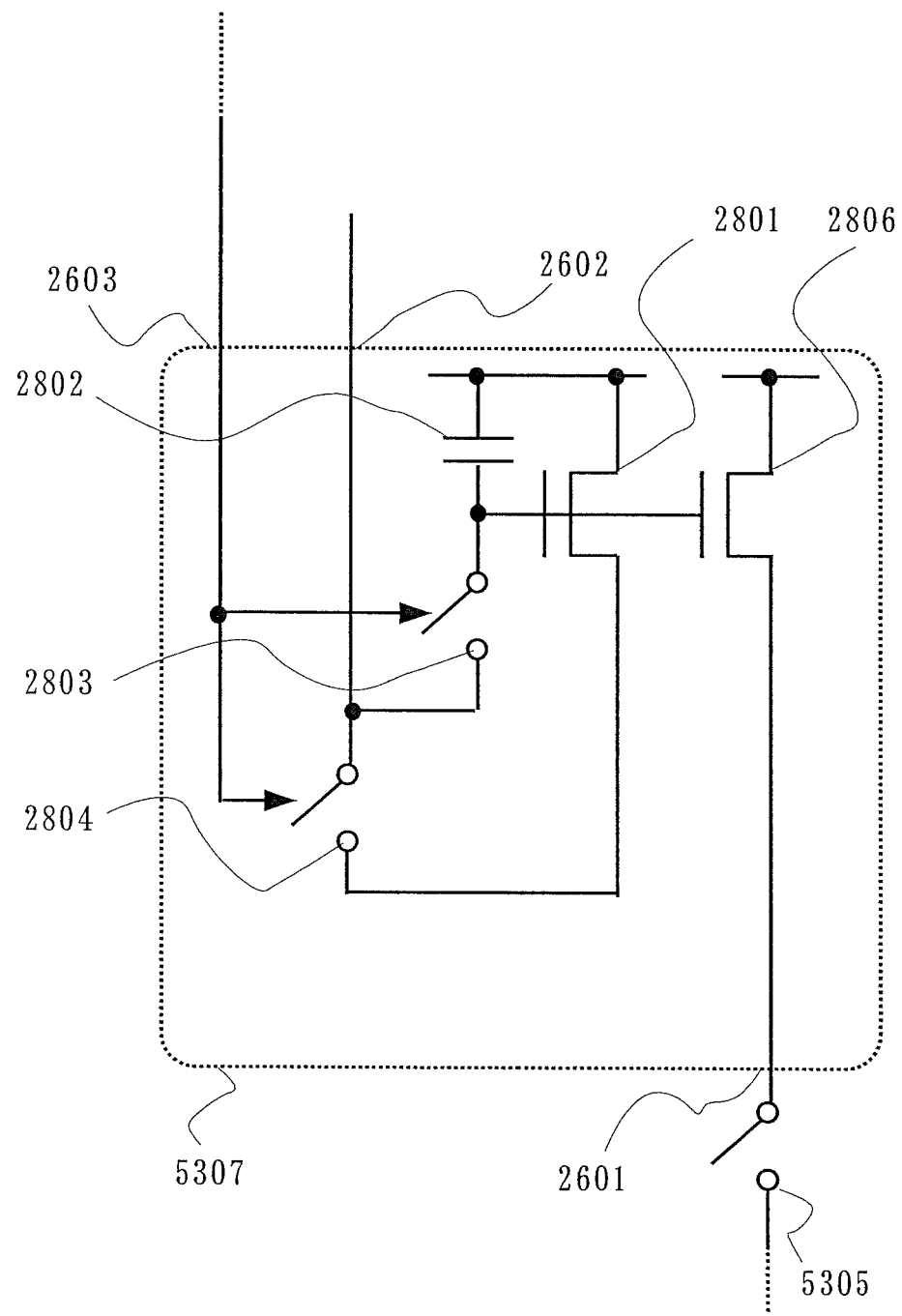
FIG. 28 is a diagram illustrating a configuration of a semiconductor device of the invention.

Thus, by adopting a configuration shown in FIG. 28 comprising a current source transistor 2801 and a mirror transistor 2806 whose ratios of the channel width W to the channel length L are different from each other, both the currents become different from each other. In this case, the video current signal inputted to the current source circuit 5307 through the current input terminal 2602 and the video current signal outputted from the current source circuit 5307 through the current output terminal 2601 are proportionate to each other. In FIG. 28, reference numeral 2802 denotes a capacitor, 2803 and 2804 denote switches.

Figure 29:
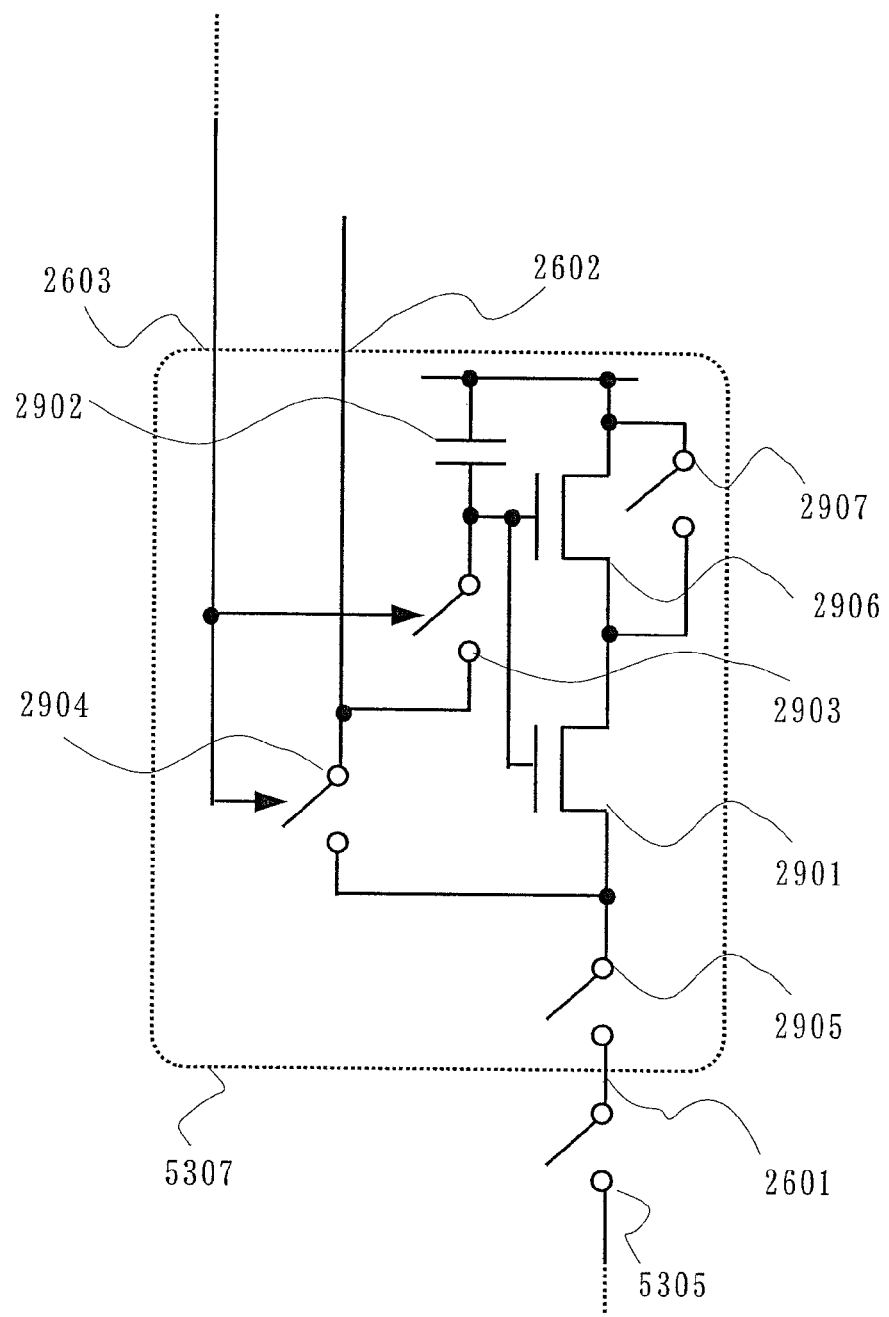
FIG. 29 is a diagram illustrating a configuration of a semiconductor device of the invention.

In a configuration shown in FIG. 29, a switch 2907 can control the operation of a current source transistor 2901 and a multi transistor 2906 to operate as a multi-gate transistor. The video current signal inputted to the current source circuit 5307 through the current input terminal 2602 and the video current signal outputted from the current source circuit 5307 through the current output terminal 2601 are proportionate, or approximately equivalent to each other based on a timing of ON/OFF of the switch 2907. Note that reference numeral 2902 denotes a capacitor, and 2903 to 2905 denote switches in FIG. 29.

Operations of the current source circuit as shown in FIG. 29 are described in Japanese Patent Application No. 2002-380252 and Japanese Patent Application No. 2003-055018, which is hereby incorporated in references. The contents of the references can be combined with this application.

A current through the current input terminal 2602 and a current through the current output terminal 2601 both flow toward the current source circuit in FIGS. 27 to 29, however, it is not limited to this. The current through the current input terminal 2602 and the current through the current output terminal 2601 may flow in the opposite direction to each other.

Figure 30:
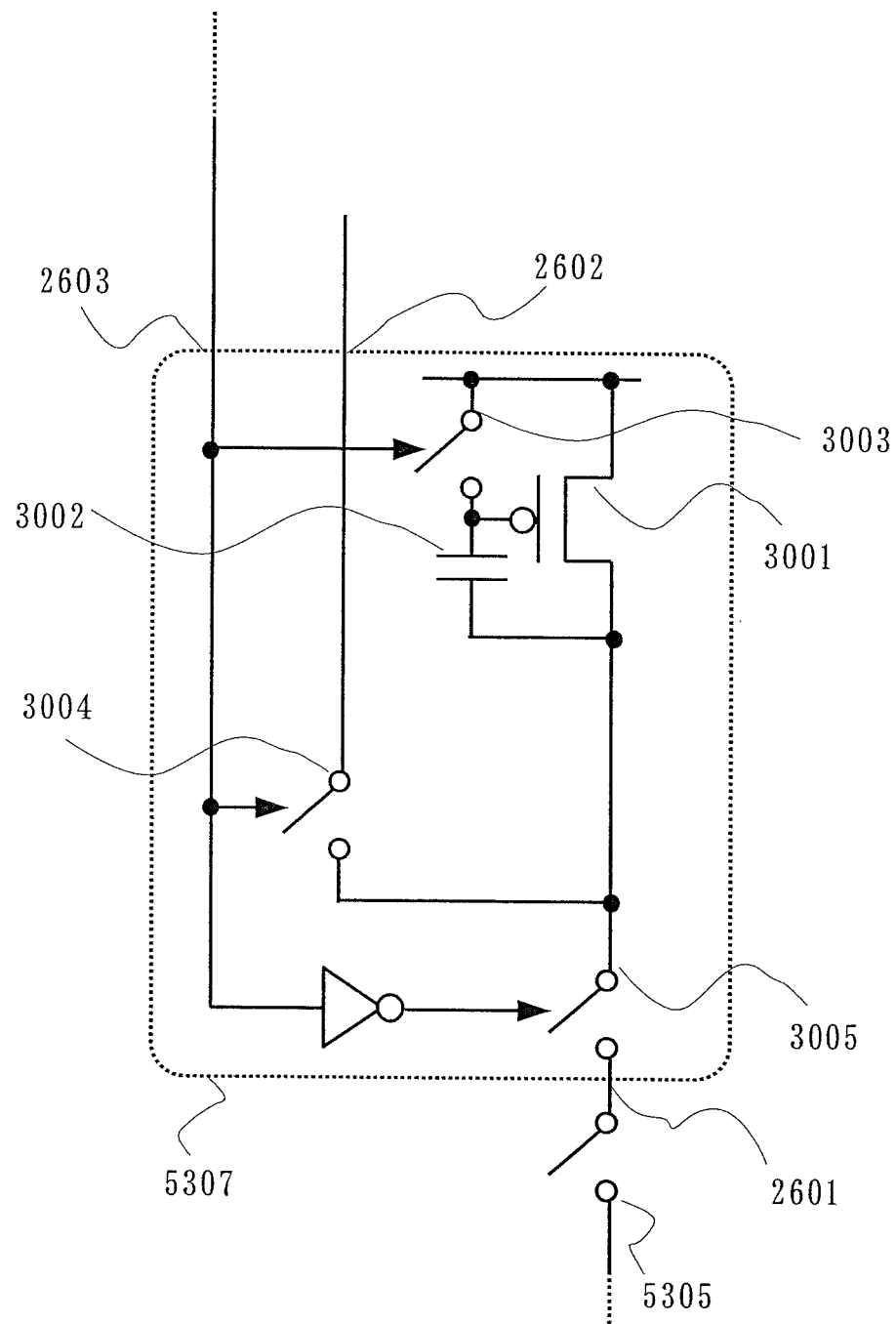
FIG. 30 is a diagram illustrating a configuration of a semiconductor device of the invention.

A conductivity type of the current source transistor is an N-channel type in FIGS. 27 to 29; however, it is not limited to this. For example, FIG. 30 shows a configuration that comprises the current source transistor of a P-channel type and adopts the configuration in FIG. 27. In the configurations in FIGS. 28 and 29, the conductivity type of the current source transistor can be changed as well based on the same concept.

A current flows toward the current source circuit in FIGS. 27 to 30; however, it is not limited to this. The current source circuit can be easily modified even in the case where the current direction is changed. For example, The connections in the circuit is not required to be changed even in the case where the direction of current flow is changed by reversing the conductivity type of the current source transistor to the opposite. In FIG. 30, reference numeral 3001 denotes a transistor, 3002 denotes a capacitor, and 3003 to 3005 denote switches.

The current source circuits of various configurations are shown heretofore, however, it is not limited to them. As for the standard configuration, the number of current source transistors, the conductivity type thereof, the arrangement thereof, the direction of current flow, or the like, another configuration obtained by combining each component or the concept of each component can be applied. In short, an arbitrary configuration can be applied so long as it functions as a current source circuit.

In addition, the arrangement or the number of switches for each portion, or the connection corresponding to them can be easily modified. The arrangement and the number of switches are not exclusively limited so long as the switches operate normally. For example, a plurality of switches may be integrated into one, or the number of switches may be increased or decreased by changing the connection.

Configurations of the current source circuit are described in PCT International Publications for Patent Applications Nos. WO03/038793, WO03/038794, WO03/038795, WO03/038796, and WO03/038797, which is hereby incorporated by references. The contents of the references can be applied to the invention or can be combined with the invention.

Embodiment Mode 2

In Embodiment Mode 1, the case of connecting circuits to one signal line, that is, the case for one column is described. In the case of disposing a plurality of columns, pixels are disposed in a two-dimensional manner and a plurality of circuits 211 for supplying voltage and current are provided as well.

In the case where a plurality of the circuits 211 for supplying voltage and current are provided, it is necessary to supply a signal to the original signal input terminal 212 of each circuit 211 for supplying voltage and current. Described below is a driver circuit for controlling the signal supply to the original signal input terminal 212 of each circuit 211 for supplying voltage and current.

Figure 31:
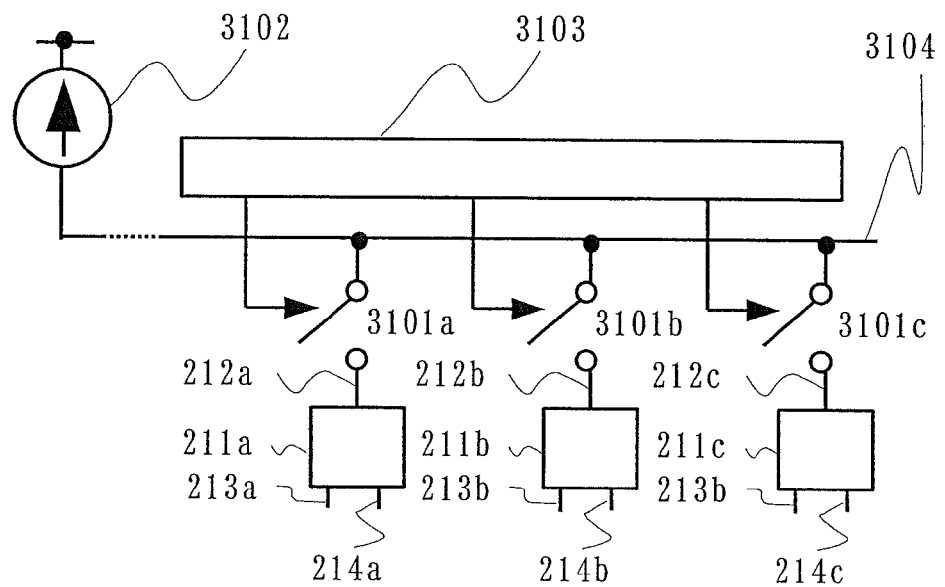
FIG. 31 is a diagram illustrating a configuration of a semiconductor device of the invention.

FIG. 31 shows the most standard driver circuit. Described here is the case where the circuits for supplying voltage and current for three columns are provide for simplicity. The circuits 211a to 211c for supplying voltage and current are connected to an original signal supply line 3104 through switches 3101a to 3101c, respectively. A driver circuit 3103 selects the switches 3101a to 3101c in sequence. Correspondingly, a video signal supplied from an original signal current source circuit 3102 is supplied to the circuits 211a to 211c for supplying voltage and current in sequence.

However, in this case, after the switch is selected and a video signal is supplied from the original signal current source circuit 3102 to one circuit for supplying voltage and current, the video signal is subsequently supplied to another circuit for supplying voltage and current. In view of this, the circuits 211a to 211c for supplying voltage and current are required to keep supplying a video signal current and a video signal voltage from current output terminals 213a to 213c and voltage output terminals 214a to 214c respectively even after each signal supply to original signal input terminals 212a to 212c is stopped. For this purpose, a function of storing a signal is required for each of the circuits 211a to 211c for supplying voltage and current.

Figure 32:
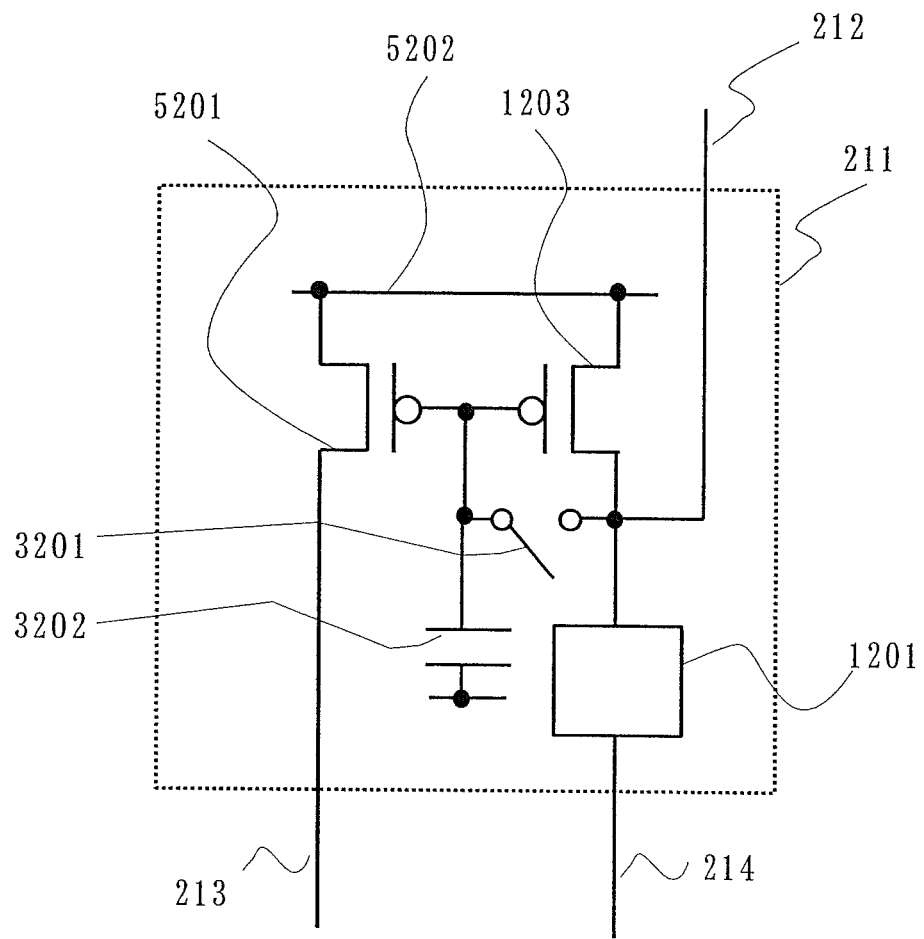
FIG. 32 is a diagram illustrating a configuration of a semiconductor device of the invention.

An example of a circuit for supplying voltage and current having a function of storing a signal is shown. FIG. 32 shows a configuration in which a signal memory function is additionally provided in the circuit for supplying voltage and current in FIG. 12. In FIG. 32, a capacitor 3202 is provided additionally and a switch 3201 prevents the leakage of signals held in the capacitor 3202.

Figure 33:
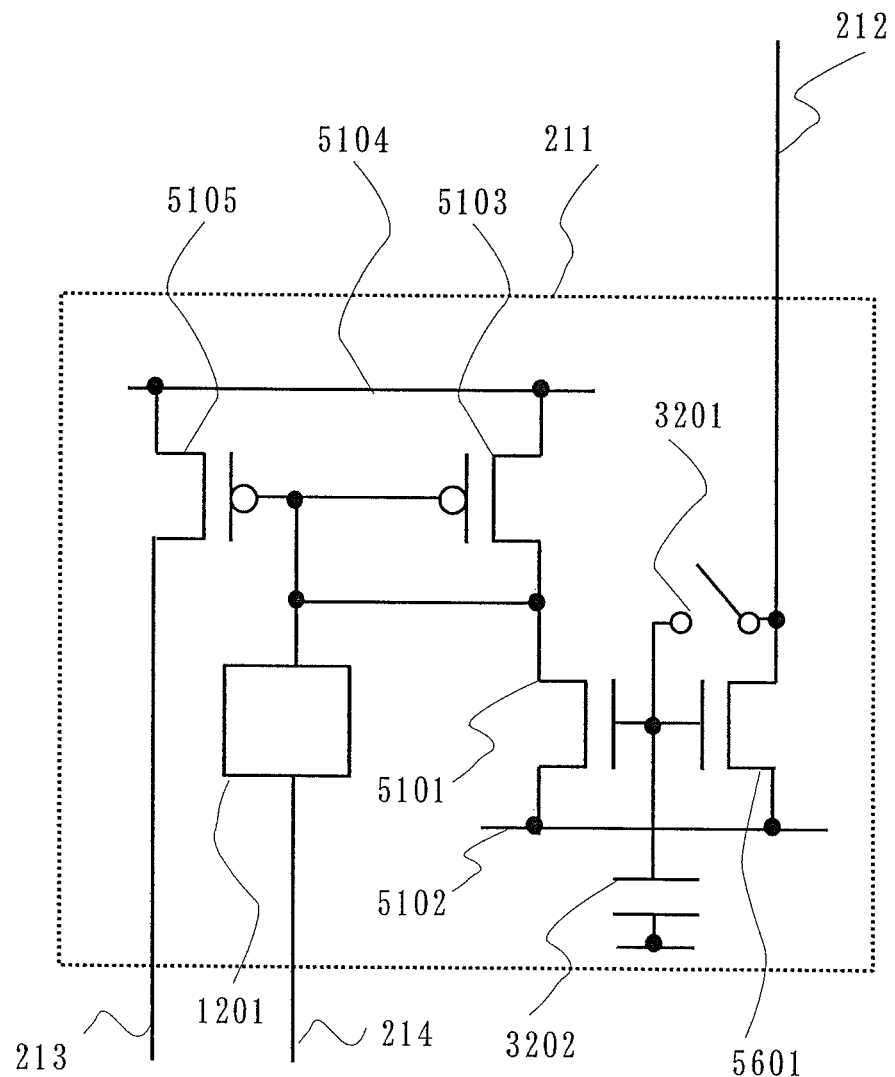
FIG. 33 is a diagram illustrating a configuration of a semiconductor device of the invention.
Figure 34:
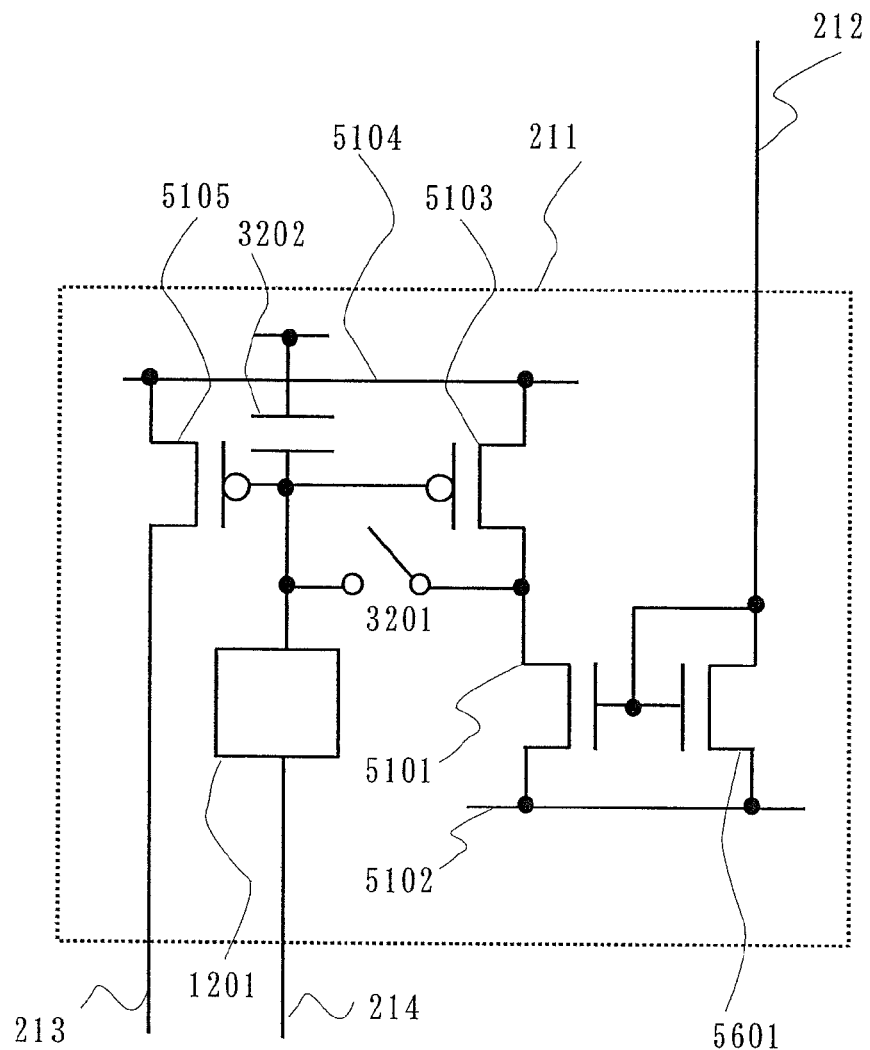
FIG. 34 is a diagram illustrating a configuration of a semiconductor device of the invention.
Figure 35:
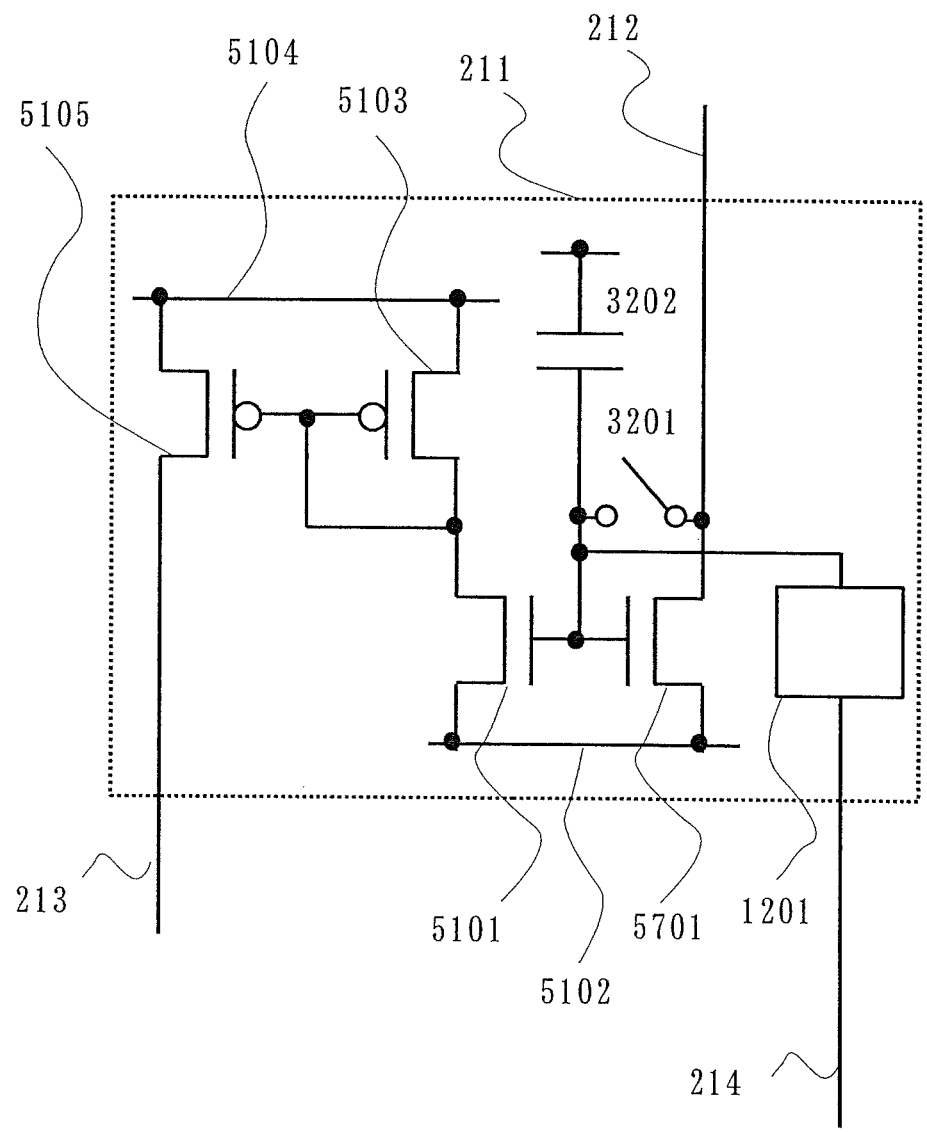
FIG. 35 is a diagram illustrating a configuration of a semiconductor device of the invention.
Figure 36:
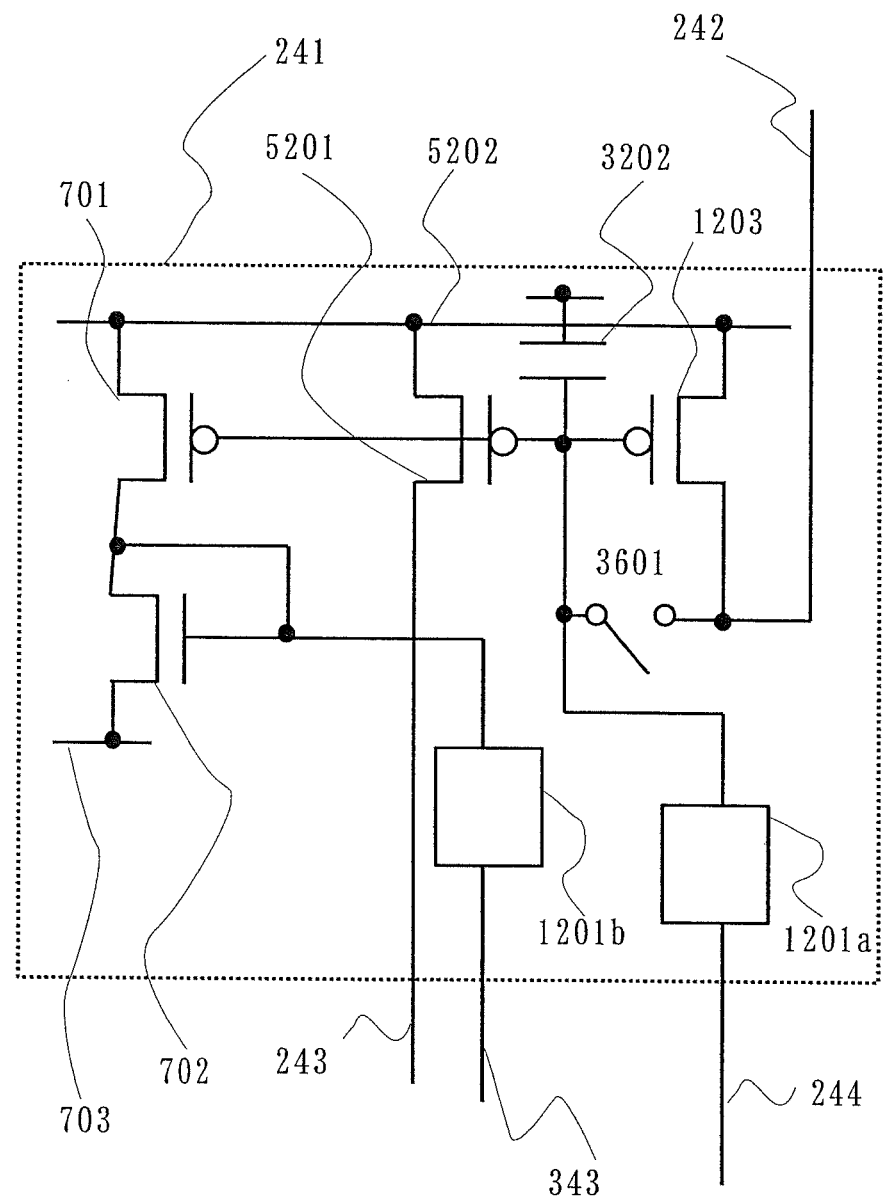
FIG. 36 is a diagram illustrating a configuration of a semiconductor device of the invention.
Figure 37:
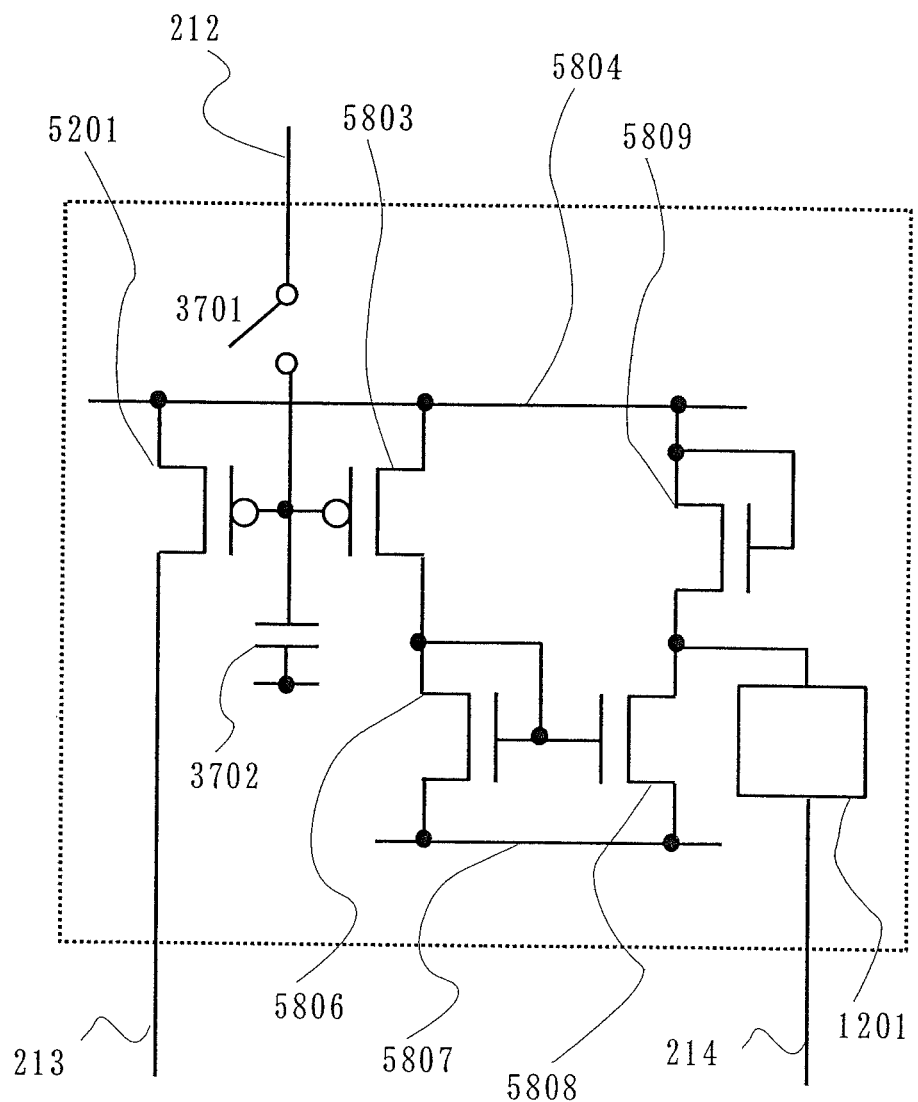
FIG. 37 is a diagram illustrating a configuration of a semiconductor device of the invention.
Figure 38:
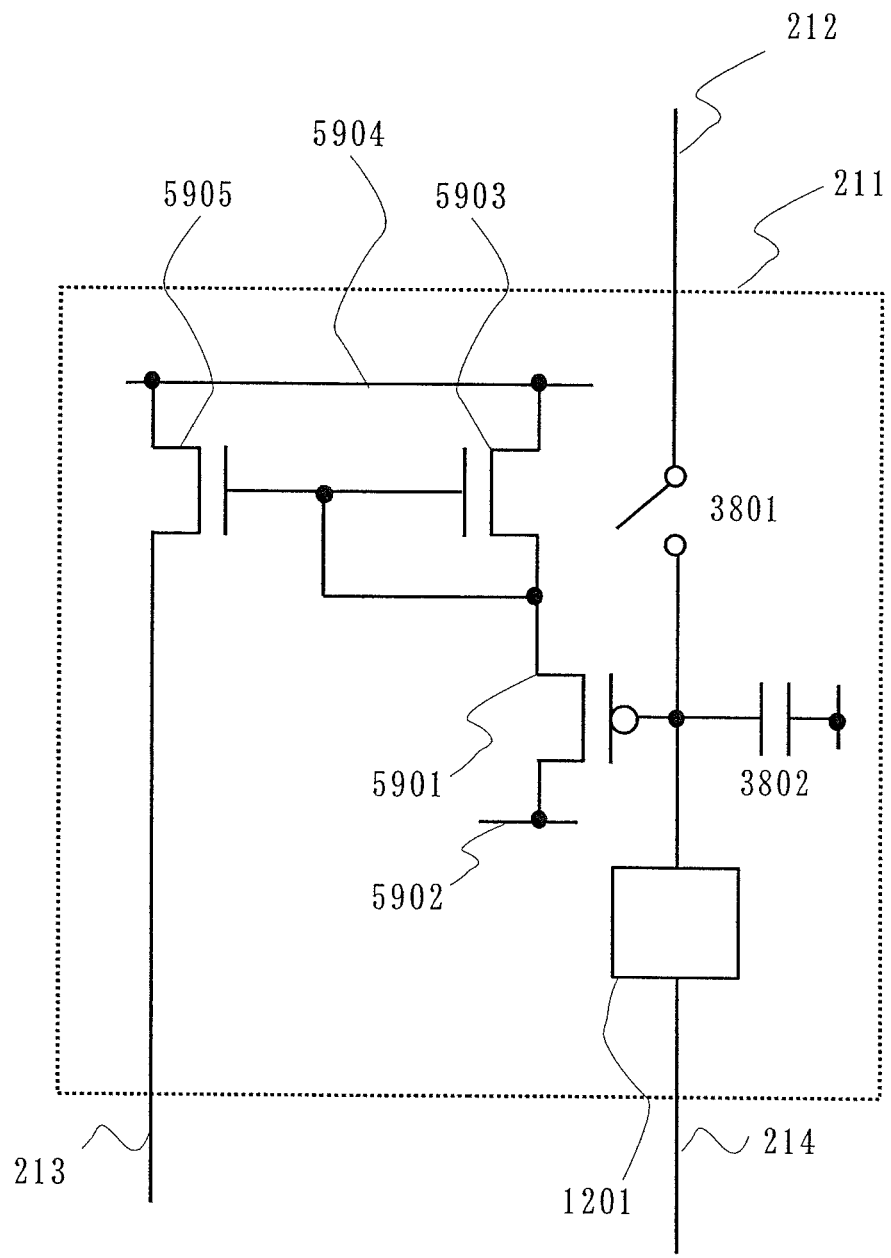
FIG. 38 is a diagram illustrating a configuration of a semiconductor device of the invention.
Figure 39:
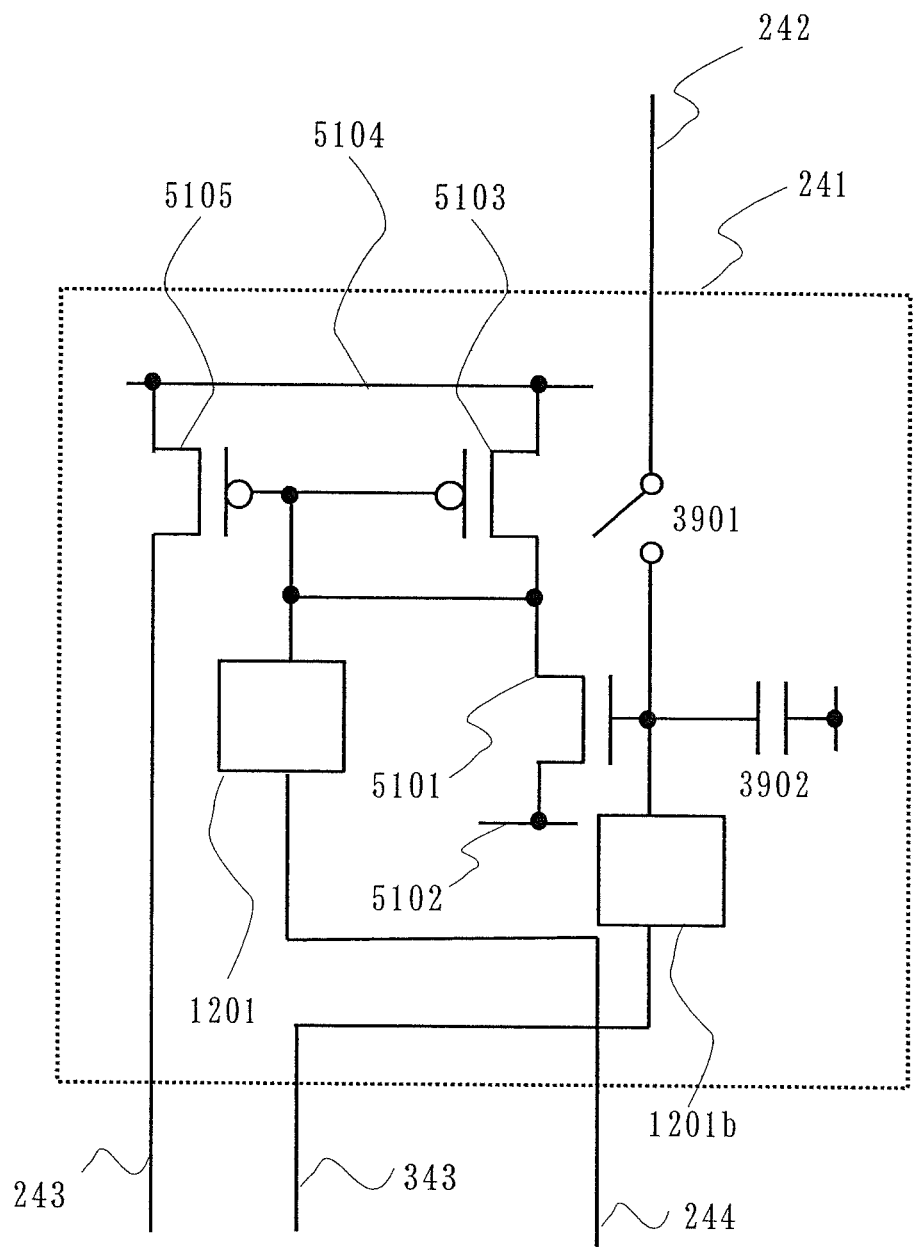
FIG. 39 is a diagram illustrating a configuration of a semiconductor device of the invention.

Similarly, FIGS. 33 to 39 show configurations in which a signal memory function is additionally provided in the circuit for supplying voltage and current. In FIG. 33, reference numeral 5601 denotes a transistor. In FIG. 35, reference numeral 5701 denotes a transistor, which is connected to the transistor 5101 via the wiring 5102. In FIG. 36, reference numerals 701 and 702 denote transistors, 703 denotes a wiring which is connected to the transistor 702, 1201a and 1201b denote amplifier circuits, and 3601 denotes a switch. In FIG. 37, reference numeral 3701 denotes a switch, 3702 denotes a capacitor, 5803, 5806, 5808, and 5809 denote transistors, and 5804 and 5807 denote wirings. In FIG. 38, reference numeral 3801 denotes a switch, 3802 denotes a capacitor, 5901, 5903, and 5905 denote transistors, and 5902 and 5904 denote wirings. In FIG. 39, reference numeral 3901 denotes a switch, and 3902 denotes a capacitor.

A circuit for supplying voltage and current is configured so that a switch for keeping a memory state or memory means such as a capacitor is disposed so as to keep supplying a video signal current and a video signal voltage from the current output terminal 213 and from the voltage output terminal 214, respectively.

It should be noted that the gate capacitance of a transistor might be used instead of a capacitor and the like.

Figure 40:
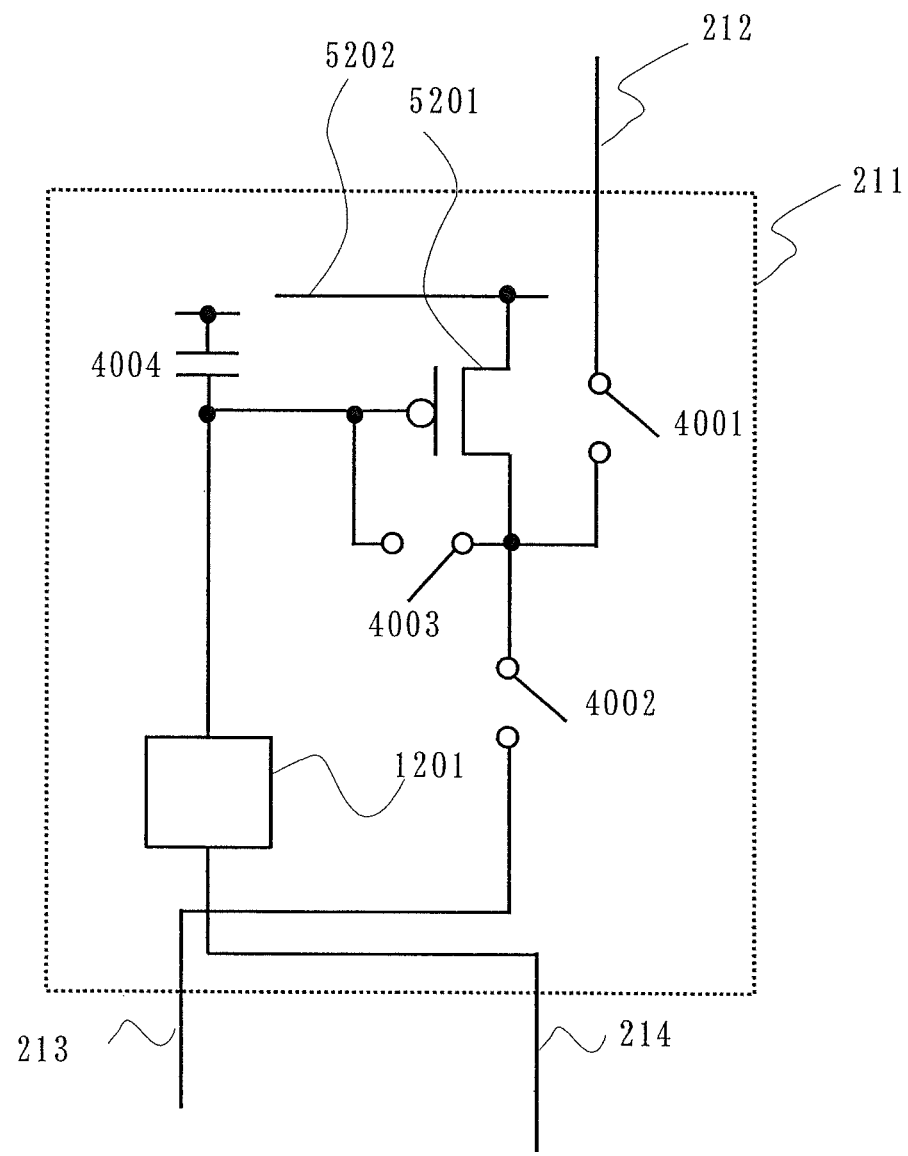
FIG. 40 is a diagram illustrating a configuration of a semiconductor device of the invention.

As for a circuit for supplying voltage and current having a function of storing a signal, another configuration can be applied in the case where there is no need of outputting a signal from a current output terminal and a voltage output terminal during a signal input from an original signal input terminal. An example thereof is shown in FIG. 40. When a signal is inputted from the original signal input terminal 212, switches 4001 and 4003 are turned ON while a switch 4002 is turned OFF. Then, a signal is held in a capacitor 4004. When a current is outputted from the current output terminal 213, the switches 4001 and 4003 are turned OFF while the switch 4002 is turned ON.

A transistor 5201 used for inputting a signal through the original signal input terminal 212 and a transistor used for outputting the signal through the current output terminal 213 are the same, and therefore, both the currents are approximately equivalent to each other in this manner. Consequently, the influence of characteristic variations of transistors can be eliminated.

Figure 41:
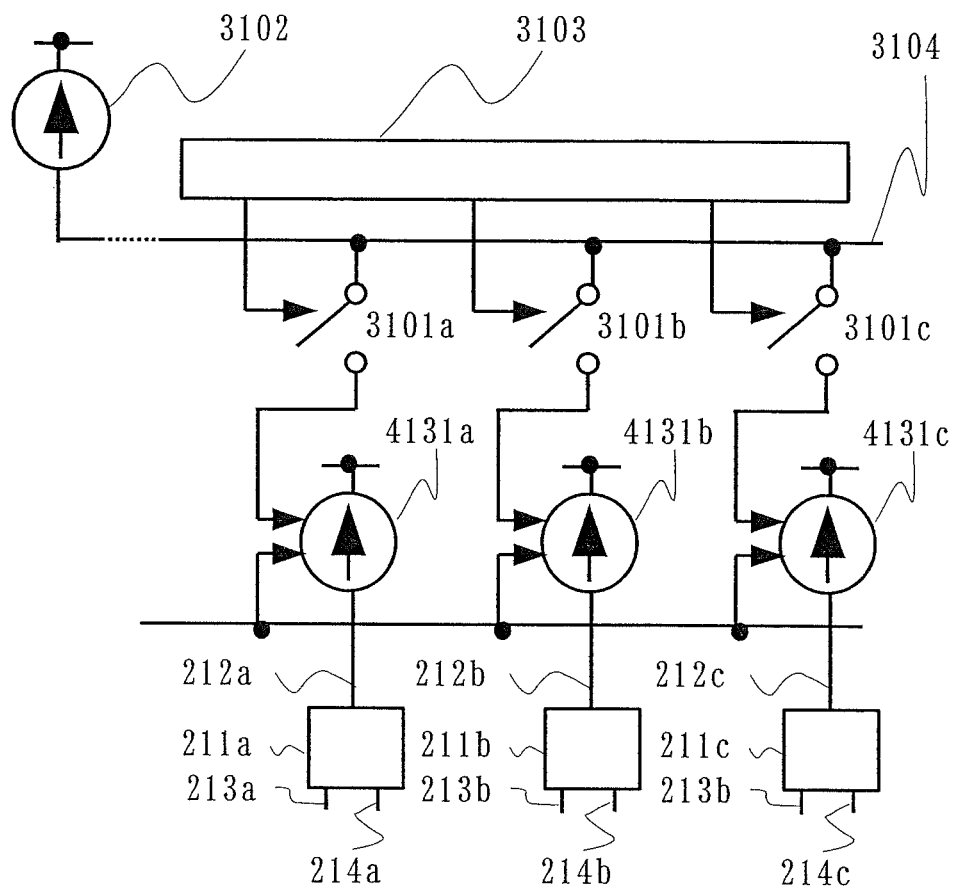
FIG. 41 is a diagram illustrating a configuration of a semiconductor device of the invention.

As for a circuit for supplying voltage and current not having a signal memory function, a configuration shown in FIG. 41 may be applied. That is, during a signal output by the circuit for supplying voltage and current, a signal input is required continuing by a circuit having a signal memory circuit. Accordingly, during a signal is supplied from the original signal current source circuit 3102 to current source circuits 4131a to 4131c in sequence, the signal previously supplied and stored continues to be supplied to the circuits 211a to 211c for supplying voltage and current.

Figure 42:
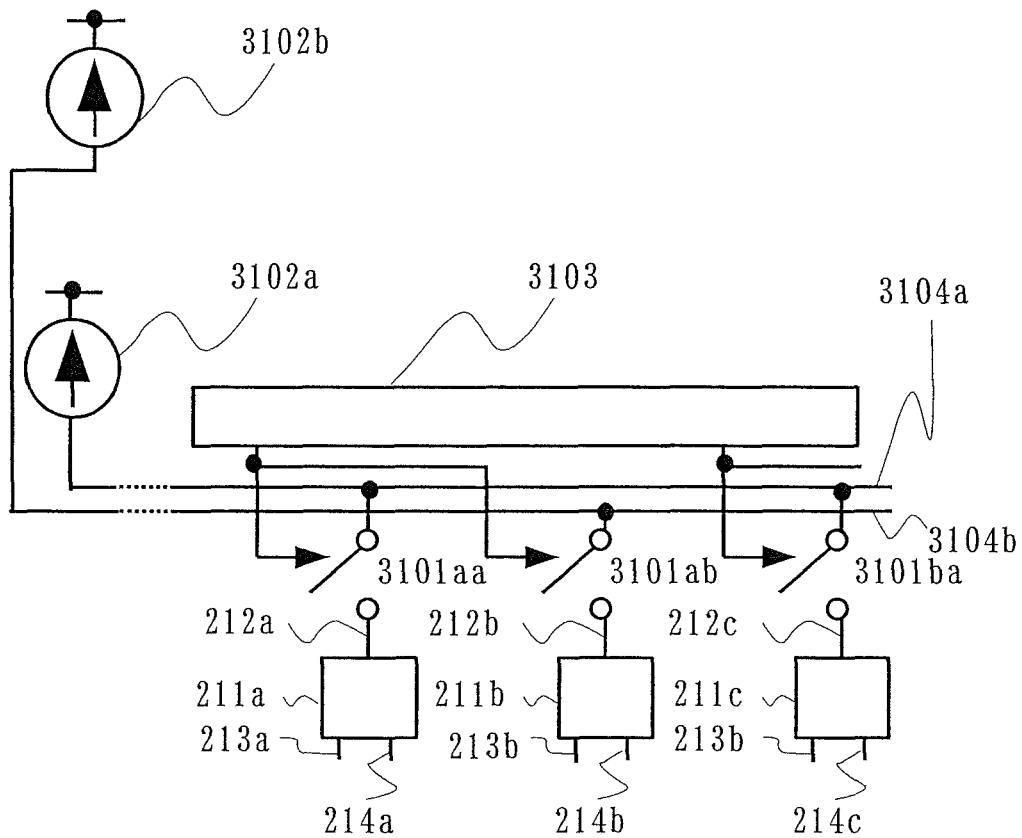
FIG. 42 is a diagram illustrating a configuration of a semiconductor device of the invention.

Note that a configuration of the driver circuit is not limited to the one shown in FIG. 31. For example, as shown in FIG. 42, a plurality of original signal current sources 3102a and 3102b may be connected to original signal supply lines 3104a and 3104b and a signal may be inputted to a plurality of columns of the circuits 211a to 211c for supplying voltage and current through switches 3101aa, 3101ab, and 3101ba, respectively.

Figure 43:
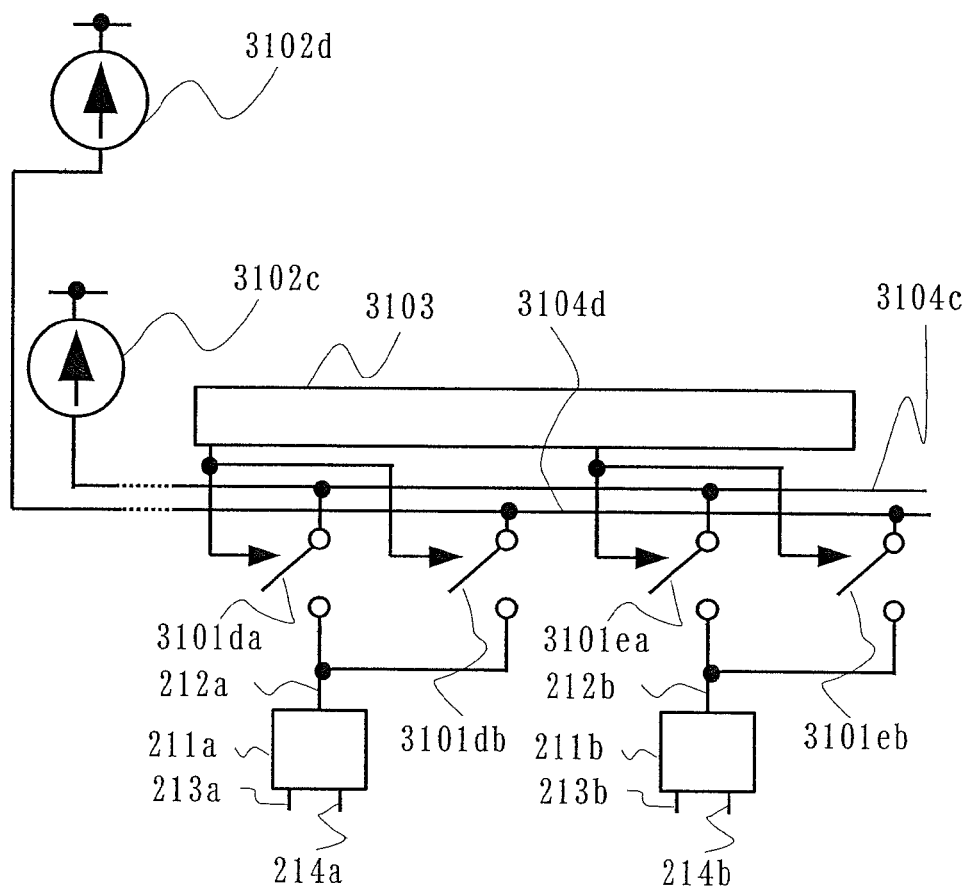
FIG. 43 is a diagram illustrating a configuration of a semiconductor device of the invention.

Alternatively, as shown in FIG. 43, a plurality of original signal current sources 3102c and 3102d may be connected to original signal supply lines 3104c and 3104d, the current obtained by adding a current from the switch 3101da and a current from the switch 3101db may be inputted to the circuit 214a for supplying voltage and current, and the current obtained by adding a current from the switch 3101ea and a current from the switch 3101eb may be inputted to the circuit 214b for supplying voltage and current.

Figure 44:
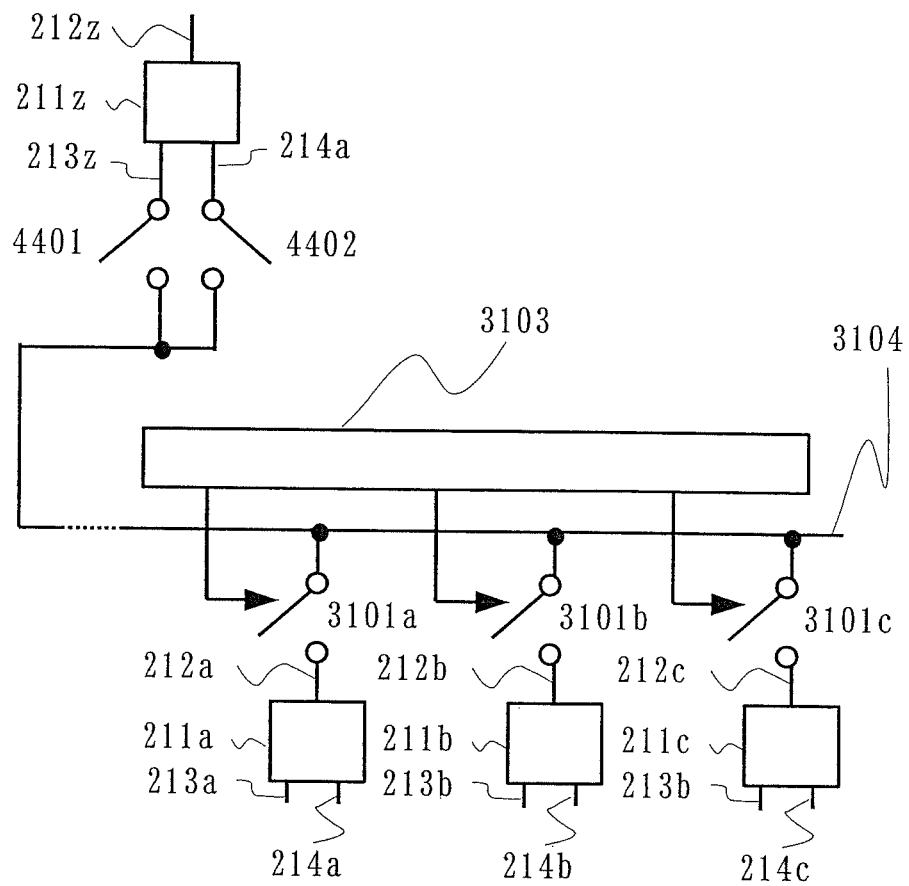
FIG. 44 is a diagram illustrating a configuration of a semiconductor device of the invention.

Alternatively, as shown in FIG. 44, a circuit 211z for supplying voltage and current having an original signal input terminal 212z may be used as an original signal current source circuit to input a signal to the circuits 211a to 211c for supplying voltage and current. In this case, the circuit 211z for supplying voltage and current outputs a precharge voltage from a current output terminal 213z first, and then outputs a signal current. Consequently, signal writing can be completed quickly. Reference numerals 4401 and 4402 denote switches.

Figure 45:
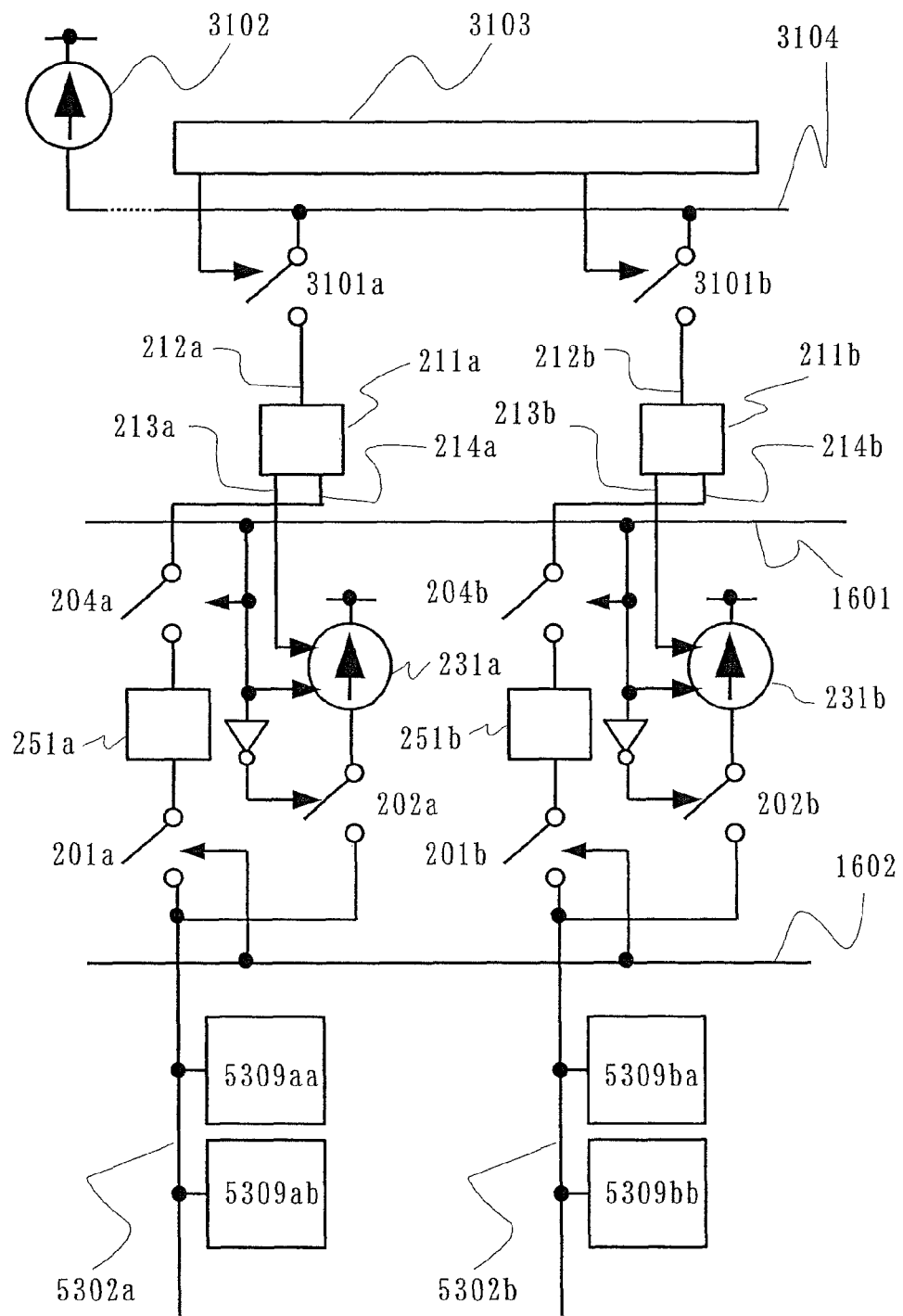
FIG. 45 is a diagram illustrating a configuration of a semiconductor device of the invention.

FIG. 45 shows an example of a configuration which combines FIGS. 31 and 16. Reference numerals 201a, 201b, 202a, and 202b denote switches and 5309aa, 5309ab, 5309ba, and 5309bb denote pixels. Furthermore, 5302a and 5302b denote signal lines, 251a and 251b denote voltage memory circuits, and 231a and 231b denote current memory circuits.

FIGS. 46 to 49 show examples that are explained by using transistors. A circuit diagram for one column is shown in each in FIGS. 46 to 49.

Figure 46:
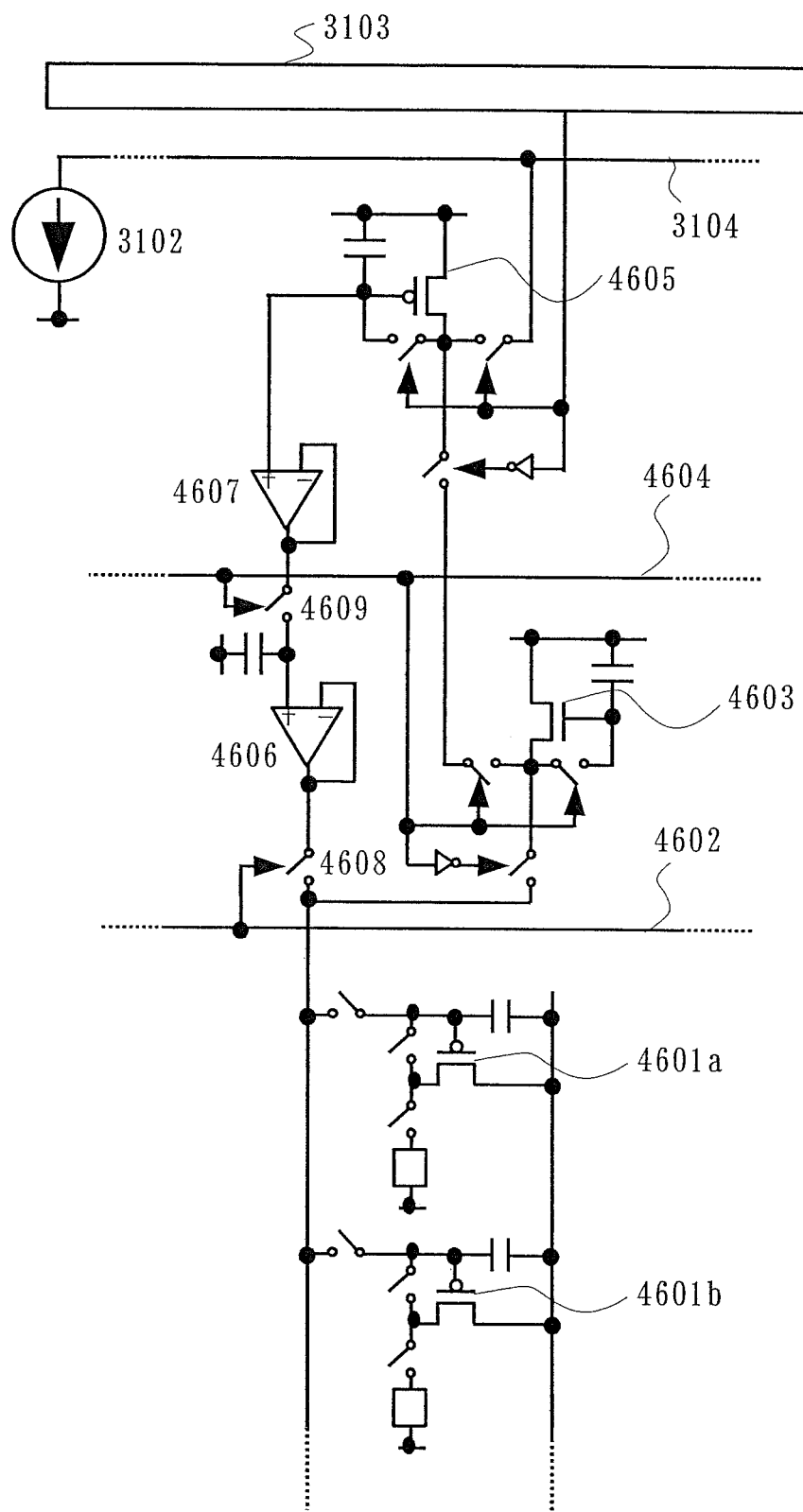
FIG. 46 is a diagram illustrating a configuration of a semiconductor device of the invention.

In FIG. 46, a current approximately equivalent to a video signal current supplied from the original signal current source circuit 3102 is inputted to transistors 4601a and 4601b in pixels. Therefore, it is preferable that W/L of a transistor 4605 and each W/L of the transistors 4601a and 4601b are approximately equivalent to each other. Accordingly, an optimum precharge voltage can be supplied to the pixel from a voltage follower circuit 4606. Reference numerals 4602 and 4604 denote wirings, 4603 denotes a transistor, 4607 denotes an amplifier circuit, and 4608 and 4609 denote switches.

Figure 47:
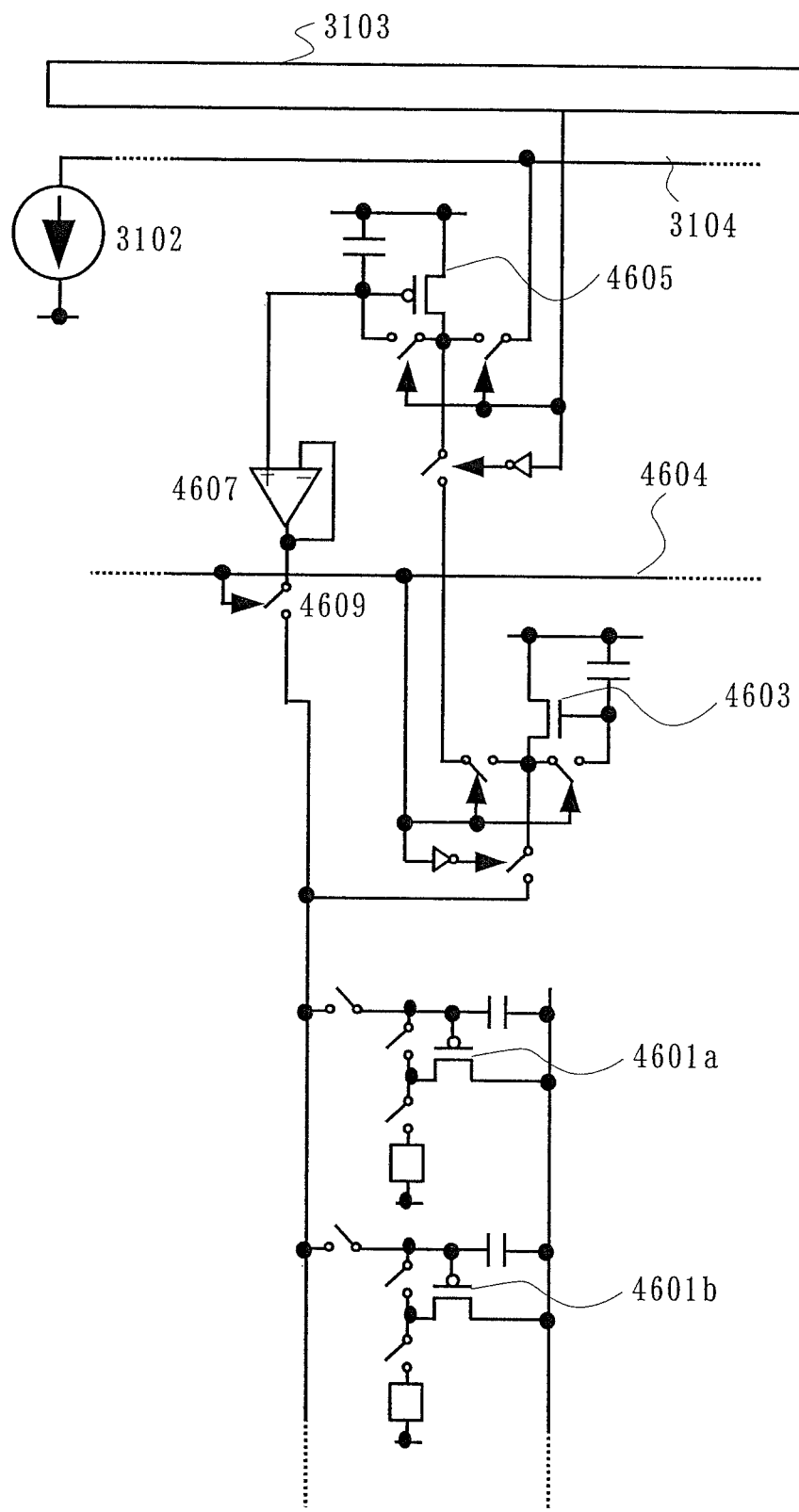
FIG. 47 is a diagram illustrating a configuration of a semiconductor device of the invention.

FIG. 47 corresponds to a circuit in FIG. 46 without the voltage follower circuit 4606. That is, FIG. 47 is a circuit diagram in FIG. 20.

Figure 48:
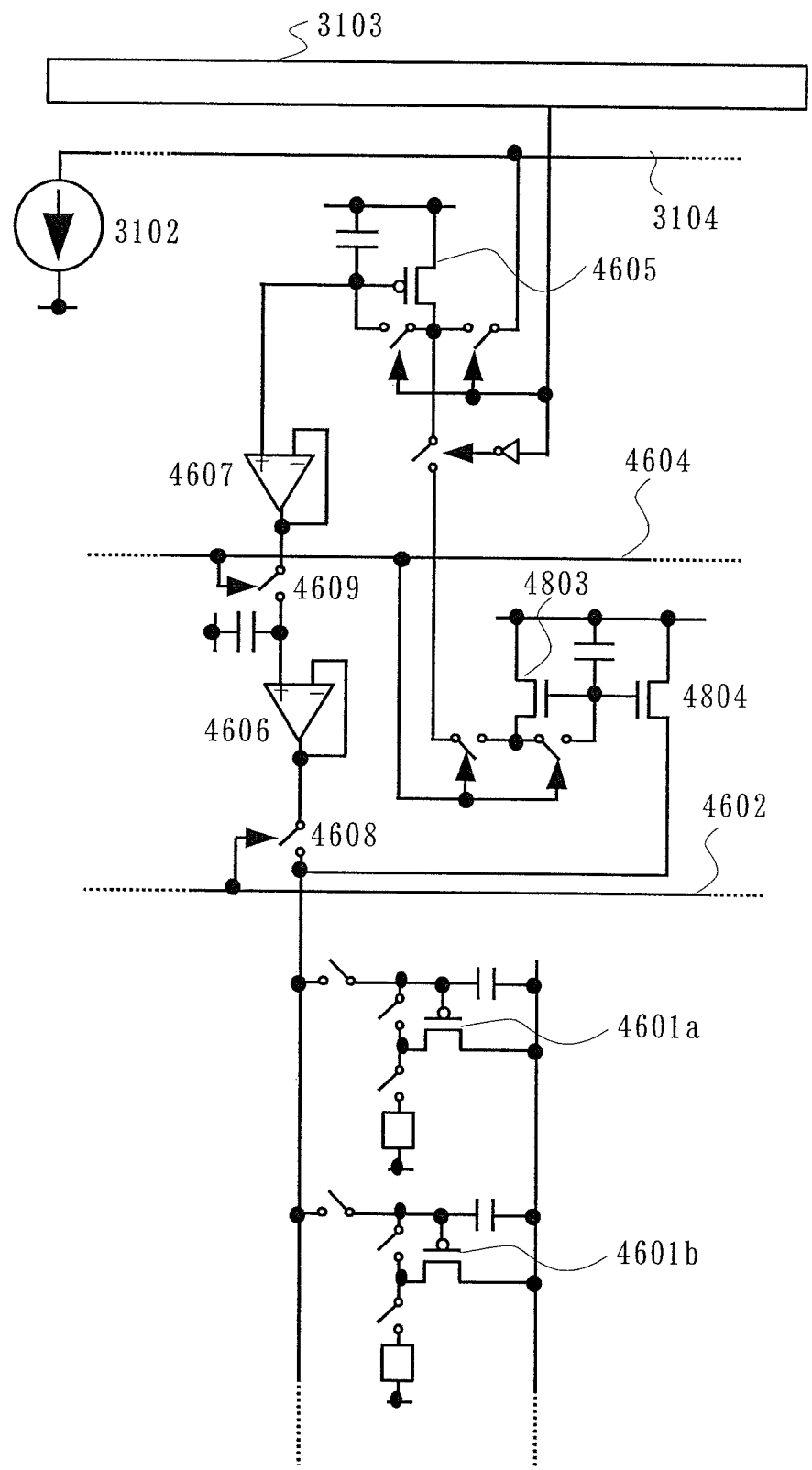
FIG. 48 is a diagram illustrating a configuration of a semiconductor device of the invention.

In FIG. 48, the current memory circuit 231 in FIG. 16 is of the current minor type. Therefore, a video signal current supplied from the original signal current source circuit 3102 and a signal current inputted to the transistors 4601a and 4601b in the pixels are not necessarily equivalent to each other. Assuming here that W/L of a transistor 4803 is A times as large as W/L of a transistors 4804, W/L of the transistor 4605 is preferably designed A times as large as each W/L of the transistors 4601a and 4601b. Accordingly, an optimum precharge voltage can be supplied to the pixel from the voltage follower circuit 4606.

Figure 49:
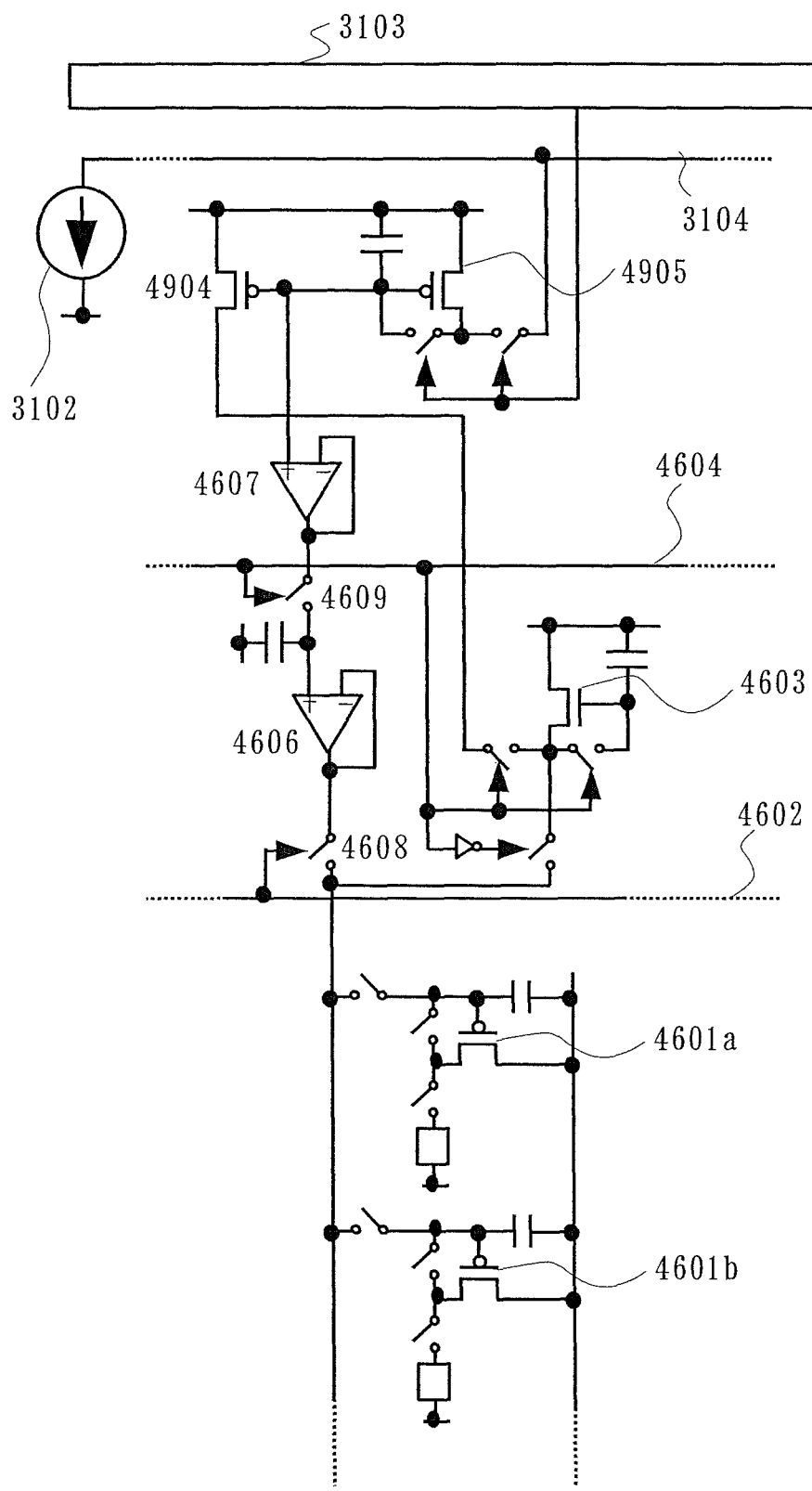
FIG. 49 is a diagram illustrating a configuration of a semiconductor device of the invention.

In FIG. 49, each current source portion in the circuit 211a and 211b for supplying voltage and current in FIG. 45 is of the current mirror type. Therefore, a video signal current supplied from the original signal current source circuit 3102 and a signal current inputted to the transistors 4601a and 4601b in the pixels are not necessarily equivalent to each other. Note that a current approximately equivalent to a signal current outputted from the transistor 4904 is inputted to the transistors 4601a and 4601b in pixels. Therefore, W/L of the transistor 4904 is preferably designed to be approximately equivalent to each W/L of the transistors 4601a and 4601b.

Accordingly, an optimum precharge voltage can be outputted to the pixel from the voltage follower circuit 4606.

A circuit configuration is not limited to this; various configurations can be adopted by combining respective circuits.

It should be noted that a pixel configuration can adopt any configuration so long as it is of a current input type. In addition, a load disposed in a pixel is not limited to an EL element. For example, an element such as a resistor, a transistor, an EL element, other light emitting elements, a current source circuit comprising a transistor and a capacitor and a switch, a wiring connected to any circuit, a signal line, a signal line and a pixel connected the signal line may be disposed in the pixel as the load. The pixel may comprise an EL element, an element for FED, or other elements that operate with current.

In the aforementioned various configurations, the arrangement of each switch is not limited to the aforementioned arrangement. Any arrangement can be adopted so long as the switch operates normally.

Any switch such as an electrical switch or a mechanical switch may be used as a switch so long as the switch can control a current. It may be a transistor, a diode, or a logic circuit configured with them. Therefore, in the case of using a transistor as a switch, a polarity (conductivity type) thereof is not exclusively limited because it operates just as a switch. However, when off-current is preferred to be small, a transistor of a polarity with small off-current is favorably used. For example, a transistor that having LDD region has small off-current. It is desirable that an N-channel type transistor is employed when an operation potential of a source terminal of the transistor as a switch is closer to a power source on the low potential side (Vss, Vgnd, 0V and the like), and a P-channel type transistor is desirably employed when the operation potential of the source terminal is closer to a power source on the high potential side (Vdd and the like). This helps the switch operate efficiently since an absolute value of a gate-source voltage of the transistor can be increased. Alternatively, a CMOS type switch may be employed by using both N-channel type and P-channel type transistors.

Embodiment Mode 3

Electronic apparatuses each using the invention include a video camera, a digital camera, a goggle type display (a head mount display), a navigation system, a sound reproducing device (a car audio equipment and an audio set), a lap-top computer, a game machine, a portable information terminal (a mobile computer, a mobile phone, a portable game machine, an electronic book, and the like), an image reproducing device including a recording medium (more specifically, a device which can reproduce a recording medium such as a digital versatile disc (DVD) and display the reproduced image), or the like. Specific examples of those electric apparatuses are shown in FIGS. 50A to 50H.

Figure 50A:
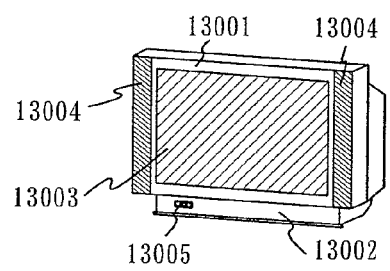

FIG. 50A shows a light emitting device, which includes a housing 13001, a support base 13002, a display portion 13003, speaker portions 13004, a video input terminal 13005, and the like. The invention can be applied to an electronic circuit configuring the display portion 13003. The light emitting device shown in FIG. 50A is completed by using the invention. Since the light emitting device is of self-light emitting type, it does not need a backlight; therefore, a display portion that is thinner than that of a liquid crystal display can be obtained. Note that light emitting devices include all information display devices for a personal computer, for television broadcast receiver, for an advertisement display, and the like.

Figure 50B:
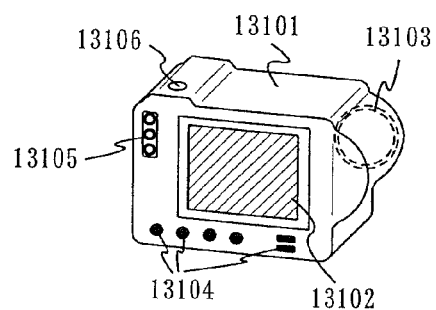

FIG. 50B shows a digital still camera, which includes a main body 13101, a display portion 13102, an image receiving portion 13103, operating keys 13104, an external connection port 13105, a shutter 13106, and the like. The invention can be applied to an electronic circuit configuring the display portion 13102. The digital still camera shown in FIG. 50B is completed by using the invention.

Figure 50C:
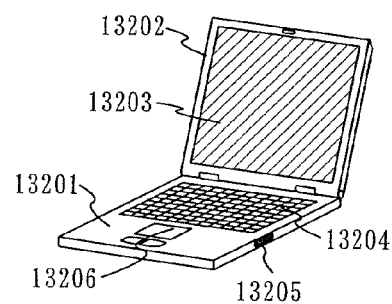

FIG. 50C shows a notebook personal computer, which includes a main body 13201, a housing 13202, a display portion 13203, a keyboard 13204, external connection ports 13205, a pointing mouse 13206, and the like. The invention can be applied to an electronic circuit configuring the display portion 13203. The lap-top computer shown in FIG. 50C is completed by using the invention.

Figure 50D:
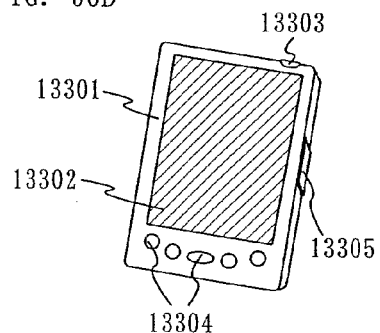
Figure 50D:
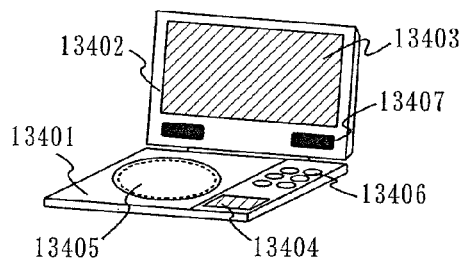

FIG. 50D shows a mobile computer, which includes a main body 13301, a display portion 13302, a switch 13303, operating keys 13304, an infrared port 13305, and the like. The invention can be applied to an electronic circuit configuring the display portion 13302. The mobile computer shown in FIG. 50D is completed by using the invention.

FIG. 50E shows a portable image reproducing device provided with a recording medium (specifically, a DVD reproducing device), which includes a main body 13401, a housing 13402, a display portion A 13403, a display portion B 13404, a recording medium (such as a DVD) read-in portion 13405, an operating key 13406, a speaker portion 13407, and the like. The display portion A 13403 mainly displays image data, and the display portion B 13404 mainly displays character data. The invention can be applied to electronic circuits configuring the display portions A 13403 and B 13404. Note that home game machines and the like are included in the image reproducing devices provided with a recording medium. The DVD reproducing device shown in FIG. 50E is completed by using the invention.

Figure 50F:
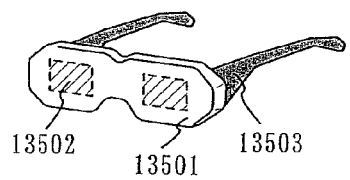

FIG. 50F shows a goggle type display (a head mounted display), which includes a main body 13501, a display portion 13502, an arm portion 13503, and the like. The invention can be applied to an electronic circuit configuring the display portion 13502. The goggle type display shown in FIG. 50F is completed by using the invention.

Figure 50G:
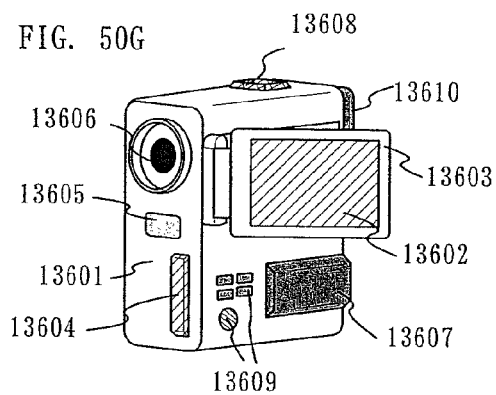

FIG. 50G shows a video camera, which includes a main body 13601, a display portion 13602, a housing 13603, an external connection port 13604, a remote control receiving portion 13605, an image receiving portion 13606, a battery 13607, an audio input portion 13608, operating keys 13609, an eye piece portion 13610 and the like. The invention can be applied to an electronic circuit configuring the display portion 13602. The video camera shown in FIG. 50G is completed by using the invention.

Figure 50H:
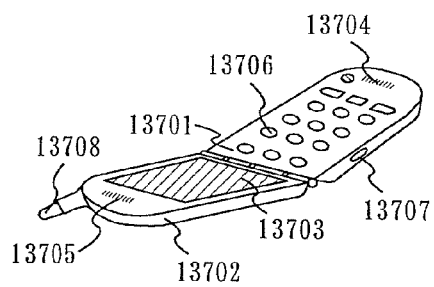

FIG. 50H shows a mobile phone, which includes a main body 13701, a housing 13702, a display portion 13703, an audio input portion 13704, an audio output portion 13705, an operating key 13706, an external connection port 13707, an antenna 13708, and the like. The invention can be applied to an electronic circuit configuring the display portion 13703. Note that by displaying white characters on a black background in the display portion 13703, the current consumption of the mobile phone can be suppressed. The mobile phone shown in FIG. 50H is completed by using the invention.

When the luminance of light emitting materials is increased in the future, the light emitting device will be able to be applied to a front or rear type projector for magnifying and projecting outputted light containing image data by a lens or the like.

The above-described electronic apparatuses are more likely to be used to display data which is distributed through telecommunication paths such as the Internet and CATVs (cable TVs). In particular, moving image data is more frequently displayed. Since the response rate of the light emitting material is very high, the light emitting device is preferably used for moving image display.

Since the light emitting device consumes power in a light emitting portion, data is desirably displayed so that the light emitting portions are as small as possible. Thus, in the case where the light emitting device is used for a display portion of a portable information terminal, particularly, a mobile phone, a sound reproducing device, or the like, which primarily displays character data, it is preferable that the character data is displayed in the light emitting portions with the non-light emitting portions as the background.

As described above, the application range of the invention is so wide that the invention can be used for electronic apparatuses in all fields. The electronic apparatuses in this embodiment mode may adopt a semiconductor device of any configurations shown in Embodiment Mode 1 and 2.

This application is based on Japanese Patent Application serial no. 2003-294023 filed in Japan Patent Office on 15, Aug. 2003, the contents of which are hereby incorporated by reference.

Although the invention has been fully described by way of Embodiment Modes and with reference to the accompanying drawings, it is to be understood that various changes and modifications will be apparent to those skilled in the art. Therefore, unless such changes and modifications depart from the scope of the invention hereinafter defined, they should be constructed as being included therein.

What is claimed is:

1. A semiconductor device comprising:
   a switch;
   a first transistor;
   a second transistor;
   a third transistor; and
   a first amplifier circuit,
   wherein the switch is electrically connected to the first amplifier circuit and a gate of the first transistor,
   wherein one of a source and a drain of the first transistor is electrically connected to one of a source and a drain of the second transistor,
   wherein the other of the source and the drain of the second transistor is electrically connected to one of a source and a drain of the third transistor,
   wherein a gate of the second transistor is electrically connected to a gate of the third transistor, and
   wherein one of the source and the drain of the first transistor is electrically connected to the gate of the second transistor.

2. The semiconductor device according to claim 1, further comprising a capacitor,
   wherein the capacitor is electrically connected to the first amplifier circuit and the gate of the first transistor.

3. The semiconductor device according to claim 1, wherein the semiconductor device is incorporated into an electronic apparatus selected from the group consisting of a display device, a digital still camera, a lap-top computer, a mobile computer, a portable image reproducing device, a goggle type display, a video camera, and a mobile phone.

4. A semiconductor device comprising:
   a switch;
   a first transistor;
   a second transistor;
   a third transistor;
   a first amplifier circuit; and
   a second amplifier circuit,
   wherein the switch is electrically connected to the first amplifier circuit and a gate of the first transistor, wherein one of a source and a drain of the first transistor is electrically connected to one of a source and a drain of the second transistor, wherein the other of the source and the drain of the second transistor is electrically connected to one of a source and a drain of the third transistor, and wherein a gate of the second transistor is electrically connected to a gate of the third transistor and the second amplifier circuit.

5. The semiconductor device according to claim 4, further comprising a capacitor, wherein the capacitor is electrically connected to the first amplifier circuit and the gate of the first transistor.

6. The semiconductor device according to claim 4, wherein the semiconductor device is incorporated into an electronic apparatus selected from the group consisting of a display device, a digital still camera, a lap-top computer, a mobile computer, a portable image reproducing device, a goggle type display, a video camera, and a mobile phone.

7. A semiconductor device comprising:
a switch;
a first transistor;
a second transistor;
a third transistor;
a first amplifier circuit; and
a second amplifier circuit, wherein the switch is electrically connected to the first amplifier circuit and a gate of the first transistor, wherein one of a source and a drain of the first transistor is electrically connected to one of a source and a drain of the second transistor, wherein the other of the source and the drain of the second transistor is electrically connected to one of a source and a drain of the third transistor, wherein a gate of the second transistor is electrically connected to a gate of the third transistor and the second amplifier circuit, and wherein one of the source and the drain of the first transistor is electrically connected to the gate of the second transistor.

8. The semiconductor device according to claim 7, further comprising a capacitor, wherein the capacitor is electrically connected to the first amplifier circuit and the gate of the first transistor.

9. The semiconductor device according to claim 7, wherein the semiconductor device is incorporated into an electronic apparatus selected from the group consisting of a display device, a digital still camera, a lap-top computer, a mobile computer, a portable image reproducing device, a goggle type display, a video camera, and a mobile phone.

10. A semiconductor device comprising:
a switch;
a first transistor;
a second transistor;
a third transistor;
a fourth transistor; and
a first amplifier circuit, wherein one of a source and a drain of the first transistor is electrically connected to one of a source and a drain of the second transistor and one of a source and a drain of the third transistor, wherein the other of the source and the drain of the third transistor is electrically connected to one of a source and a drain of the fourth transistor, wherein a gate of the first transistor is electrically connected to a gate of the second transistor and a gate of the third transistor, wherein the gate of the first transistor is electrically connected to the first amplifier circuit, and wherein the switch is provided between the other of the source and the drain of the first transistor and the gate of the first transistor.

11. The semiconductor device according to claim 10, further comprising a capacitor, wherein the capacitor is electrically connected to the first amplifier circuit and the gate of the first transistor.

12. The semiconductor device according to claim 10, wherein the semiconductor device is incorporated into an electronic apparatus selected from the group consisting of a display device, a digital still camera, a lap-top computer, a mobile computer, a portable image reproducing device, a goggle type display, a video camera, and a mobile phone.

13. A semiconductor device comprising:
a switch;
a first transistor;
a second transistor;
a third transistor;
a fourth transistor;
a first amplifier circuit; and
a second amplifier circuit, wherein one of a source and a drain of the first transistor is electrically connected to one of a source and a drain of the second transistor and one of a source and a drain of the third transistor, wherein the other of the source and the drain of the third transistor is electrically connected to one of a source and a drain of the fourth transistor, wherein a gate of the first transistor is electrically connected to a gate of the second transistor and a gate of the third transistor, wherein the gate of the first transistor is electrically connected to the first amplifier circuit, wherein a gate of the fourth transistor is electrically connected to the second amplifier circuit, and wherein the switch is provided between the other of the source and the drain of the first transistor and the gate of the first transistor.

14. The semiconductor device according to claim 13, further comprising a capacitor, wherein the capacitor is electrically connected to the first amplifier circuit and the gate of the first transistor.

15. The semiconductor device according to claim 13, wherein the semiconductor device is incorporated into an electronic apparatus selected from the group consisting of a display device, a digital still camera, a lap-top computer, a mobile computer, a portable image reproducing device, a goggle type display, a video camera, and a mobile phone.

16. A semiconductor device comprising:
a switch;
a first transistor;
a second transistor;
a third transistor;
a fourth transistor;
a first amplifier circuit; and
a second amplifier circuit, wherein one of a source and a drain of the first transistor is electrically connected to one of a source and a drain of the second transistor and one of a source and a drain of the third transistor, wherein the other of the source and the drain of the third transistor is electrically connected to one of a source and a drain of the fourth transistor, wherein a gate of the first transistor is electrically connected to a gate of the second transistor and a gate of the third transistor,
wherein the gate of the first transistor is electrically connected to the first amplifier circuit,
wherein a gate of the fourth transistor is electrically connected to the second amplifier circuit,
wherein the switch is provided between the other of the source and the drain of the first transistor and the gate of the first transistor, and
wherein the gate of the fourth transistor is electrically connected to the other of the source and the drain of the third transistor.

17. The semiconductor device according to claim 16, further comprising a capacitor,
wherein the capacitor is electrically connected to the first amplifier circuit and the gate of the first transistor.

18. The semiconductor device according to claim 16, wherein the semiconductor device is incorporated into an electronic apparatus selected from the group consisting of a display device, a digital still camera, a lap-top computer, a mobile computer, a portable image reproducing device, a goggle type display, a video camera, and a mobile phone.

\* \* \* \* \*

UNITED STATES PATENT AND TRADEMARK OFFICE
CERTIFICATE OF CORRECTION

PATENT NO. : 8,432,350 B2
APPLICATION NO. : 13/327881
DATED : April 30, 2013
INVENTOR(S) : Hajime Kimura It is certified that error appears in the above-identified patent and that said Letters Patent is hereby corrected as shown below:

In the Specification

Column 2, line 22, after "Idata=" replace "h" with --$I_1$--;

Column 8, line 56, before "times" replace "E" with --ε--;

Column 10, line 44, before "times" replace "K" with --κ--;

Column 17, line 47, replace "minor" with --mirror--; and

Column 19, line 11, replace "SOC" with --50C--.

Signed and Sealed this
Seventeenth Day of December, 2013

Margaret A. Focarino
*Commissioner for Patents of the United States Patent and Trademark Office*